(12) United States Patent
Yamada et al.

(10) Patent No.: US 7,141,471 B2
(45) Date of Patent: Nov. 28, 2006

(54) METHOD OF PRODUCING SEMICONDUCTOR INTEGRATED CIRCUIT DEVICE AND SEMICONDUCTOR INTEGRATED CIRCUIT DEVICE

(75) Inventors: Satoru Yamada, Ome (JP); Hiroyuki Enomoto, Musashino (JP); Nobuya Saito, Sakado (JP); Tsuyoshi Kawagoe, Fussa (JP); Hisaomi Yamashita, Higashikunisaki (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/469,819

(22) PCT Filed: Feb. 7, 2002

(86) PCT No.: PCT/JP02/01003

§ 371 (c)(1),
(2), (4) Date: Sep. 5, 2003

(87) PCT Pub. No.: WO02/075812
PCT Pub. Date: Sep. 26, 2002

(65) Prior Publication Data
US 2004/0076068 A1    Apr. 22, 2004

(30) Foreign Application Priority Data
Mar. 8, 2001    (JP)    ................ 2001-64932

(51) Int. Cl.
*H01L 21/8242*    (2006.01)
(52) U.S. Cl. ............... 438/239; 438/253; 438/E21.008; 257/296
(58) Field of Classification Search .............. 438/239, 438/242, 230, 233, 244, 253, 369–399; 257/296, 257/303–306
See application file for complete search history.

(56) References Cited

U.S. PATENT DOCUMENTS

| | | | | |
|---|---|---|---|---|
| 5,893,734 A | * | 4/1999 | Jeng et al. | 438/239 |
| 5,914,518 A | * | 6/1999 | Nguyen et al. | 257/377 |
| 6,010,935 A | * | 1/2000 | Doan | 438/303 |
| 6,177,307 B1 | * | 1/2001 | Tu et al. | 438/241 |
| 6,251,719 B1 | * | 6/2001 | Wang | 438/238 |
| 6,300,191 B1 | * | 10/2001 | Yu et al. | 438/253 |
| 6,384,441 B1 | * | 5/2002 | Sugiyama et al. | 257/296 |
| 6,395,613 B1 | * | 5/2002 | Juengling | 438/396 |

FOREIGN PATENT DOCUMENTS

| | | |
|---|---|---|
| JP | 9-252098 | 9/1997 |
| JP | 11-26574 | 1/1999 |
| JP | 2000-77622 | 3/2000 |
| JP | 2000-260957 | 9/2000 |
| JP | 2000-277711 | 10/2000 |
| JP | 2001-36038 | 2/2001 |
| JP | 2001-44138 | 2/2001 |

* cited by examiner

*Primary Examiner*—Quoc Hoang
(74) *Attorney, Agent, or Firm*—Miles & Stockbridge P.C.

(57) ABSTRACT

A sidewall insulating film (11) made of a silicon oxide film is formed on the sidewall of a gate electrode (7) (word line) with an aim to reduce the capacitance to the word line serving as the major component of the bit line capacitance. Also, when openings for connecting the bit lines are formed above the spaces of the gate electrodes (7) (word lines) by the dry etching of a silicon oxide film (31) above contact holes (12), a silicon nitride film (19) to be an etching stopper is provided below the silicon oxide film (31) so as to reduce the amount of the bottom surface of the opening receded below the upper surface of a cap insulating film (9).

4 Claims, 49 Drawing Sheets

METHOD OF PRODUCING SEMICONDUCTOR INTEGRATED CIRCUIT DEVICE AND SEMICONDUCTOR INTEGRATED CIRCUIT DEVICE

TECHNICAL FIELD

The present invention relates to a semiconductor integrated circuit device and a manufacturing technique thereof. More particularly, the present invention relates to a technique effectively applied to a semiconductor integrated circuit device with DRAM (Dynamic Random Access Memory) and its manufacture.

BACKGROUND ART

In the manufacturing process of the semiconductor integrated circuit device, when forming openings by the etching of a silicon oxide film deposited on a semiconductor substrate, a silicon nitride film is provided between an upper silicon oxide film and a lower silicon oxide film and the silicon nitride film is used as an etching stopper in order to prevent the excessive etching of the lower silicon oxide film exposed on the bottom of the openings (e.g., in the gazette of Japanese Patent Application Laid-Open No. 11-26574, and the like).

Also, in the manufacturing process of the large capacity DRAM in recent years, the self align contact (SAC) technique (e.g., in the gazette of Japanese Patent Application Laid-Open No. 9-252098) has been adopted. In this technique, when openings for connecting bit lines and capacitors to a semiconductor substrate are formed in the miniaturized spaces of word lines, a silicon nitride film is used to form the insulating film covering the upper portion of the word line (cap insulating film) and the insulating film for covering the sidewall thereof (sidewall insulating film) so that the openings are formed in a self alignment manner with the spaces of the word lines by utilizing the difference in etching rate between the silicon oxide film and the silicon nitride film.

Also, the gazette of the Japanese Patent Application Laid-Open No. 2000-77622 relates to the DRAM in which the cap insulating film and the sidewall insulating film of the word line are formed of a silicon oxide film. However, it discloses the technique as follows. That is, in order to prevent the sidewall insulating film made of a silicon oxide film from being etched when forming the openings by the etching of the interlayer insulating film on the word line, the interlayer insulating film is formed of a silicon nitride film and a silicon oxide film formed thereon so that the underlying silicon nitride film functions as the etching stopper.

DISCLOSURE OF THE INVENTION

In the development of 256 Mbit DRAM and 1 Gbit DRAM, the inventor of the present invention has examined the reduction of the bit-line capacitance as one solution to increase the refresh time interval.

The components of the bit-line capacitance are, for example, the capacitance to the adjacent bit lines, the capacitance to the substrate, the capacitance to the storage electrode, the capacitance to the word line, and the capacitance to the plate electrode. However, in the case of the memory cell having a so-called capacitor over bit line (COB) structure in which a data storage capacitor is provided on the bit line, since the distance between the bit line and the word line is short, the capacitance to the word line is the largest component of the bit line capacitance. Therefore, the reduction of the capacitance to the word line becomes the top priority for the reduction of the bit line capacitance.

As described above, in the conventional manufacturing process using the self align contact (SAC) technique, the upper portion and the sidewall of the word line are covered with a silicon nitride film having the etching selectivity higher than that of the silicon oxide film. However, since the relative dielectric constant of the silicon nitride film is about twice as high as that of the silicon oxide film, the capacitance to the word line in the bit line capacitance is increased if the upper portion and the sidewall of the word line are covered with the silicon nitride film.

Meanwhile, in the case where the sidewall insulating film and the cap insulating film of the word line are formed of a silicon oxide film with an aim to reduce the capacitance to the word line in the bit line capacitance, the sidewall insulating film or the cap insulating film is excessively etched when forming the openings (contact holes) for connecting the bit lines and the substrate in the spaces of the word lines, and hence, the bottom of the opening comes close to the word line. Consequently, the capacitance to the word line in the bit line capacitance is increased also in this case.

An object of the present invention is to provide a technique capable of reducing the bit-line capacitance of the DRAM with a miniaturized memory cell size.

The above and other objects and novel characteristics of the present invention will be apparent from the description and the accompanying drawings of this specification.

The typical ones of the inventions disclosed in this application will be briefly described as follows.

The semiconductor integrated circuit device according to the present invention comprises: a plurality of first conductor pieces extending parallel to each other over a semiconductor substrate; first sidewall insulating films made of a silicon oxide film formed on sidewalls of said first conductor pieces; second conductor pieces formed between said first conductor pieces; a first insulating film made of a silicon nitride film formed over said plurality of first and second conductor pieces; and a second insulating film made of a silicon oxide film formed over said first insulating film, wherein first openings are formed in said first and second insulating films above each of said plurality of second conductor pieces, and third conductor pieces electrically connected to said second conductor pieces are formed in said first openings.

The method of manufacturing a semiconductor integrated circuit device according to the present invention comprises the steps as follows.

That is, it comprises the steps of: forming first conductor pieces over a semiconductor substrate and forming a first insulating film over the first conductor pieces and the semiconductor substrate; forming first openings in said first insulating film so as to be located at positions between said first conductor pieces and then forming first sidewall insulating films made of a silicon oxide film on sidewalls of said first openings; forming second conductor pieces in said first openings; forming a second insulating film made of a silicon nitride film over said first and second conductor pieces and forming a third insulating film made of a silicon oxide film over said second insulating film; and forming second openings in said third insulating film and said second insulating film over said first openings to expose said second conductor pieces at the bottom of said second openings, then forming third conductor pieces electrically connected to said second conductor pieces in said second openings.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof is omitted.

(First Embodiment)

Figure 1:
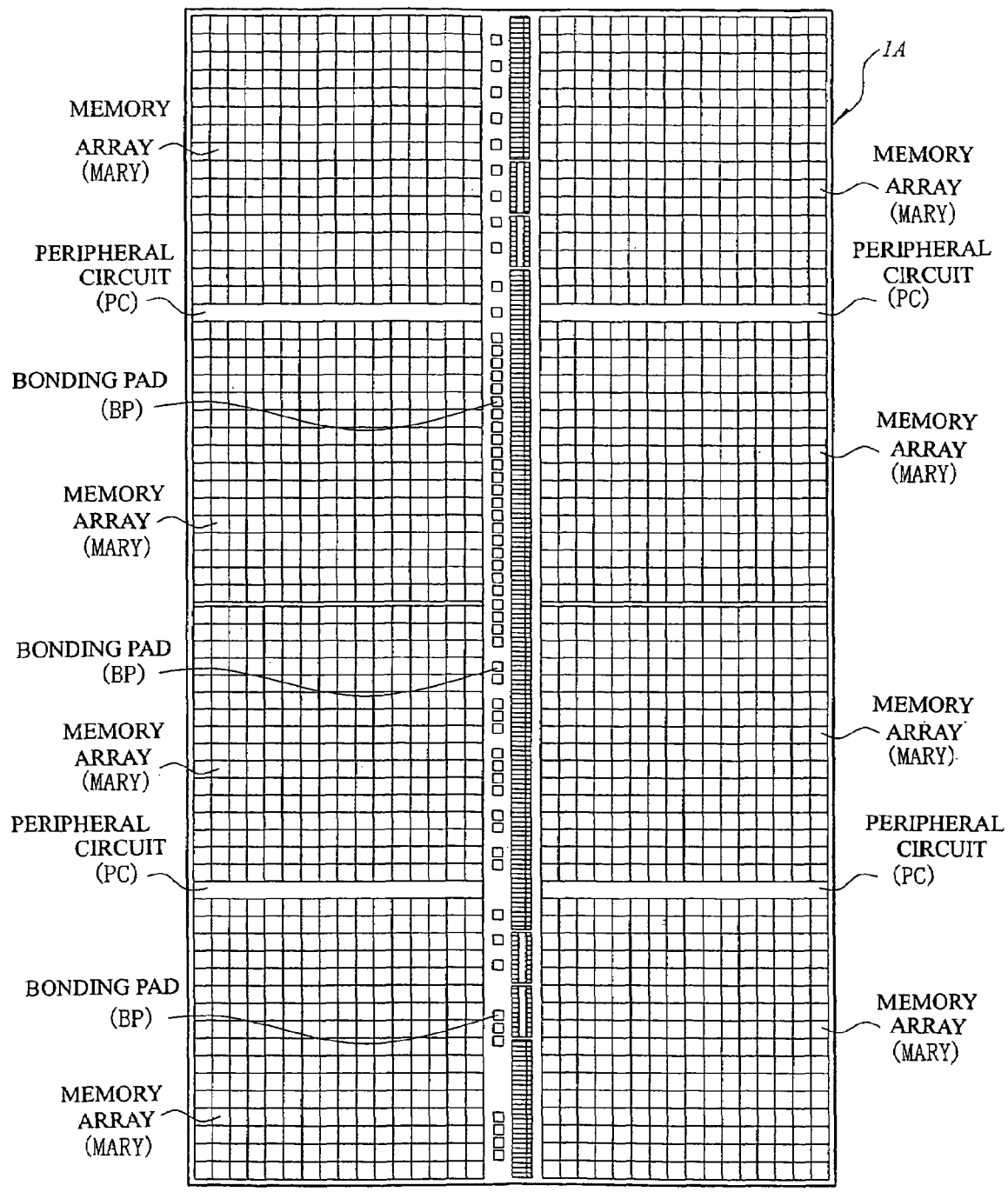
FIG. 1 is an entire plan view showing the semiconductor chip on which the DRAM according to an embodiment of the present invention is formed.

FIG. 1 is an entire plan view of a semiconductor chip 1A on which the DRAM (Dynamic Random Access Memory) according to this embodiment is formed.

A DRAM with a memory capacity of 256 Mbit is formed on the main surface of the rectangular semiconductor chip 1A. This DRAM includes a memory section comprised of a plurality of memory arrays (MARY) and peripheral circuits (PC) arranged in the periphery of the memory arrays. Also, a plurality of bonding pads BP to which the wires and bump electrodes are connected are arranged in a row in the center of the semiconductor chip 1A.

Figure 2:
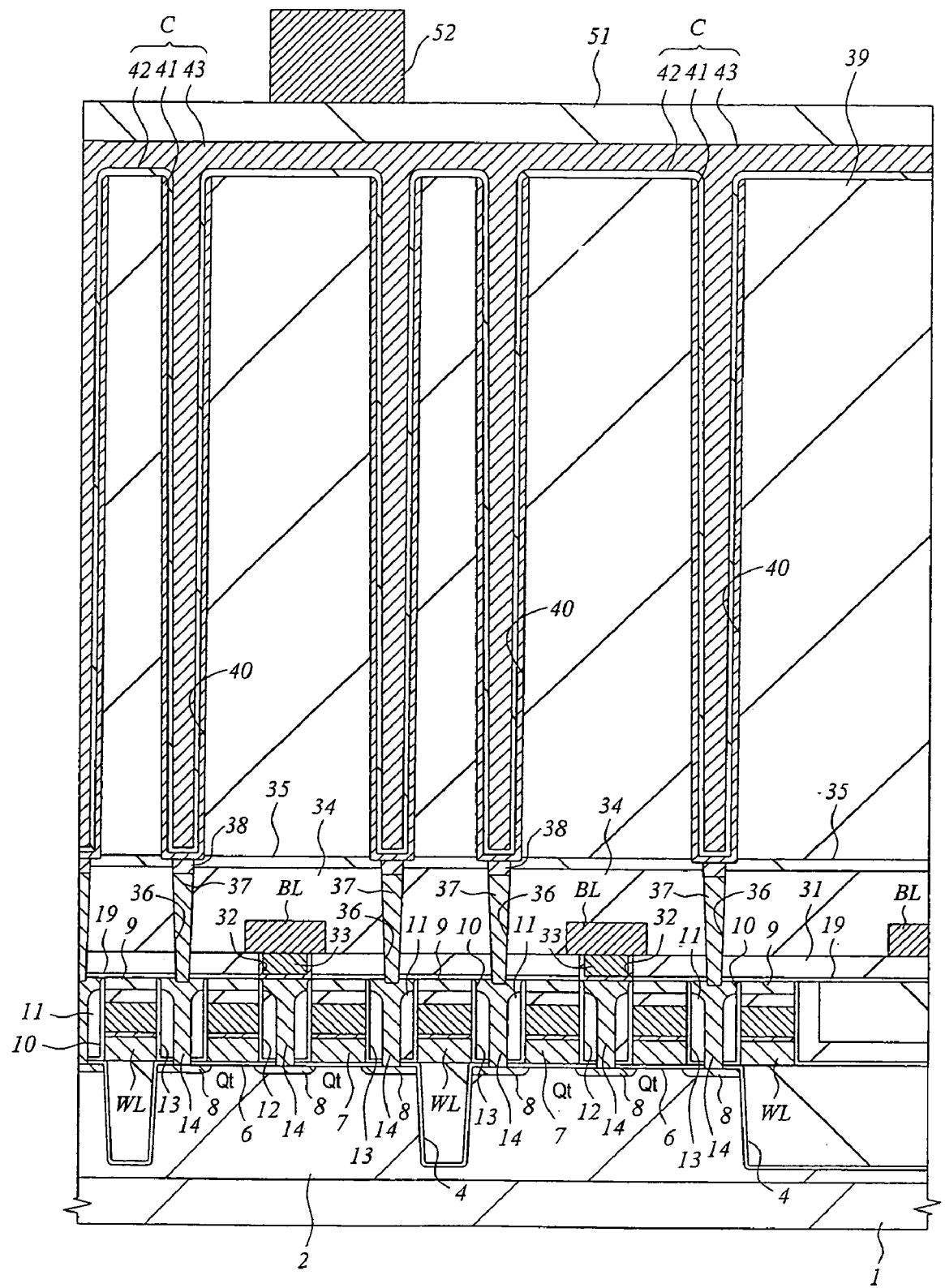
FIG. 2 is a sectional view showing the principal part of a semiconductor substrate, which illustrates the structure of the DRAM according to an embodiment of the present invention.

FIG. 2 is a sectional view of a semiconductor substrate (referred to as a substrate hereinafter) showing one end portion of the memory array (MARY).

For example, a p-type well 2 is formed on the main surface of the substrate 1 made of p-type single crystal silicon, and device isolation trenches 4 are formed in the p-type well 2. A plurality of memory cells are formed in the active regions of the p-type well 2 defined by the device isolation trenches 4. Each of the memory cells includes one memory cell selecting MISFET (Metal Insulator Semiconductor Field Effect Transistor) Qt comprised of an n-channel MISFET and one data storage capacitor C formed on the MISFET Qt. The memory cell selecting MISFET Qt is constituted of a gate insulating film 6, a gate electrode 7 serving as a word line WL in the region other than the active region, and a pair of n-type semiconductor regions (source and drain regions) 8. The gate electrode 7 (word line WL) is comprised of a three-layered conductive film formed by laminating an n-type polycrystalline silicon film doped with P (phosphorus), a WN (tungsten nitride) film, and a W (tungsten) film.

Figure 3:
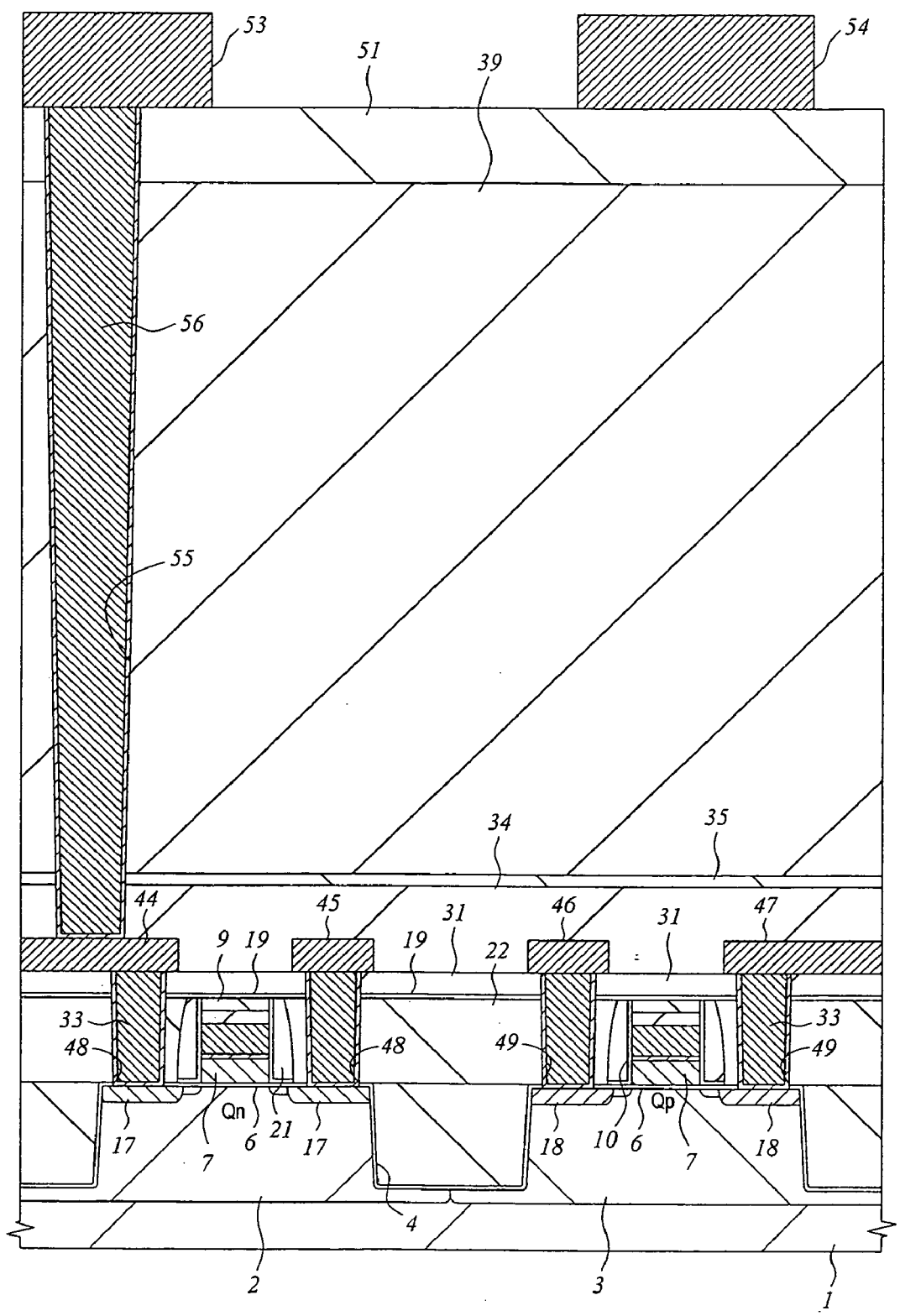
FIG. 3 is a sectional view showing the principal part of a semiconductor substrate, which illustrates the structure of the DRAM according to an embodiment of the present invention.

FIG. 3 is a sectional view of the substrate 1 showing a part of the peripheral circuit (PC) section. The p-type well 2 and an n-type well 3 are formed on the substrate 1 in the peripheral circuit (PC) section. An n-channel MISFET Qn is formed in the active region of the p-type well 2, and a p-channel MISFET Qp is formed in the active region of the n-type well 3. The n-channel MISFET Qn is mainly comprised of the gate insulating film 6, the gate electrode 7, and a pair of $n^+$-type semiconductor regions (source and drain regions) 17, and the p-channel MISFET Qp is mainly comprised of the gate insulating film 6, the gate electrode 7, and a pair of $P^+$-type semiconductor regions (source and drain regions) 18. More specifically, the peripheral circuit (PC) is comprised of a complementary MISFET obtained by combining the n-channel MISFET Qn and the p-channel MISFET Qp.

As shown in FIG. 2, two-layered sidewall insulating films 10 and 11 are formed on the sidewalls of the gate electrodes 7 (word lines WL) of the memory cell selecting MISFETs Qt. The outer sidewall insulating film 11 is made of, for example, a silicon oxide film with a thickness of about 30 nm, and the inner sidewall insulating film 10 is made of a silicon nitride film with a thickness larger than that of the first sidewall insulating film 11 (for example, about 10 nm to 15 nm). The height of the sidewall insulating film 11 made of a silicon oxide film is higher than that of the upper surface of the gate electrode 7 (word line WL) and lower than that of the upper end portion of the cap insulating film 9 which covers the upper portion of the gate electrode 7 (word line WL).

Contact holes (openings) 12 and 13 surrounded by the two-layered sidewall insulating films 10 and 11 are formed in the spaces of the gate electrodes 7, and plugs (conductive layers) 14 made of an n-type polycrystalline silicon film doped with P (phosphorus) are filled into the contact holes 12 and 13.

Two insulating films (silicon nitride film 19 and silicon oxide film 31 in this order from below) are formed over the upper portion of the memory cell selecting MISFET Qt, and bit lines BL for writing and reading data to the memory cell are formed on the silicon oxide film 31. The bit line BL is made of, for example, a metal film such as a W (tungsten) film. The bit line BL is electrically connected to one of the n-type semiconductor regions (source and drain regions) 8 of the memory cell selecting MISFET Qt via the through hole 32 formed in the silicon oxide film 31 and the silicon nitride film 19 and the underlying contact hole 12. Plugs 33 made of a metal film obtained by, for example, laminating a W film on a TiN film are filled into the through holes 32.

A silicon oxide film 34 and a silicon nitride film 35 are formed over the bit lines BL, and data storage capacitors C are formed on the silicon nitride film 35. The data storage capacitor C is comprised of a lower electrode 41 formed in a deep trench 40 formed by etching a thick silicon oxide film 39 on the silicon nitride film 35, a capacitor insulating film 42 formed on the lower electrode 41, and an upper electrode 43.

The lower electrode 41 of the data storage capacitor C is made of, for example, a Ru (ruthenium) film, and is electrically connected to the other of the n-type semiconductor regions (source and drain regions) 8 of the memory cell selecting MISFET Qt via the through hole 36 and the underlying contact hole 13. The capacitor insulating film 42 is made of, for example, a BST ($Ba_xSr_{1-x}TiO_3$: Barium Strontium Titanate) film, and the upper electrode 43 is made of, for example, an Ru film. An Al alloy wiring 52 is formed on the data storage capacitor C via a silicon oxide film 51.

As shown in FIG. 3, two-layered sidewall insulating films 10 and 21 are formed on the sidewalls of the n-channel MISFET Qn and the p-channel MISFET Qp in the peripheral circuit (PC) section. The outer sidewall insulating film 21 is made of, for example, a silicon oxide film with a thickness of about 70 nm, and the inner sidewall insulating film 10 is made of the same silicon nitride film as that of the above-described sidewall insulating film 10 of the memory cell selecting MISFET Qt.

First layer wirings 44 and 45 are formed over the n-channel MISFET Qn, and first layer wirings 46 and 47 are formed over the p-channel MISFET Qp. These first layer wirings 44 to 47 are made of the same metal film as that of the above-described bit line BL, and are formed simultaneously with the bit line BL.

The first layer wirings 44 and 45 are electrically connected to the $n^+$-type semiconductor regions (source and drain regions) 17 of the n-channel MISFET Qn via the contact holes 48 formed in the underlying insulating films (silicon oxide film 31, silicon nitride film 19, and silicon oxide film 22). Also, the first layer wirings 46 and 47 are electrically connected to the $p^+$-type semiconductor regions (source and drain regions) 18 of the p-channel MISFET Qp via the contact holes 49 formed in the underlying insulating films (silicon oxide film 31, silicon nitride film 19, and silicon oxide film 22). The plugs 33 made of a metal film obtained by, for example, laminating a W film on a TiN film are filled into the contact holes 48 and 49.

The silicon oxide film 34, the silicon nitride film 35, the silicon oxide film 39 with a large thickness, and the silicon oxide film 51 are formed on the first layer wirings 44 to 47 in this order from below, and Al alloy wirings 53 and 54 serving as second layer wirings are formed on the silicon oxide film 51. The Al alloy wiring 53 is electrically connected to the first layer wiring 44 via the through hole 55 formed in the underlying insulating films (silicon oxide film 51, silicon oxide film 39, silicon nitride film 35, and silicon oxide film 34). A plug 56 made of, for example, a metal film obtained by laminating a W film on a TiN film is filled into the through hole 55.

Figure 58:
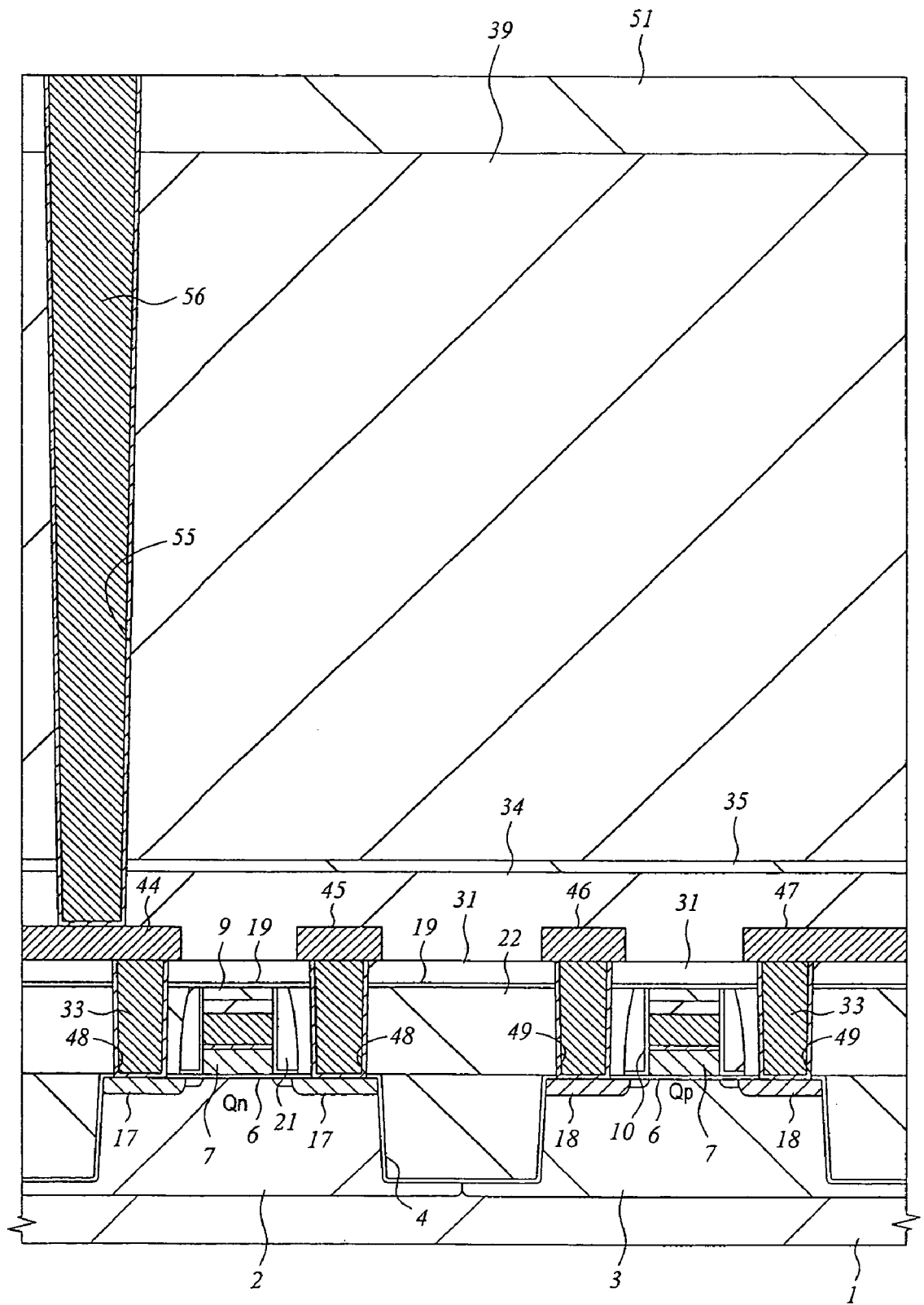
FIG. 58 is a sectional view showing the principal part of a semiconductor substrate, which illustrates the manufacturing method of DRAM according to an embodiment of the present invention.

Next, the manufacturing method of the DRAM constituted as described above according to this embodiment will be described with reference to FIGS. 4 to 58 along the manufacturing process.

Figure 4:
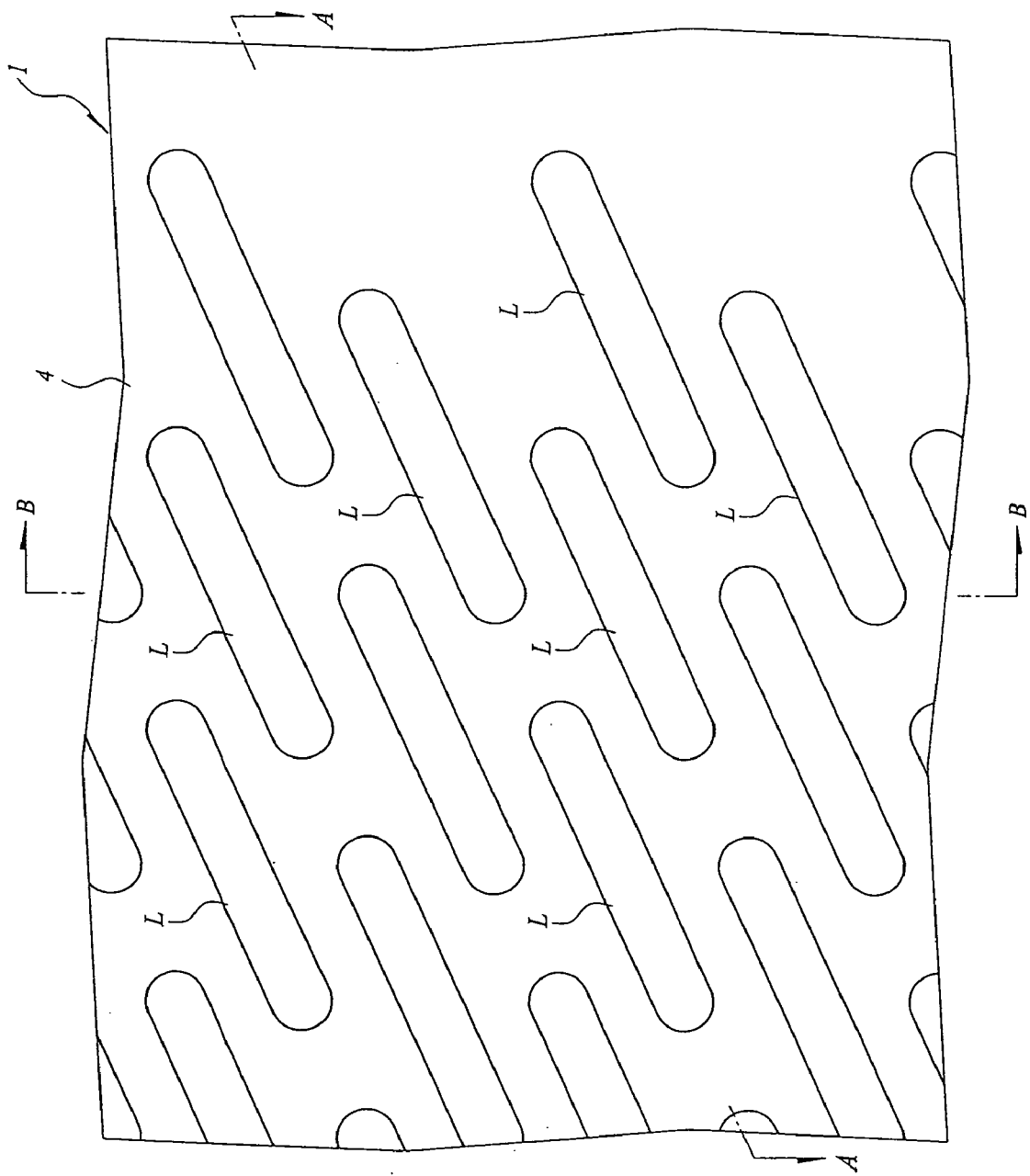
FIG. 4 is a plan view showing the principal part of a semiconductor substrate, which illustrates the manufacturing method of DRAM according to an embodiment of the present invention.
Figure 5:
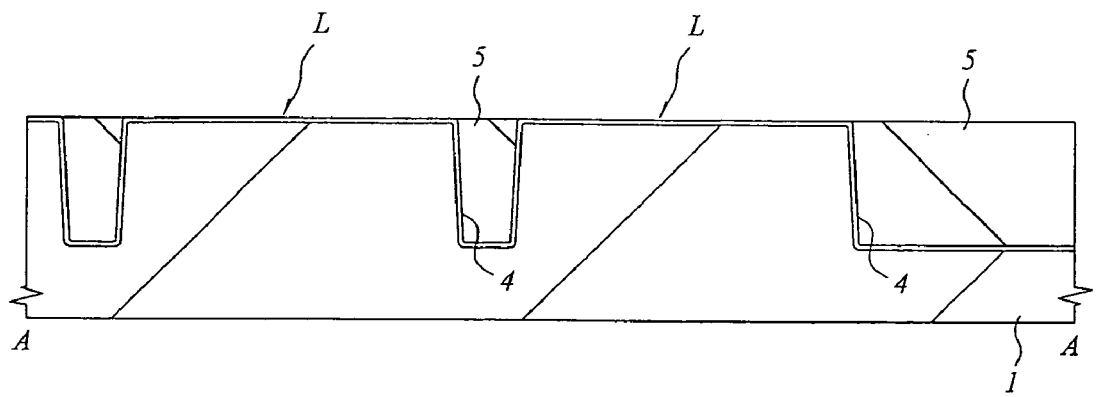
FIG. 5 is a sectional view showing the principal part of a semiconductor substrate, which illustrates the manufacturing method of DRAM according to an embodiment of the present invention.
Figure 6:
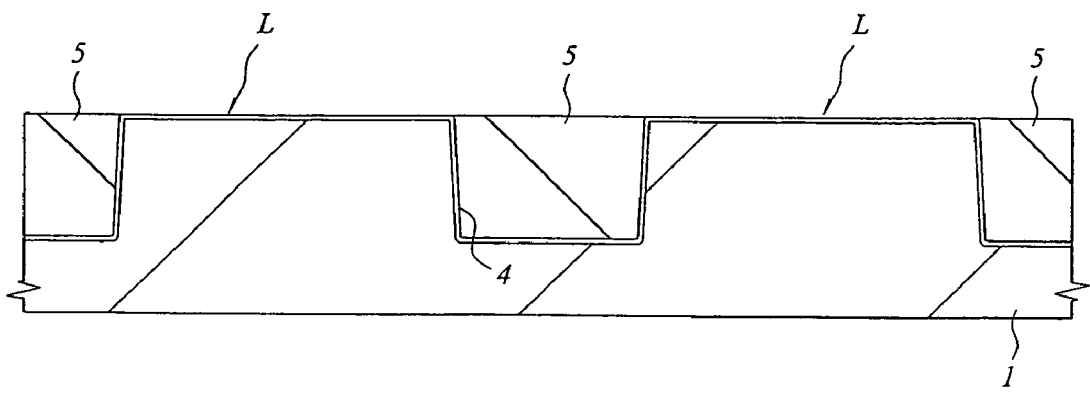
FIG. 6 is a sectional view showing the principal part of a semiconductor substrate, which illustrates the manufacturing method of DRAM according to an embodiment of the present invention.

First, as shown in FIG. 4 (plan view showing one end portion of the memory array), FIG. 5 (sectional view taken along the line A—A in FIG. 4), and FIG. 6 (sectional view showing a part of the peripheral circuit section), the device isolation trench 4 is formed in the device isolation region on the main surface of the substrate 1. The device isolation trench 4 is formed in the following manner. That is, the main surface of the substrate 1 is etched to form a trench with a depth of about 300 to 400 nm, and then, a silicon oxide film 5 with a thickness of about 600 nm is deposited on the substrate 1 and in this trench by the CVD method. Thereafter, the unnecessary silicon oxide film 5 outside the trench is polished and removed by the chemical mechanical polishing (CMP) method. As shown in FIG. 4, by forming the device isolation trench 4, a large number of active regions L with elongated island-shaped pattern surrounded by the device isolation trench 4 are formed in the memory array.

Figure 7:
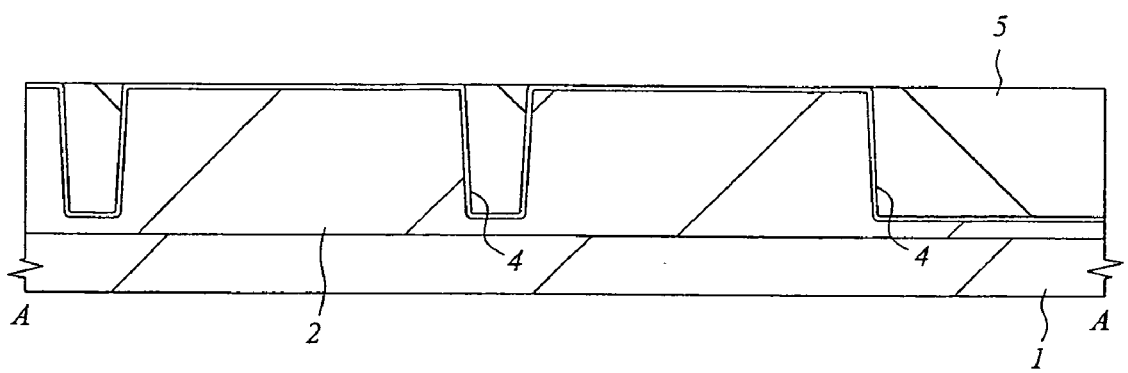
FIG. 7 is a sectional view showing the principal part of a semiconductor substrate, which illustrates the manufacturing method of DRAM according to an embodiment of the present invention.
Figure 8:
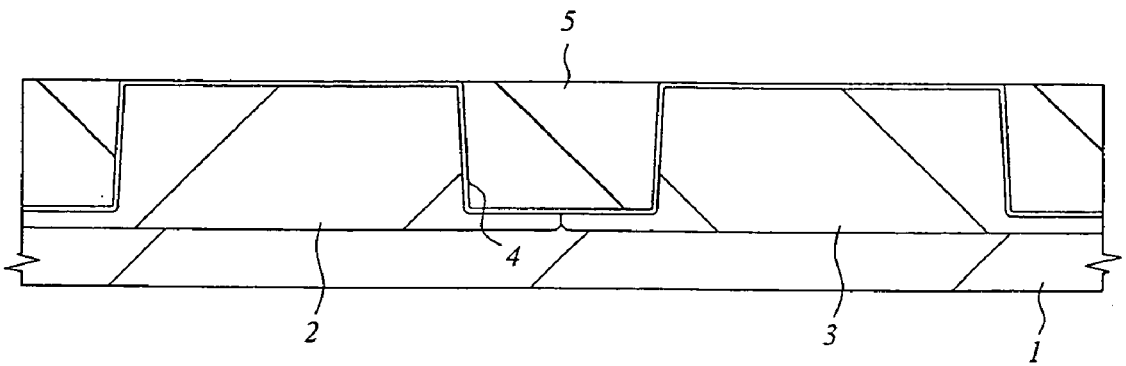
FIG. 8 is a sectional view showing the principal part of a semiconductor substrate, which illustrates the manufacturing method of DRAM according to an embodiment of the present invention.

Next, as shown in FIG. 7 (sectional view showing one end portion of the memory array), and FIG. 8 (sectional view showing a part of the peripheral circuit section), B (boron) is ion-implanted into a part of the substrate 1 and P (phosphorus) is ion-implanted into the other part thereof. Thereafter, the thermal treatment is performed to the substrate 1 so as to diffuse these impurities in the substrate 1, thereby forming the p-type well 2 and the n-type well 3.

Figure 9:
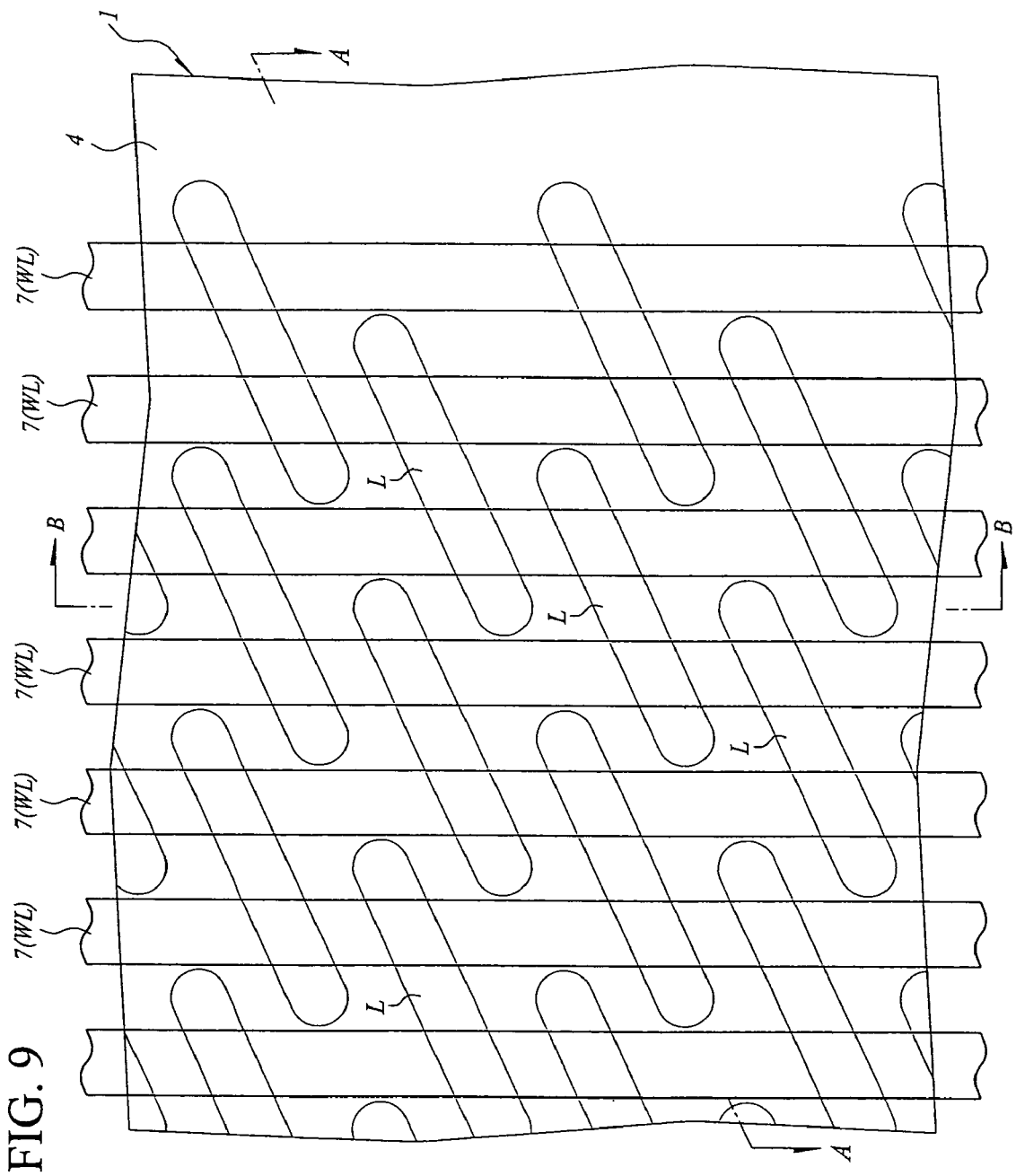
FIG. 9 is a plan view showing the principal part of a semiconductor substrate, which illustrates the manufacturing method of DRAM according to an embodiment of the present invention.
Figure 10:
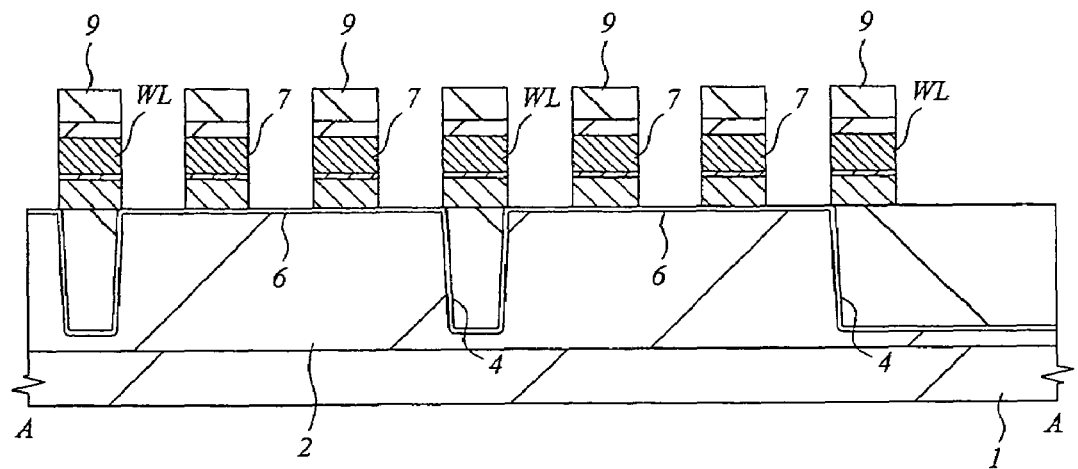
FIG. 10 is a sectional view showing the principal part of a semiconductor substrate, which illustrates the manufacturing method of DRAM according to an embodiment of the present invention.
Figure 11:
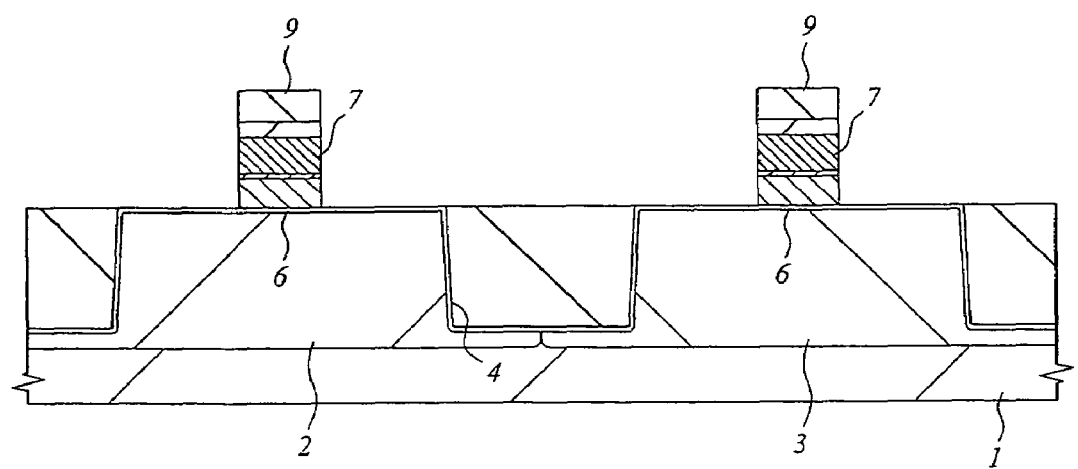
FIG. 11 is a sectional view showing the principal part of a semiconductor substrate, which illustrates the manufacturing method of DRAM according to an embodiment of the present invention.

Next, as shown in FIGS. 9, 10, and 11, the gate insulating film 6 made of silicon oxide with a thickness of about 6 to 7 nm is formed on the respective surfaces of the p-type well 2 and the n-type well 3 by the thermal oxidation of the substrate 1. Subsequently, the gate electrodes 7 of the memory cell selecting MISFET Qt, that of the n-channel MISFET Qn, and that of the p-channel MISFET Qp are formed on the gate insulating film 6. The gate electrodes 7 are formed in the following manner. That is, an n-type polycrystalline silicon film doped with P (phosphorus) with a thickness of about 70 nm is deposited on the gate insulating film 6 by the CVD method, and then, a WN (tungsten nitride) film with a thickness of about 5 nm and a W (tungsten) film with a thickness of about 60 nm are deposited thereon by the sputtering method. Subsequently, a cap insulating film 9 with a thickness of about 200 nm is deposited further thereon. Thereafter, these films are dry-etched with using a photoresist film as a mask. The cap insulating film 9 is made of a silicon nitride film (or laminated film of a silicon oxide film and a silicon nitride film). It is also possible to form the gate electrode 7 by using a polycide film (laminated film of a polycrystalline silicon film and a refractory metal silicide film).

As shown in FIG. 9, the gate electrodes 7 of the memory cell selecting MISFETs Qt constitute the word lines WL in the regions other than the active regions L and extend in a direction oblique to the longer side of the active regions L. The gate length of the gate electrode 7 of the memory cell selecting MISFET Qt is, for example, about 0.13 to 1.4 μm, and the space between the adjacent gate electrodes 7 (word lines WL) is, for example, about 0.12 μm.

Figure 12:
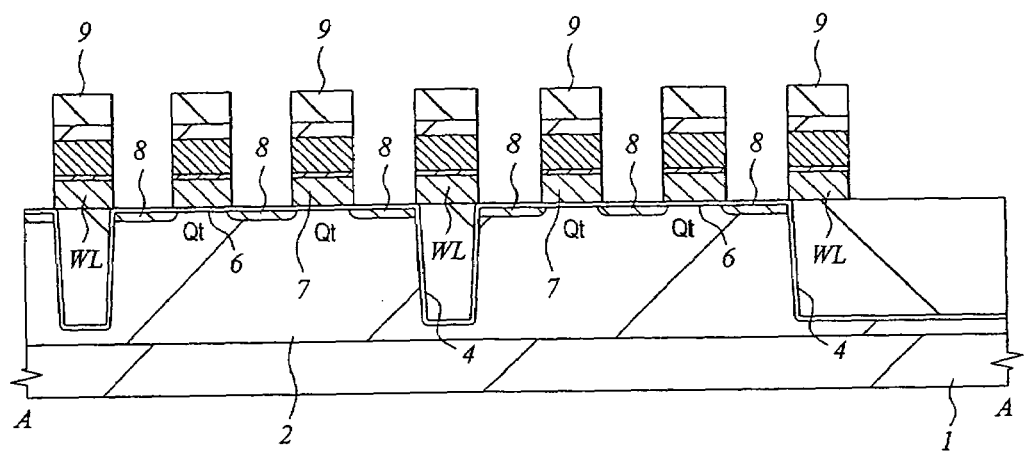
FIG. 12 is a sectional view showing the principal part of a semiconductor substrate, which illustrates the manufacturing method of DRAM according to an embodiment of the present invention.
Figure 13:
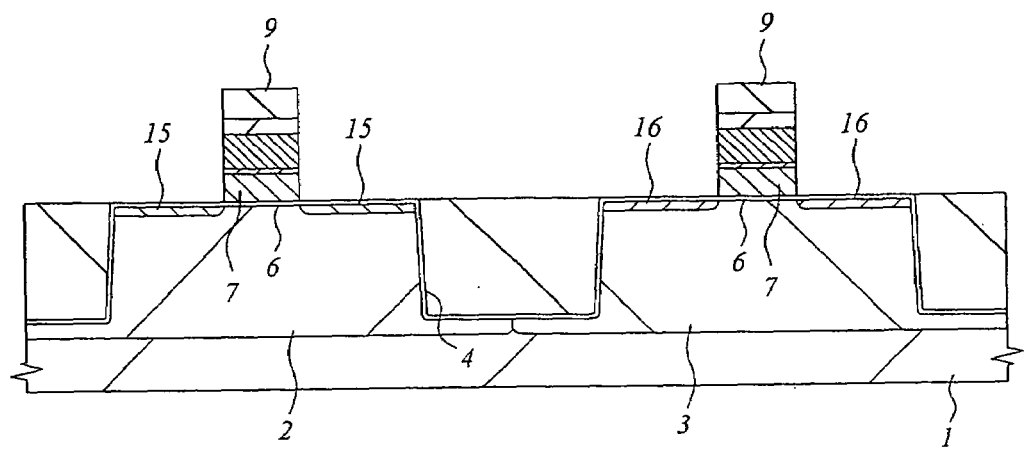
FIG. 13 is a sectional view showing the principal part of a semiconductor substrate, which illustrates the manufacturing method of DRAM according to an embodiment of the present invention.

Next, as shown in FIGS. 12 and 13, the n-type semiconductor regions (source and drain regions) 8 are formed in the p-type well 2 of the memory array by the ion implantation of As (arsenic) into the p-type well 2, and n⁻-type semiconductor regions 15 are formed in the p-type well 2 of the peripheral circuit section. In addition, p⁻-type semiconductor regions 16 are formed by the ion implantation of B (boron) into the n-type well 3 of the peripheral circuit section. In the process so far, the memory cell selecting MISFET Qt is approximately completed.

Figure 14:
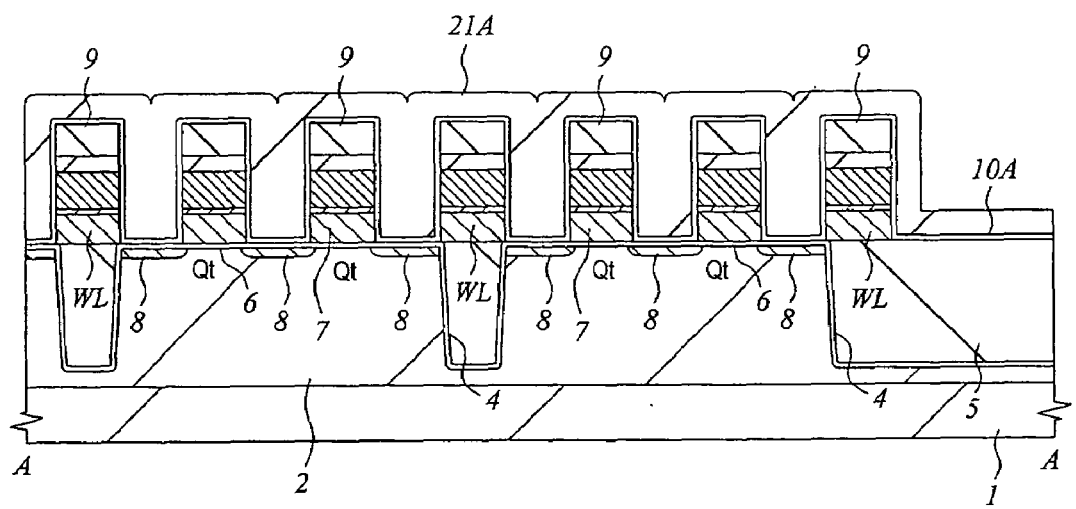
FIG. 14 is a sectional view showing the principal part of a semiconductor substrate, which illustrates the manufacturing method of DRAM according to an embodiment of the present invention.
Figure 15:
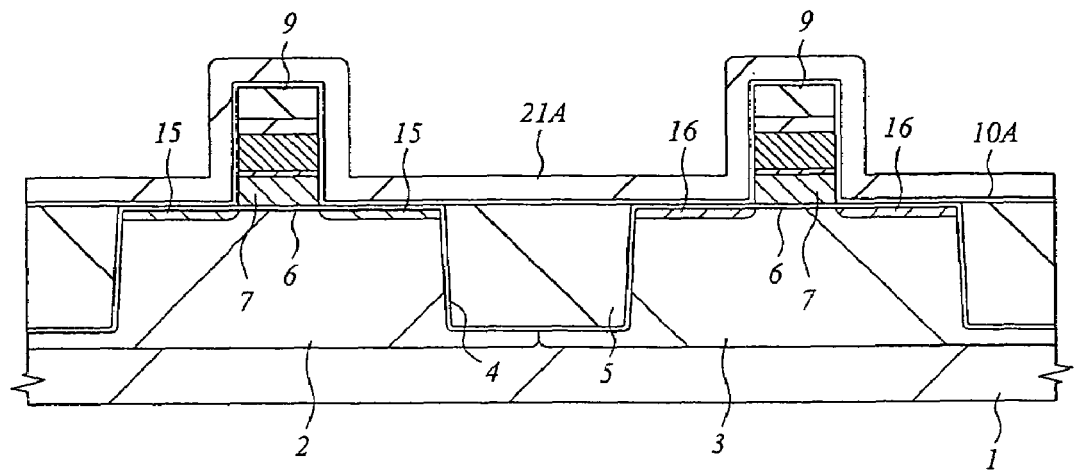
FIG. 15 is a sectional view showing the principal part of a semiconductor substrate, which illustrates the manufacturing method of DRAM according to an embodiment of the present invention.

Next, as shown in FIGS. 14 and 15, a thin silicon nitride film 10A with a thickness of about 10 to 15 nm is deposited on the substrate 1 by the CVD method, and then, a silicon oxide film 21A with a thickness of about 70 nm is deposited thereon by the CVD method. By so doing, the spaces of the gate electrodes 7 (word lines WL) are filled with the silicon oxide film 21A. The silicon oxide film 21A is deposited to the thickness larger than the half of the depth of the spaces between the gate electrodes 7 (word lines WL) so as not to form any voids in the spaces. The silicon nitride film 10A is used as an etching stopper to prevent the silicon oxide film 5 in the device isolation trench 4 from being etched when performing the dry etching to form the contact holes (openings) in the spaces of the gate electrodes 7 in the latter step. Therefore, it is possible to omit the silicon nitride film 10A in such a case where the amount of etching of the silicon oxide film 5 does not matter.

Figure 16:
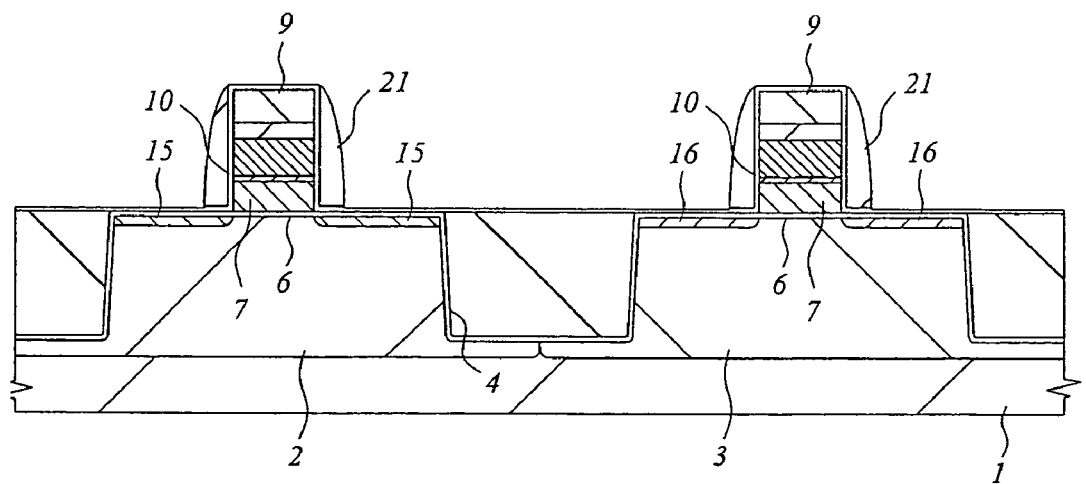
FIG. 16 is a sectional view showing the principal part of a semiconductor substrate, which illustrates the manufacturing method of DRAM according to an embodiment of the present invention.
Figure 17:
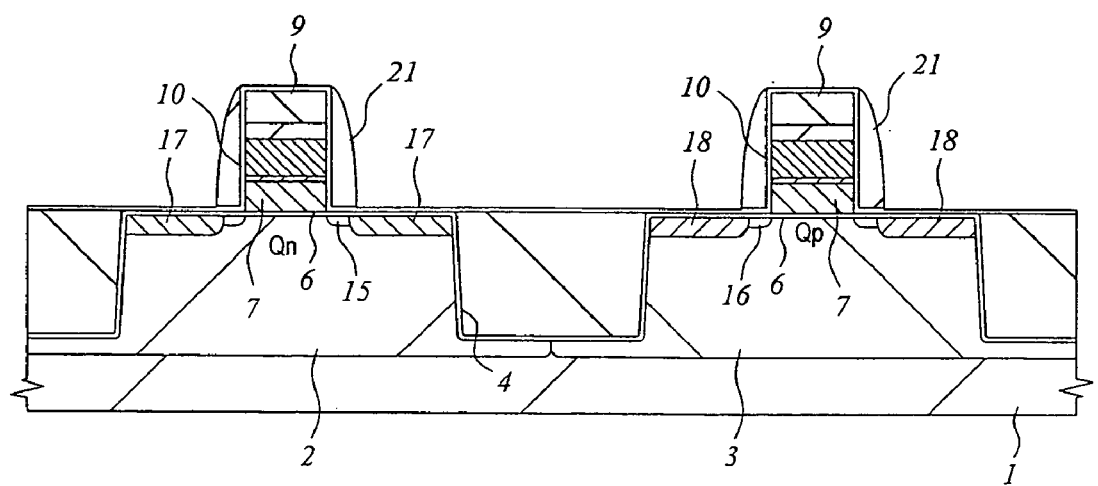
FIG. 17 is a sectional view showing the principal part of a semiconductor substrate, which illustrates the manufacturing method of DRAM according to an embodiment of the present invention.

Next, as shown in FIG. 16, two-layered sidewall insulating films 21 and 10 are formed on the sidewalls of the gate electrodes 7 by the anisotropic etching of the silicon oxide film 21A and the silicon nitride film 10A of the peripheral circuit section. Subsequently, as shown in FIG. 17, the n⁺-type semiconductor regions (source and drain regions) 17 are formed by the ion implantation of P (phosphorus) into the p-type well 2 of the peripheral circuit section, and the p⁺-type semiconductor regions (source and drain regions) 18 are formed by the ion implantation of B (boron) into the n-type well 3. In the process so far, the n-channel MISFET Qn and the p-channel MISFET Qp are approximately completed.

Figure 18:
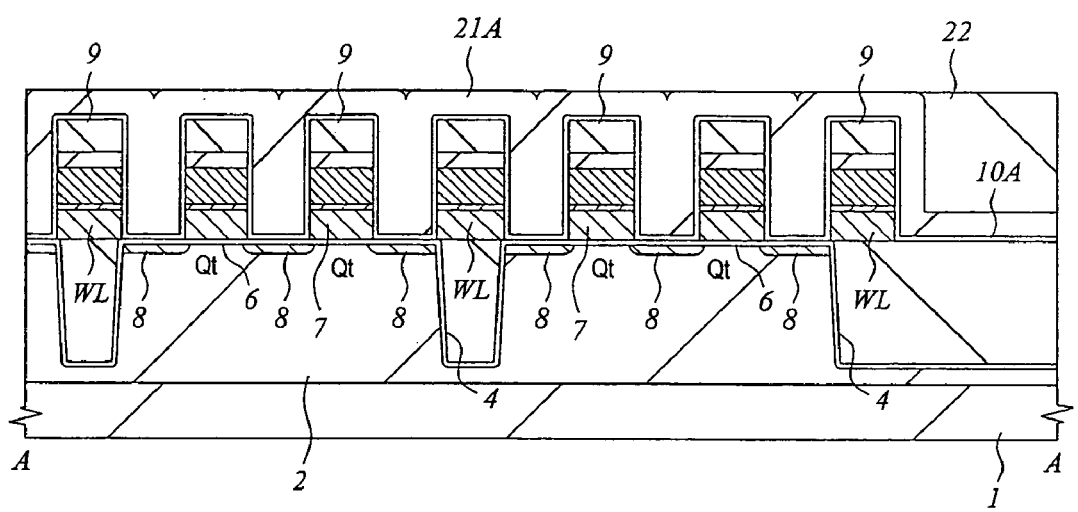
FIG. 18 is a sectional view showing the principal part of a semiconductor substrate, which illustrates the manufacturing method of DRAM according to an embodiment of the present invention.
Figure 19:
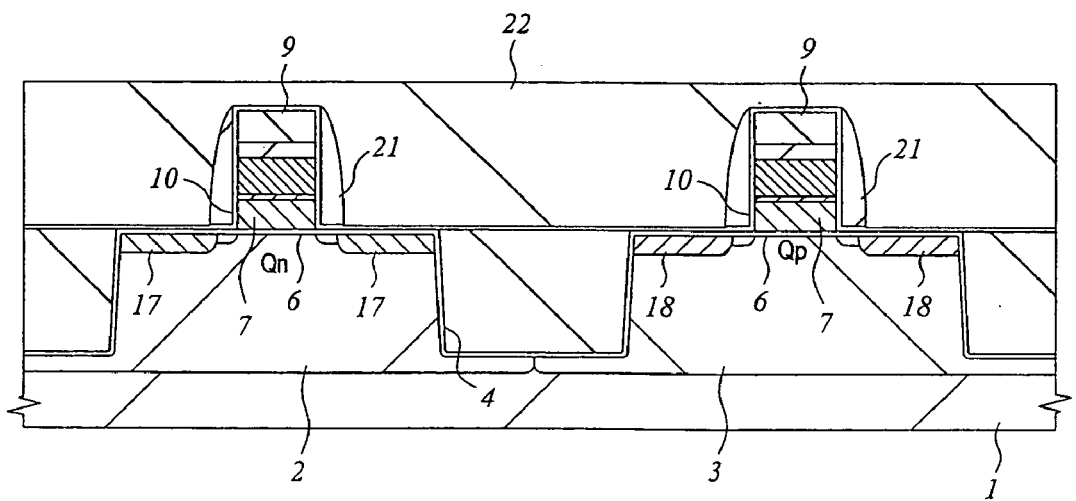
FIG. 19 is a sectional view showing the principal part of a semiconductor substrate, which illustrates the manufacturing method of DRAM according to an embodiment of the present invention.

Next, as shown in FIGS. 18 and 19, after depositing a thick silicon oxide film 22 with a thickness of about 600 nm on the substrate 1 by the CVD method, this silicon oxide film 22 is polished and planarized by the chemical mechanical polishing method. By so doing, the surface height of the silicon oxide film 22 is made uniform in the memory array and the peripheral circuit section. In this case, it is also possible to recede the surface height of the silicon oxide film 22 to the upper surface of the cap insulating film 9 by using the silicon nitride film which forms a part of the cap insulating film 9 as a stopper of the polishing.

Figure 20:
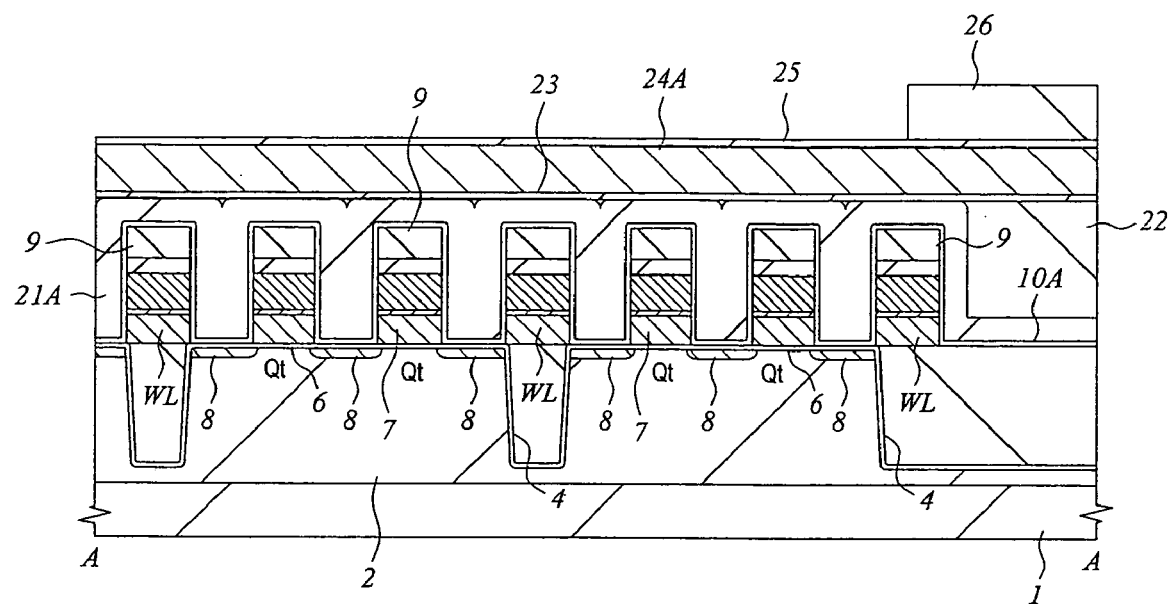
FIG. 20 is a sectional view showing the principal part of a semiconductor substrate, which illustrates the manufacturing method of DRAM according to an embodiment of the present invention.
Figure 21:
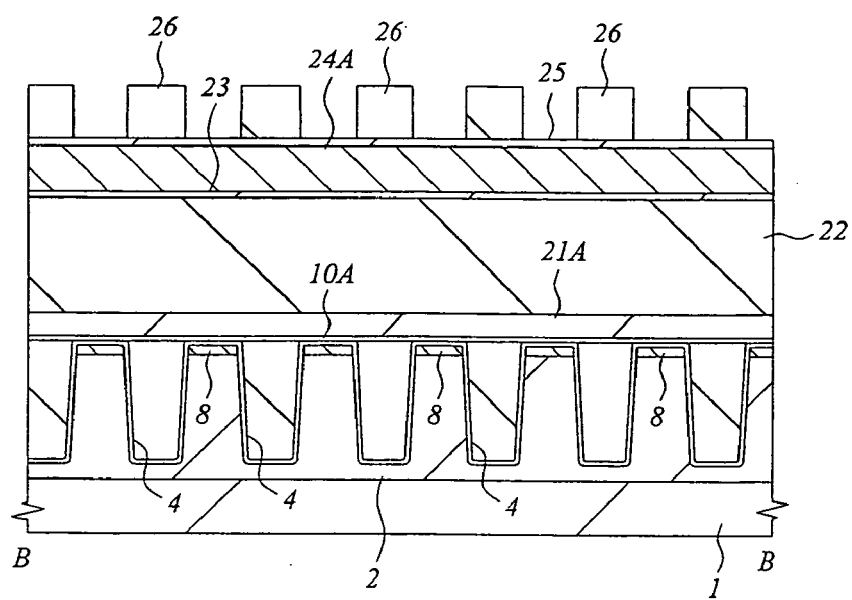
FIG. 21 is a sectional view showing the principal part of a semiconductor substrate, which illustrates the manufacturing method of DRAM according to an embodiment of the present invention.

Next, as shown in FIGS. 20 and 21 (sectional view taken along the line B—B in FIG. 9), a thin silicon oxide film 23 with a thickness of about 10 nm is deposited on the silicon oxide film 22 by the CVD method, and subsequently, a polycrystalline silicon film 24A with a thickness of about 70 nm is deposited on the silicon oxide film 23 by the CVD method. Thereafter, an anti-reflection film 25 with a thickness of about 60 nm and a photoresist film 26 with a thickness of about 400 nm are spin-coated on the polycrystalline silicon film 24A. The silicon oxide film 23 is deposited to repair the small scratches on the surface of the silicon oxide film 22 created when polishing the silicon oxide film 22 by the chemical mechanical polishing method.

Figure 22:
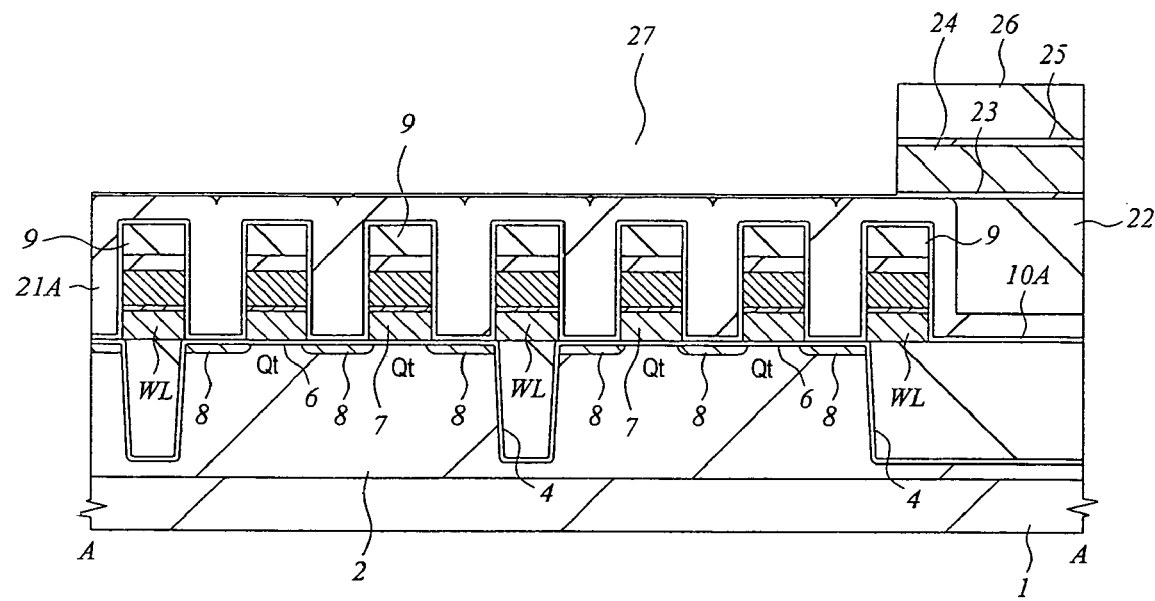
FIG. 22 is a sectional view showing the principal part of a semiconductor substrate, which illustrates the manufacturing method of DRAM according to an embodiment of the present invention.
Figure 23:
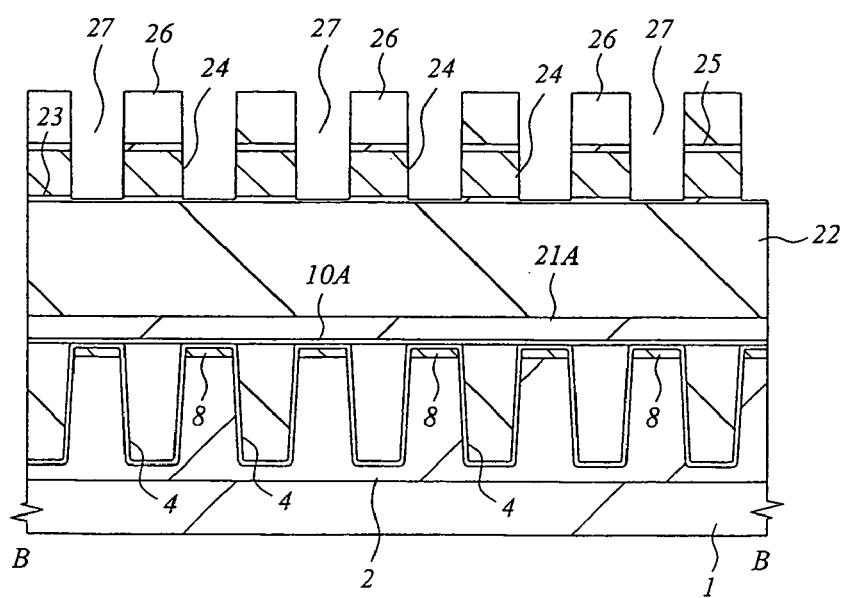
FIG. 23 is a sectional view showing the principal part of a semiconductor substrate, which illustrates the manufacturing method of DRAM according to an embodiment of the present invention.
Figure 24:
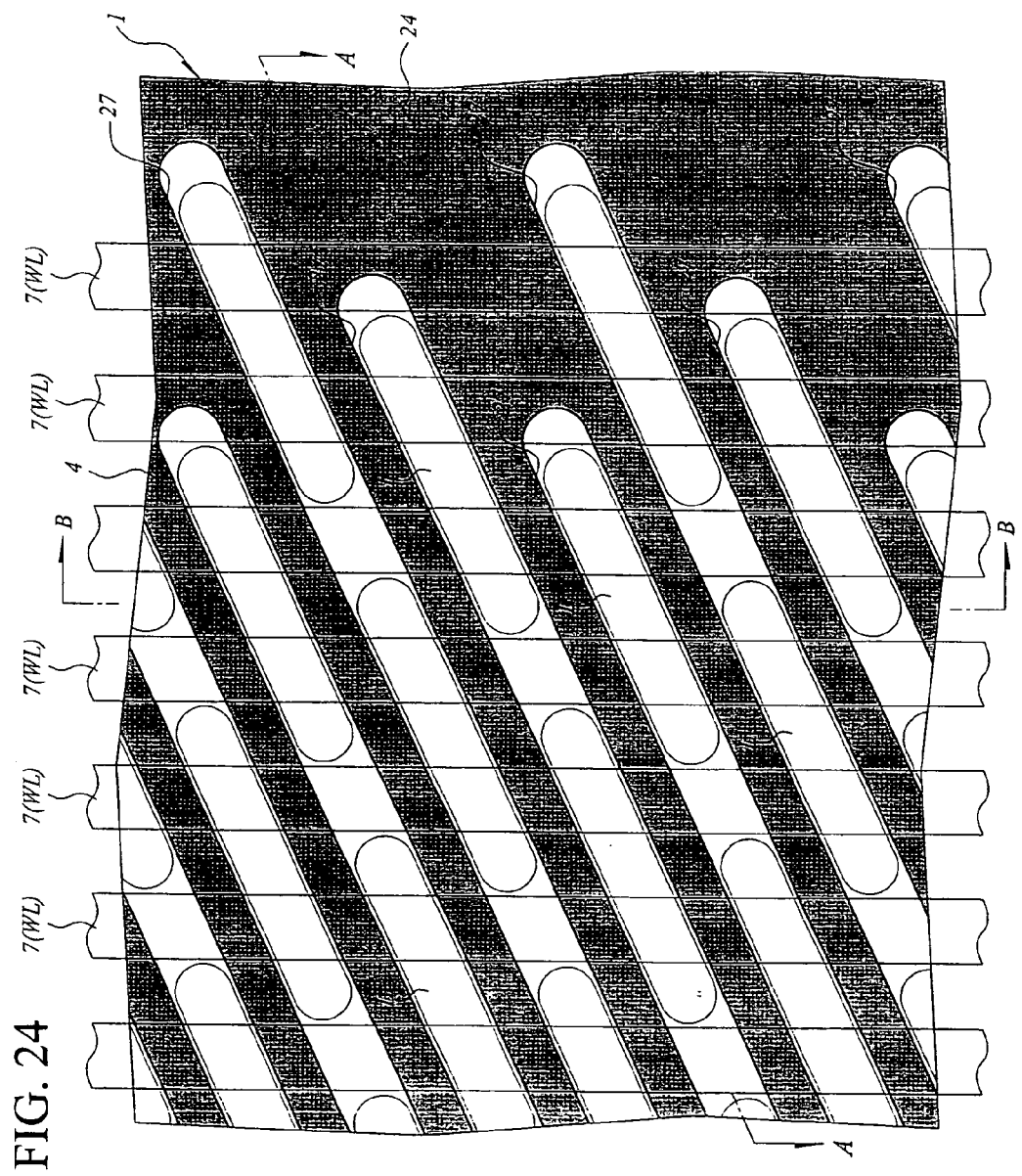
FIG. 24 is a plan view showing the principal part of a semiconductor substrate, which illustrates the manufacturing method of DRAM according to an embodiment of the present invention.

Next, as shown in FIGS. 22 and 23, the anti-reflection film 25 and the polycrystalline silicon film 24A are partially dry-etched with using the photoresist film 26 as a mask, thereby forming an etching resistant mask 24. FIG. 24 is a plan view showing a pattern (portion applied to gray color) of the etching resistant mask 24 made of the polycrystalline silicon film 24A. As shown in FIG. 24, the etching resistant mask 24 has elongated slit-shaped or trench-shaped openings 27 crossing the memory array and extending in the longitudinal direction of the active region L. The reason why the slit-shaped (trench-shaped) openings 27 are provided in the etching resistant mask 24 for forming the contact holes 12 and 13 in the spaces of the gate electrodes 7 will be described later.

Figure 25:
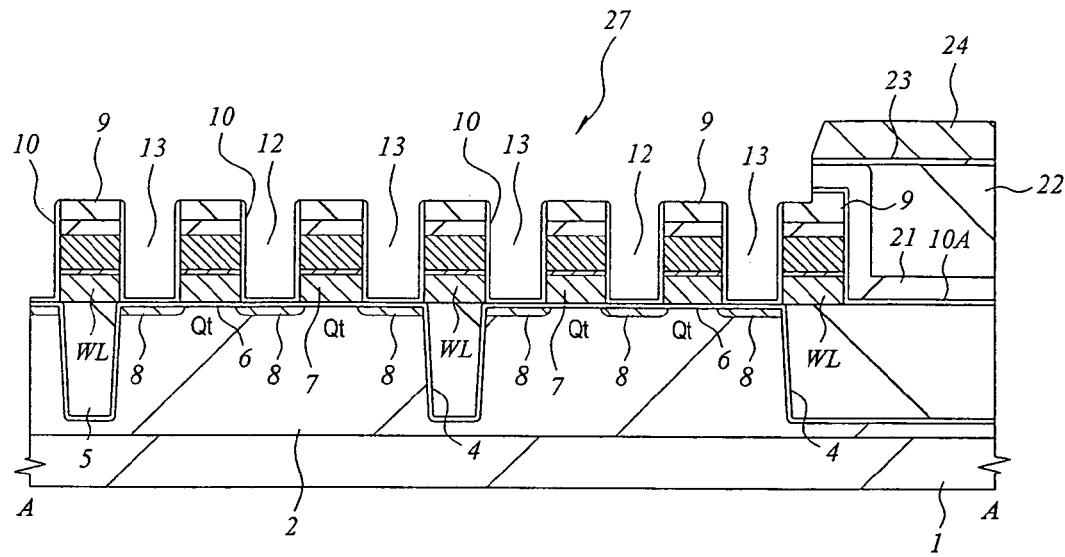
FIG. 25 is a sectional view showing the principal part of a semiconductor substrate, which illustrates the manufacturing method of DRAM according to an embodiment of the present invention.
Figure 26:
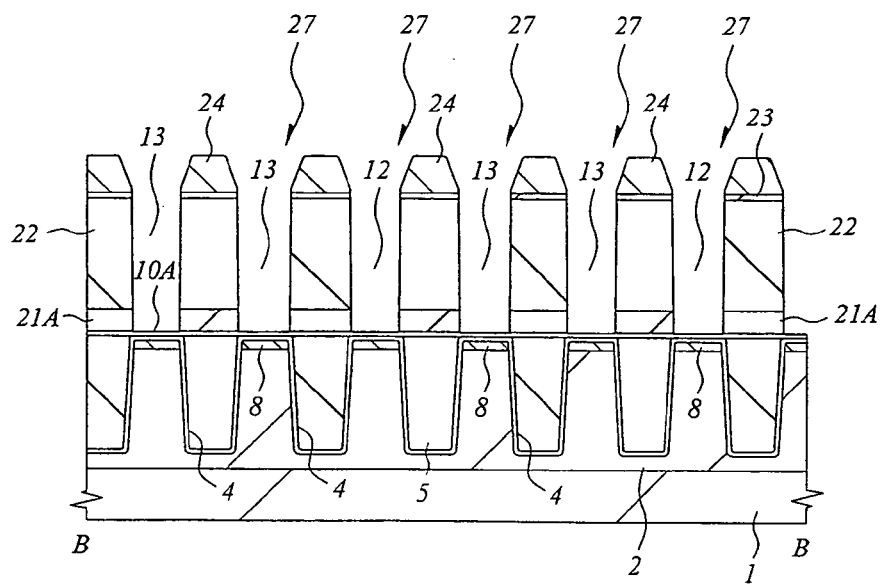
FIG. 26 is a sectional view showing the principal part of a semiconductor substrate, which illustrates the manufacturing method of DRAM according to an embodiment of the present invention.

Next, as shown in FIGS. 25 and 26, after the removal of the photoresist film 26 and the anti-reflection film 25, the silicon oxide films 23, 22, and 21A in the openings 27 are dry-etched with using the etching resistant mask 24 as a mask, thereby forming the contact holes (openings) 12 and 13 on the n-type semiconductor regions (source and drain regions) 8, more specifically, in the spaces between the gate electrodes 7. One of the contact holes 12 and 13 (contact hole 12) is used to connect one of the n-type semiconductor regions (source and drain regions) 8 to the bit line BL, and the other of them (contact hole 13) is used to connect the other of the n-type semiconductor regions (source and drain regions) 8 to the lower electrode 41 of the data storage capacitor C.

The dry etching of the silicon oxide films 23, 22, and 21A is performed with using the silicon nitride film which forms a part of the cap insulating film 9 and the silicon nitride film 10A as etching stoppers. In this manner, it is possible to prevent the problem that the silicon oxide film 5 in the device isolation trench 4 is etched when performing the dry etching of the silicon oxide-films 21A, 22, and 23 and also possible to prevent the problem that the cap insulating film 9 is etched and the upper surface of the gate electrode 7 (word line WL) is exposed. In addition, the sidewall insulating film 10 made of the silicon nitride film 10A is formed on the sidewall of the gate electrode 7 (word line WL) by this dry etching.

Figure 27:
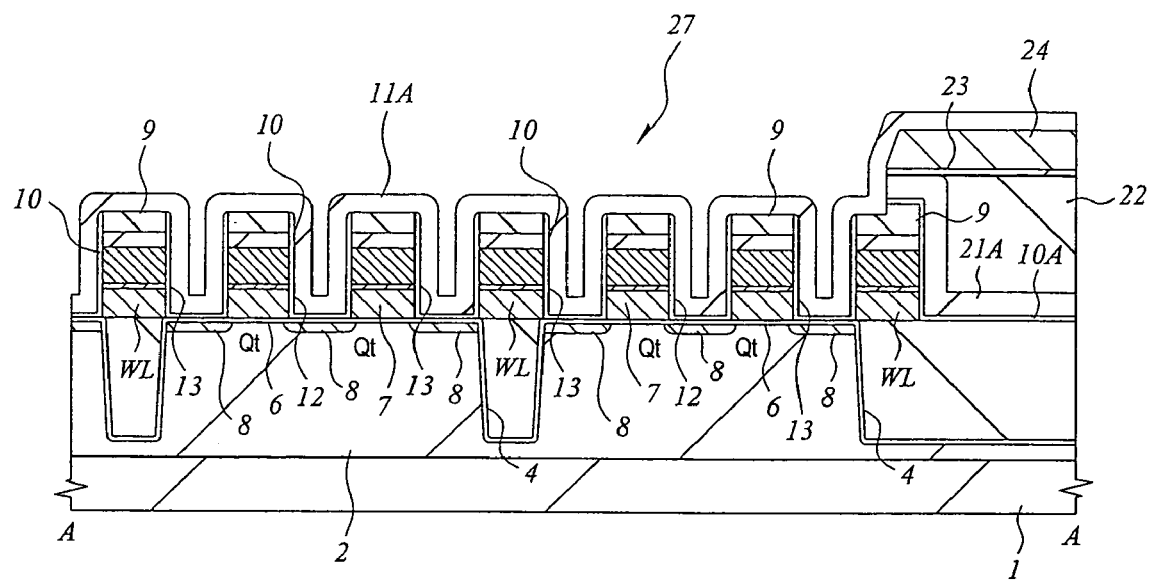
FIG. 27 is a sectional view showing the principal part of a semiconductor substrate, which illustrates the manufacturing method of DRAM according to an embodiment of the present invention.
Figure 28:
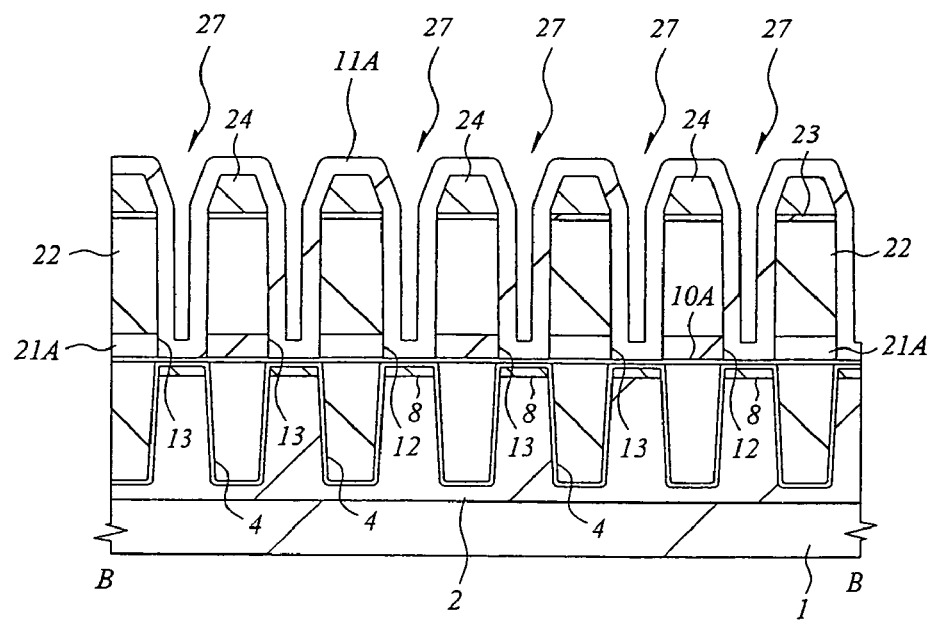
FIG. 28 is a sectional view showing the principal part of a semiconductor substrate, which illustrates the manufacturing method of DRAM according to an embodiment of the present invention.
Figure 29:
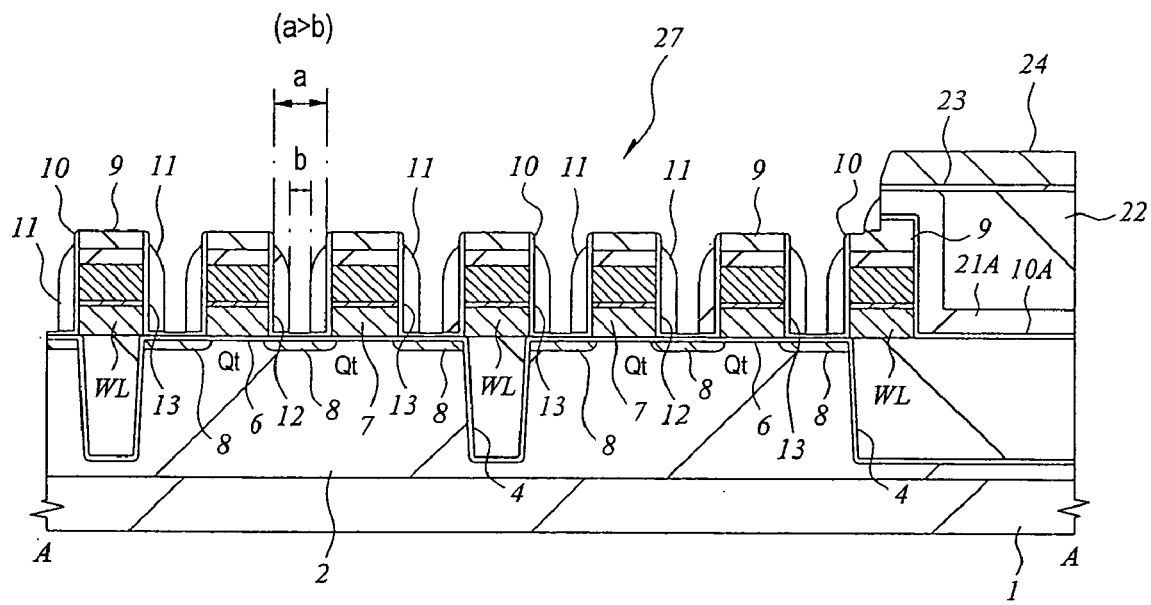
FIG. 29 is a sectional view showing the principal part of a semiconductor substrate, which illustrates the manufacturing method of DRAM according to an embodiment of the present invention.
Figure 30:
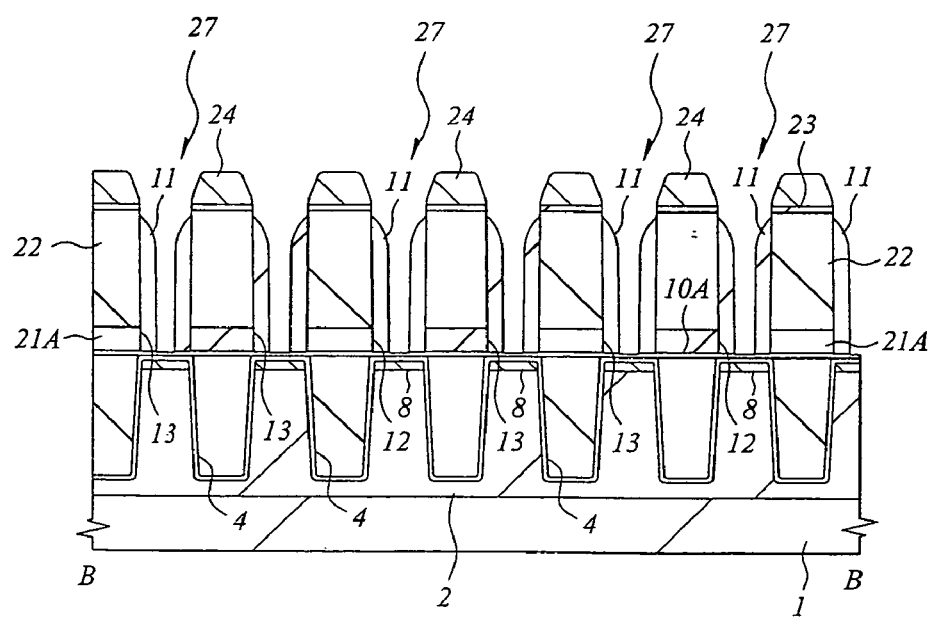
FIG. 30 is a sectional view showing the principal part of a semiconductor substrate, which illustrates the manufacturing method of DRAM according to an embodiment of the present invention.

Next, as shown in FIGS. 27 and 28, a silicon oxide film 11A with a thickness of about 30 nm is deposited on the substrate 1 by the CVD method. Thereafter, the sidewall insulating film 11 made of the silicon oxide film 11A is formed on the sidewall of the gate electrode 7 (word line WL) by the anisotropic etching of the silicon oxide film 11A as shown in FIG. 29. At this time, as shown in FIG. 30, the sidewall insulating film 11 made of the silicon oxide film 11A is formed also on the sidewalls of the silicon oxide films 22 and 21A along the extension direction of the slit-shaped (trench-shaped) openings 27.

The anisotropic etching of the silicon oxide film 11A is performed with using the sidewall insulating film 10 made of silicon nitride and the silicon nitride film forming a part of the cap insulating film 9 as etching stoppers. By doing so, the height of the sidewall insulating film 11 formed on the sidewall of the gate electrode 7 (word line WL) becomes lower than the upper surface of the cap insulating film 9 (FIG. 29). In addition, it is desirable that the etching amount in the anisotropic etching of the sidewall insulating film 11 is controlled in consideration of the thickness reduction of the cap insulating film 9 due to the chemical mechanical polishing performed later with using the silicon nitride film of the cap insulating film 9 as a stopper. More specifically, it is preferable to sufficiently ensure the difference in height between the upper surface of the sidewall insulating film 11 and the upper surface of the cap insulating film 9 so that the upper surface of the sidewall insulating film 11 made of silicon oxide surely becomes lower than the upper surface of the cap insulating film 9 even after the chemical mechanical polishing. Meanwhile, the upper end portion of the sidewall insulating film 11 formed on the sidewall of the silicon oxide films 22 and 21A is higher than that of the sidewall insulating film 11 formed on the sidewall of the gate electrode 7 (word line WL) (FIG. 30).

In the process so far, two-layered sidewall insulating films 10 and 11 comprised of a thin silicon nitride film (10A) and a silicon oxide film (11A) with a thickness larger than that of the silicon nitride film are formed on the sidewall of the gate electrode 7 (word line WL) of the memory cell selecting MISFET Qt. Also, since the height of the sidewall insulating film 11 made of a silicon oxide film (11A) on the sidewall of the gate electrode 7 (word line WL) is lower than the upper surface of the cap insulating film 9, the diameter (a) in the upper portion of the section along the direction of the gate length of the contact holes 12 and 13 formed in the spaces of the gate electrodes 7 (word lines WL) is larger than the diameter (b) in the bottom of the same (a>b).

Figure 31:
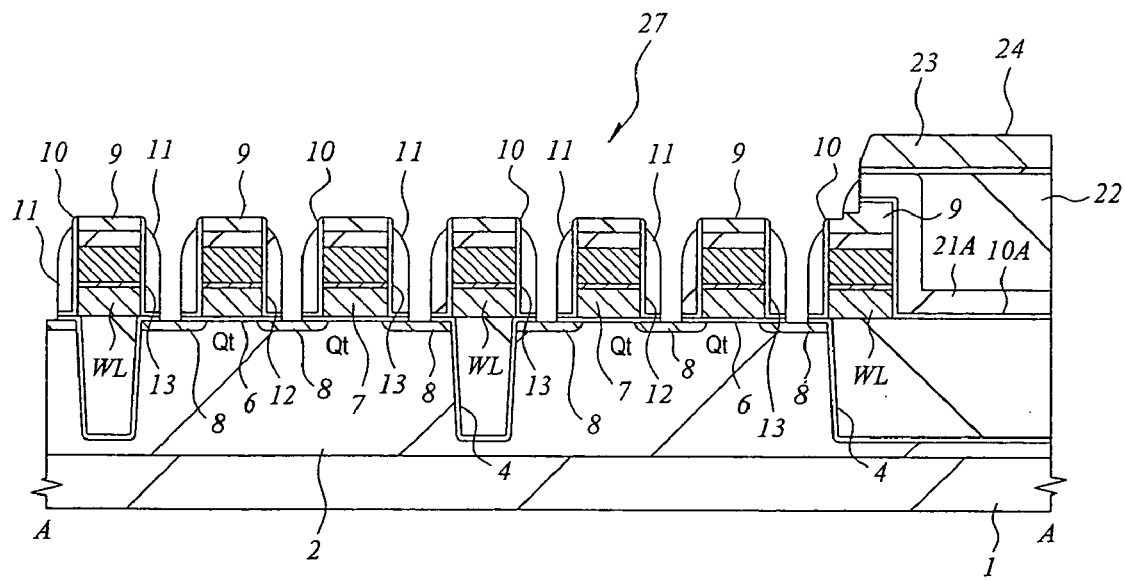
FIG. 31 is a sectional view showing the principal part of a semiconductor substrate, which illustrates the manufacturing method of DRAM according to an embodiment of the present invention.
Figure 32:
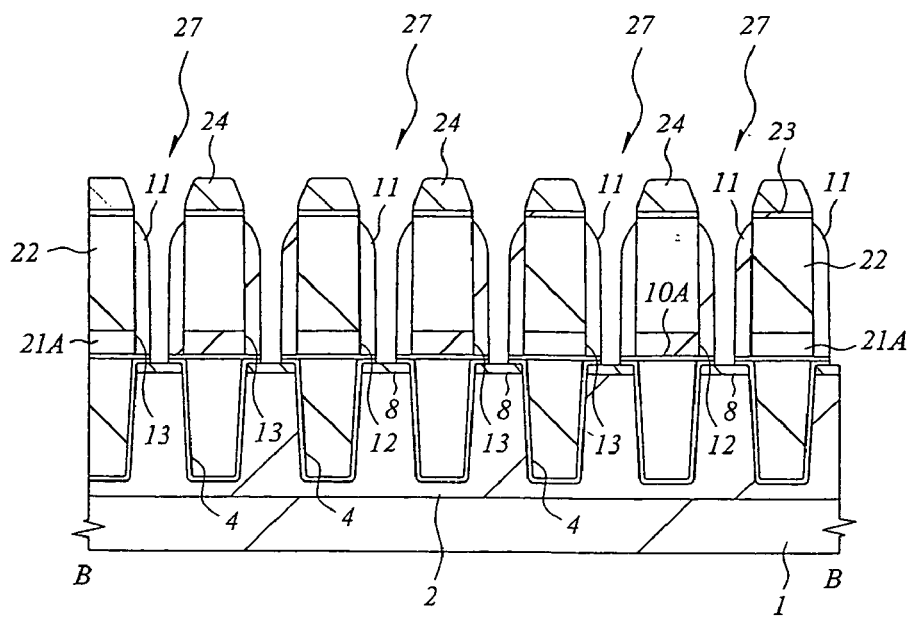
FIG. 32 is a sectional view showing the principal part of a semiconductor substrate, which illustrates the manufacturing method of DRAM according to an embodiment of the present invention.

Next, as shown in FIGS. 31 and 32, the thin silicon nitride film 10A left at the bottom of the contact holes 12 and 13 is removed by the dry etching to expose the surface of the n-type semiconductor regions (source and drain regions) 8. Subsequently, the surface of the n-type semiconductor regions (source and drain regions) 8 damaged by the dry etching is thinly dry-etched to remove the damage. Thereafter, the surface is cleaned by the use of hydrofluoric acid.

Figure 33:
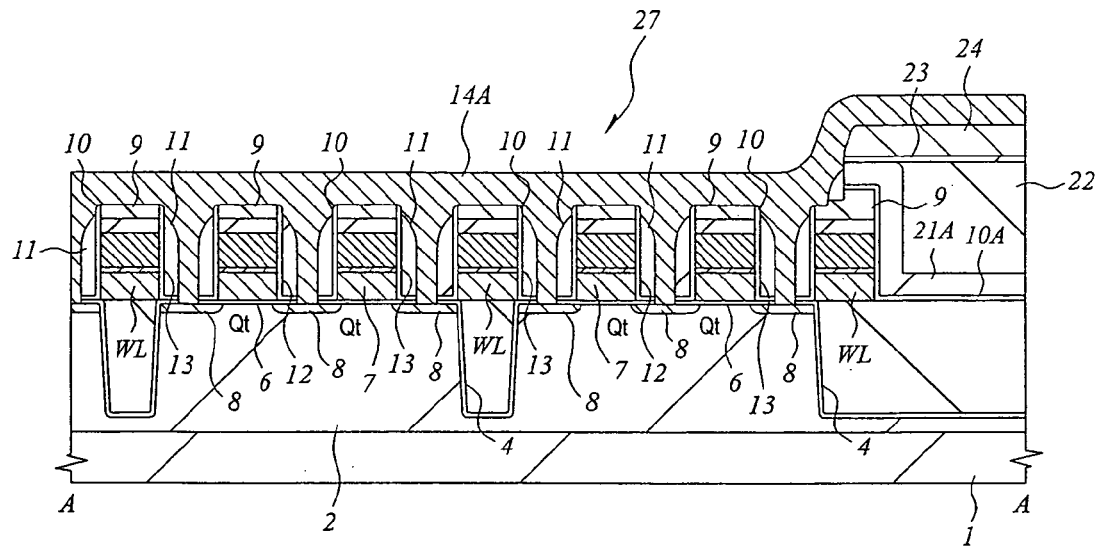
FIG. 33 is a sectional view showing the principal part of a semiconductor substrate, which illustrates the manufacturing method of DRAM according to an embodiment of the present invention.
Figure 34:
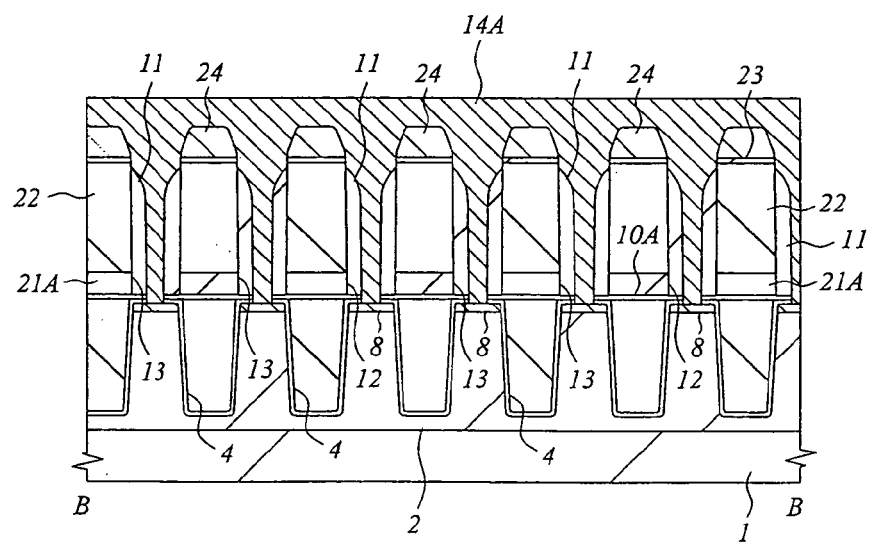
FIG. 34 is a sectional view showing the principal part of a semiconductor substrate, which illustrates the manufacturing method of DRAM according to an embodiment of the present invention.

Next, as shown in FIGS. 33 and 34, an n-type polycrystalline silicon film 14A with a thickness of about 100 nm doped with P (phosphorus) is deposited by the CVD method to fill the contact holes 12 and 13 with the n-type polycrystalline silicon film 14A. Note that if contact holes with a diameter larger than those of the contact holes 12 and 13 are provided in the peripheral circuit section, there is the possibility that the thickness of the n-type polycrystalline silicon film 14A in the contact holes becomes insufficient and the substrate 1 at the bottom of the contact hole is removed when polishing the n-type polycrystalline silicon film 14A in the subsequent process. Therefore, it is also preferable to deposit a silicon oxide film with a thickness of about 200 nm further on the n-type polycrystalline silicon film 14A by the CVD method.

Figure 35:
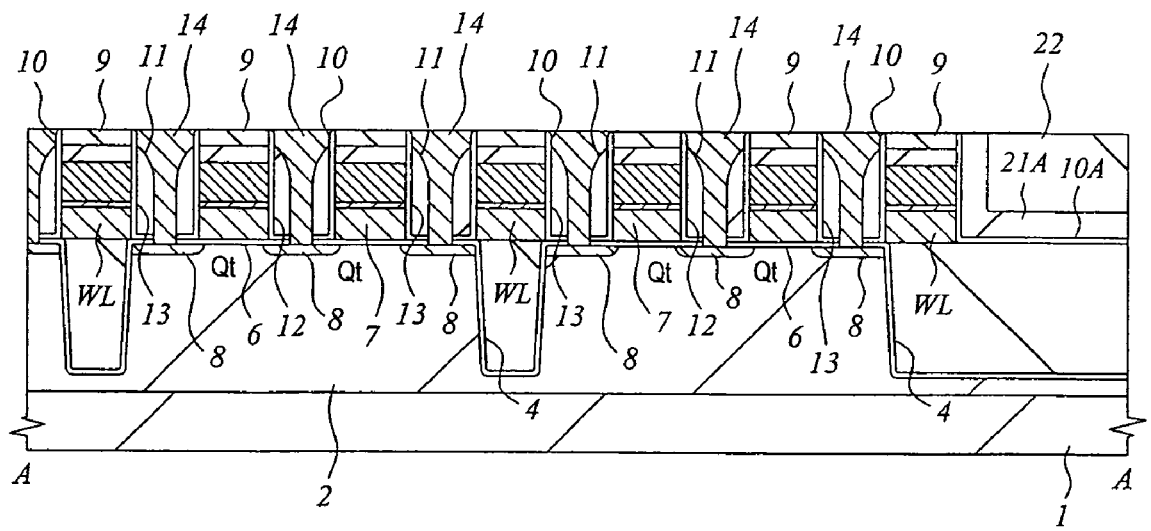
FIG. 35 is a sectional view showing the principal part of a semiconductor substrate, which illustrates the manufacturing method of DRAM according to an embodiment of the present invention.
Figure 36:
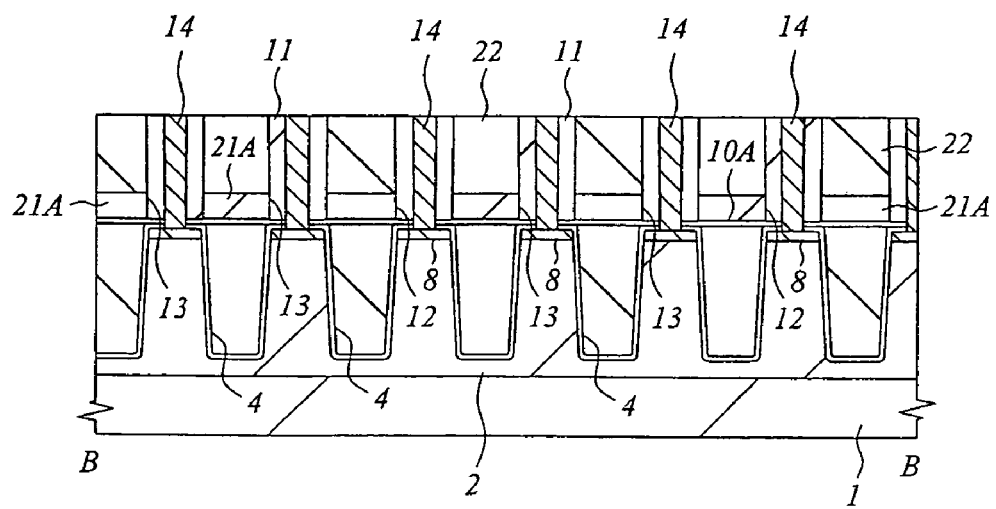
FIG. 36 is a sectional view showing the principal part of a semiconductor substrate, which illustrates the manufacturing method of DRAM according to an embodiment of the present invention.

Next, as shown in FIGS. 35 and 36, the n-type polycrystalline silicon film 14A, the etching resistant mask 24 made of the polycrystalline silicon, and the underlying silicon oxide films 21A, 22, and 23 are polished by the chemical mechanical polishing. By so doing, the n-type polycrystalline silicon film 14A outside the contact holes 12 and 13 is removed, and the plugs 14 made of the n-type polycrystalline silicon film 14A are formed in the contact holes 12 and 13. This chemical mechanical polishing is performed with using the silicon nitride film forming a part of the cap insulating film 9 as a stopper.

As described above, in this embodiment, the silicon oxide films 21A, 22, and 23 are dry-etched by the use of the etching resistant mask 24 having the slit-shaped (trench-shaped) openings 27 extending in the longitudinal direction of the active regions L. By doing so, the contact holes (openings) 12 and 13 are formed in the spaces of the gate electrodes 7. Next, the sidewall insulating films 11 made of the silicon oxide film 11A are formed on the sidewalls of the gate electrodes 7 and on the sidewalls of the silicon oxide films 22 and 21A which constitute the sidewall surfaces of the contact holes 12 and 13. Thereafter, the plugs 14 are formed in the contact holes 12 and 13.

In addition, since the laminated structure in which a part of the cap insulating film 9 is formed of a silicon nitride film is used in this embodiment, it is possible to use the silicon nitride film as a stopper when performing the chemical mechanical polishing to the n-type polycrystalline silicon film 14A. Therefore, it is possible to easily control the thickness of the cap insulating film 9.

Furthermore, the cap insulating film 9 in this embodiment has a laminated structure in which a silicon oxide film is provided below the silicon nitride film used as a stopper in the chemical mechanical polishing. Therefore, it is possible to ensure the thickness of the cap insulating film 9 at the end of the chemical mechanical polishing, while reducing the thickness of the silicon nitride film that is undesirable from the viewpoint of the etching selectivity to the resist and that to the tungsten when processing the gate electrode 7.

Figure 37A:
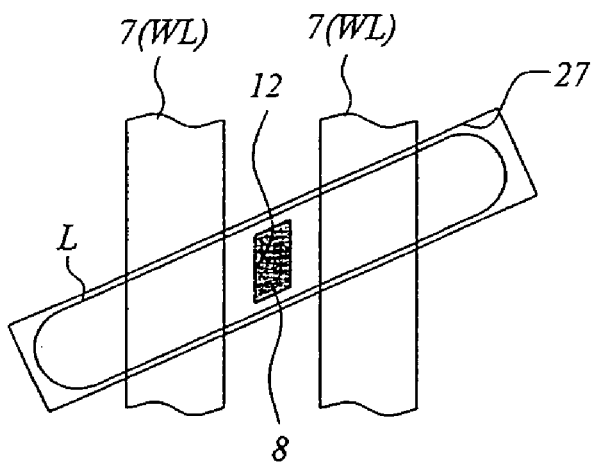
FIG. 37A is a schematic plan view of a contact hole formed by the use of an etching resistant mask having a slit-shaped (trench-shaped) opening.

FIG. 37A is a schematic plan view of the contact hole 12 formed by the use of the etching resistant mask 24 having the slit-shaped (trench-shaped) opening 27. Since the sidewall insulating film 11 made of a silicon oxide film is formed on the sidewall of the contact hole 12, the region inside the sidewall insulating film 11 (portion applied to gray color) serves as the region at which the n-type semiconductor region 8 exposed at the bottom of the contact hole 12 comes into contact with the plug 14.

Figure 37B:
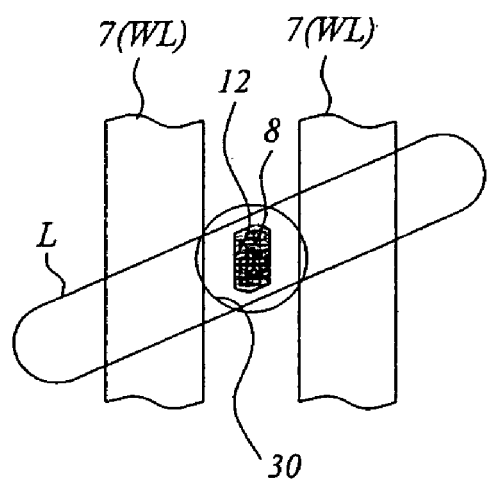
FIG. 37B is a schematic plan view of a contact hole formed by the use of an etching resistant mask having a hole-shaped opening.
Figure 37C:
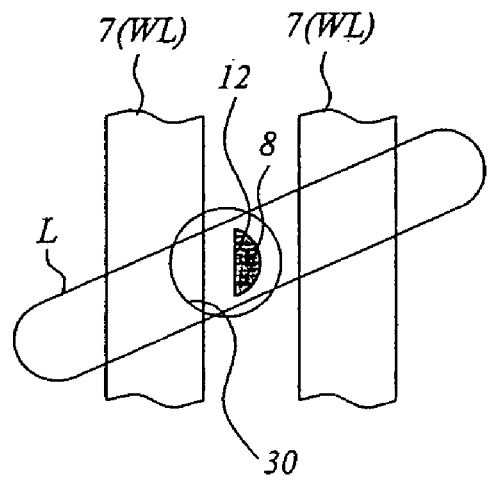
FIG. 37C is a schematic plan view of a contact hole formed by the use of an etching resistant mask having a hole-shaped opening.

Meanwhile, FIG. 37B is a schematic plan view of the contact hole 12 formed by the use of the etching resistant mask having the hole-shaped opening 30 in the contact hole opening region. Also in this case, the sidewall insulating film 11 is formed on the sidewall of the contact hole 12. Therefore, the region inside the sidewall insulating film 11 (portion applied to gray color) serves as the region at which the n-type semiconductor region 8 exposed at the bottom of the contact hole 12 comes into contact with the plug 14. However, in the case of the contact hole 12 formed by the use of the etching resistant mask with such a hole-shaped opening 30, when the position of the opening 30 is shifted in the longitudinal direction of the active region L due to the misalignment of the photomask, the region at which the n-type semiconductor region 8 comes into contact with the plug 14 becomes small as shown in FIG. 37C. Contrary to this, in the case of the contact hole 12 formed by the use of the etching resistant mask with the slit-shaped (trench-shaped) opening 27 extending in the longitudinal direction of the active region L, the region at which the n-type semiconductor region 8 comes into contact with the plug 14 does not become small even when the position of the opening 27 is shifted in the longitudinal direction of the active region L due to the misalignment of the photomask. More specifically, according to this embodiment in which the contact hole 12 is formed by the use of the etching resistant mask having the slit-shaped (trench-shaped) opening 27, it is possible to ensure the utmost contact area between the plug 14 filled into the contact hole 12 and the n-type semiconductor region 8. Therefore, it is possible to prevent the increase of the contact resistance between the plug 14 and the n-type semiconductor region 8.

The difference in contact area between the plug 14 and the n-type semiconductor region 8 due to the shape of the opening formed in the etching resistant mask differs between the case where the sidewall insulating film is formed on the sidewall of the gate electrode and then forming the contact hole in the spaces of the gate electrodes like that in the conventional self align contact (SAC) technique and the case where the contact hole is formed in the spaces of the gate electrodes and then forming the sidewall insulating film on the sidewall of the gate electrode like that in this embodiment.

Figure 38:
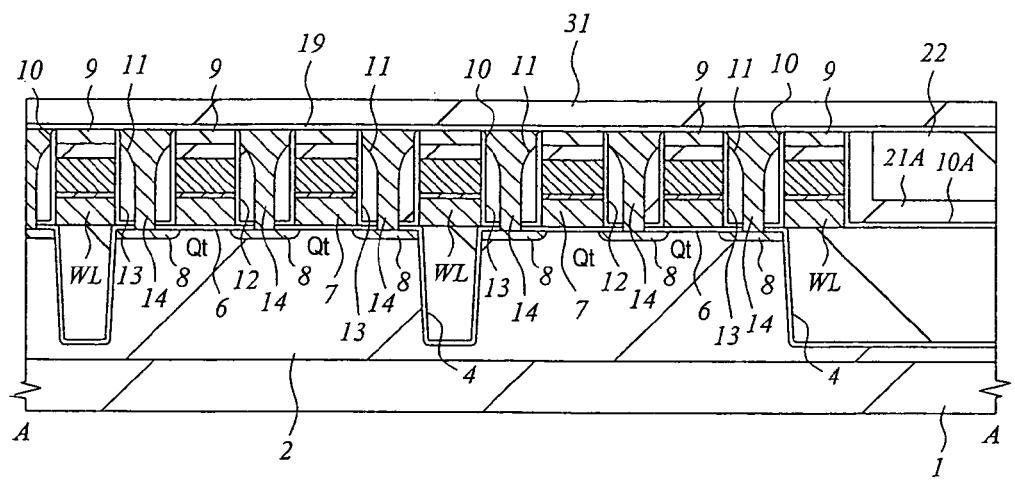
FIG. 38 is a sectional view showing the principal part of a semiconductor substrate, which illustrates the manufacturing method of DRAM according to an embodiment of the present invention.
Figure 39:
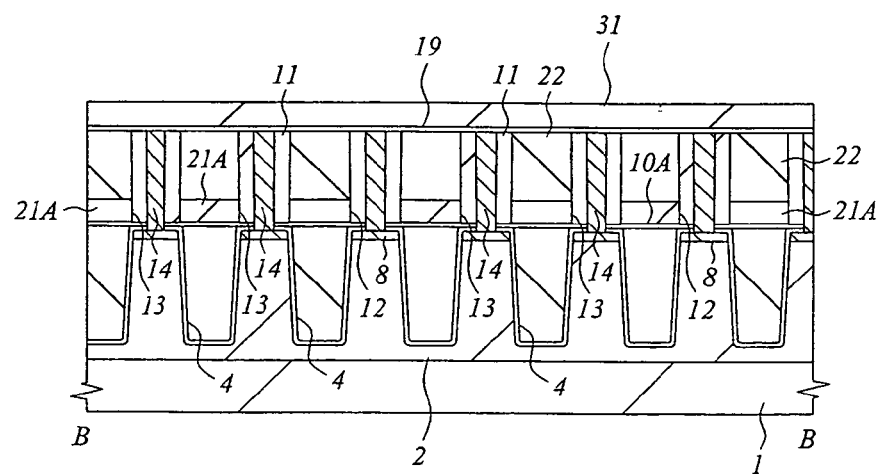
FIG. 39 is a sectional view showing the principal part of a semiconductor substrate, which illustrates the manufacturing method of DRAM according to an embodiment of the present invention.

Next, as shown in FIGS. 38 and 39, a silicon nitride film 19 with a thickness of about 20 nm is deposited over the substrate 1 by the CVD method, and then, a silicon oxide film 31 with a thickness of about 300 nm is deposited on the silicon nitride film 19 by the CVD method. Thereafter, about 100 nm of the silicon oxide film 31 is polished by the chemical mechanical polishing method so as to planarize the surface thereof. The planarization of the silicon oxide film 31 is performed with an aim to increase the accuracy of the formation of the through holes (32 and 36) formed over the memory cell selecting MISFET Qt in the latter process.

Figure 40:
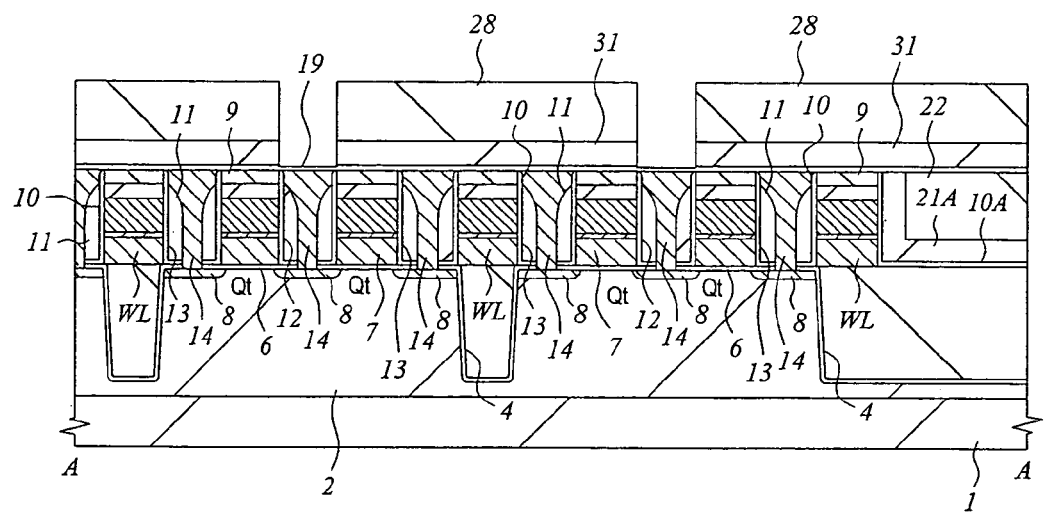
FIG. 40 is a sectional view showing the principal part of a semiconductor substrate, which illustrates the manufacturing method of DRAM according to an embodiment of the present invention.
Figure 41:
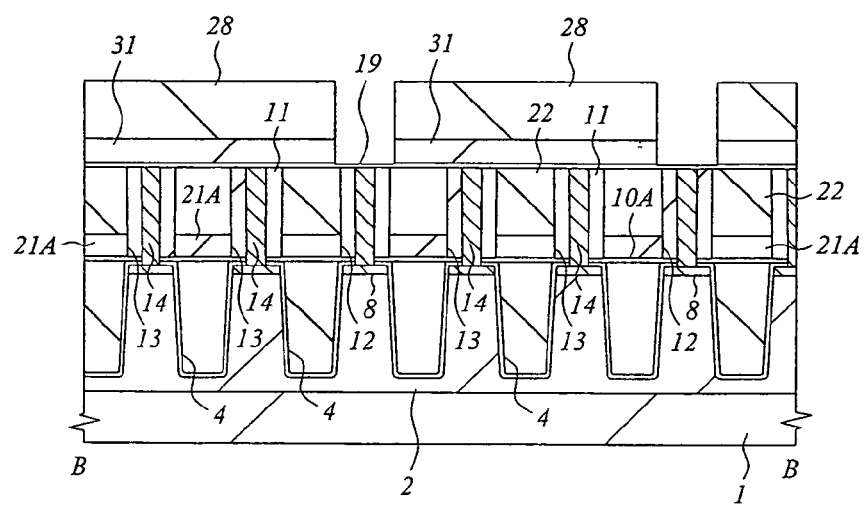
FIG. 41 is a sectional view showing the principal part of a semiconductor substrate, which illustrates the manufacturing method of DRAM according to an embodiment of the present invention.

Next, as shown in FIGS. 40 and 41, the silicon oxide film 31 on the contact holes 12 is dry-etched with using the photoresist film 28 as a mask. The dry etching of the silicon oxide film 31 is performed with using the underlying silicon nitride film 19 as an etching stopper. More specifically, this dry etching is performed under the condition that the etching selectivity of the silicon oxide film 31 with respect to the silicon nitride film 19 is high so as not to completely remove the silicon nitride film 19 above the contact holes 12.

Figure 42:
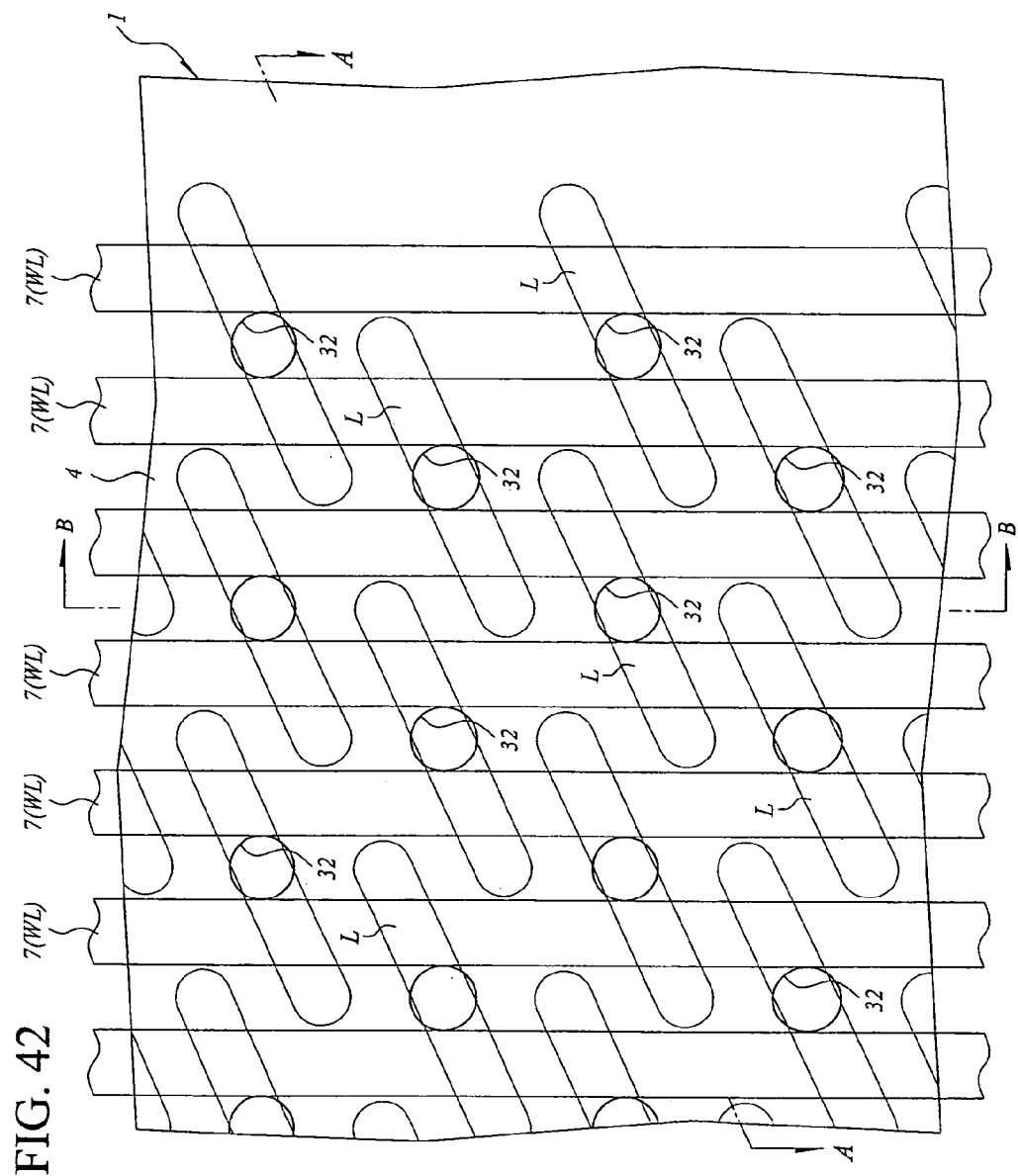
FIG. 42 is a plan view showing the principal part of a semiconductor substrate, which illustrates the manufacturing method of DRAM according to an embodiment of the present invention.
Figure 43:
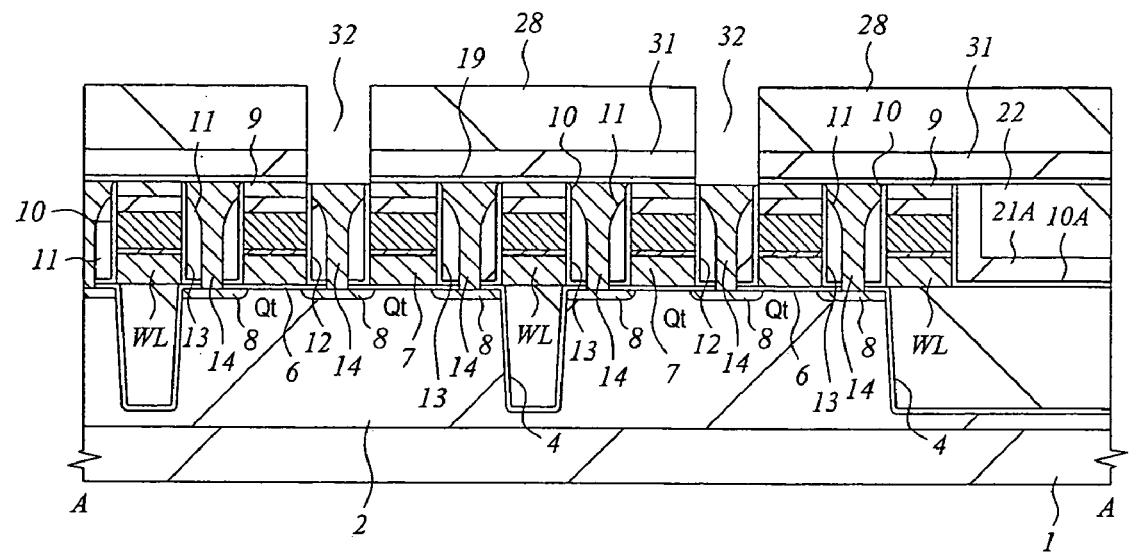
FIG. 43 is a sectional view showing the principal part of a semiconductor substrate, which illustrates the manufacturing method of DRAM according to an embodiment of the present invention.
Figure 44:
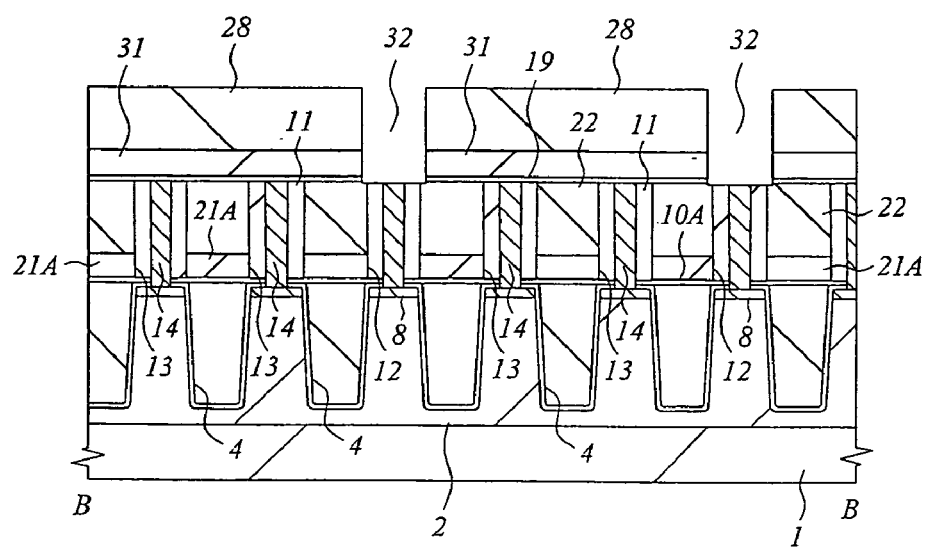
FIG. 44 is a sectional view showing the principal part of a semiconductor substrate, which illustrates the manufacturing method of DRAM according to an embodiment of the present invention.

Next, as shown in FIGS. 42, 43, and 44, the silicon nitride film 19 above the contact holes 12 is dry-etched with using the photoresist film 28 as a mask, thereby forming through holes 32 above the contact holes 12. The dry etching of the silicon nitride film 19 is performed under the condition that the etching selectivity with respect to the silicon oxide film is high.

Figure 45:
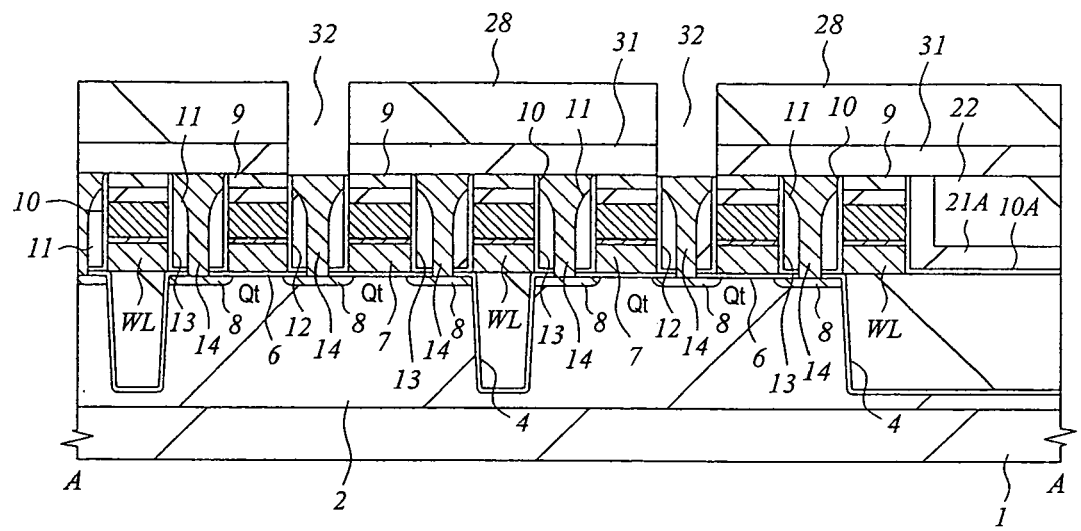
FIG. 45 is a sectional view used to explain the problem examined by the inventor of the present invention.
Figure 46:
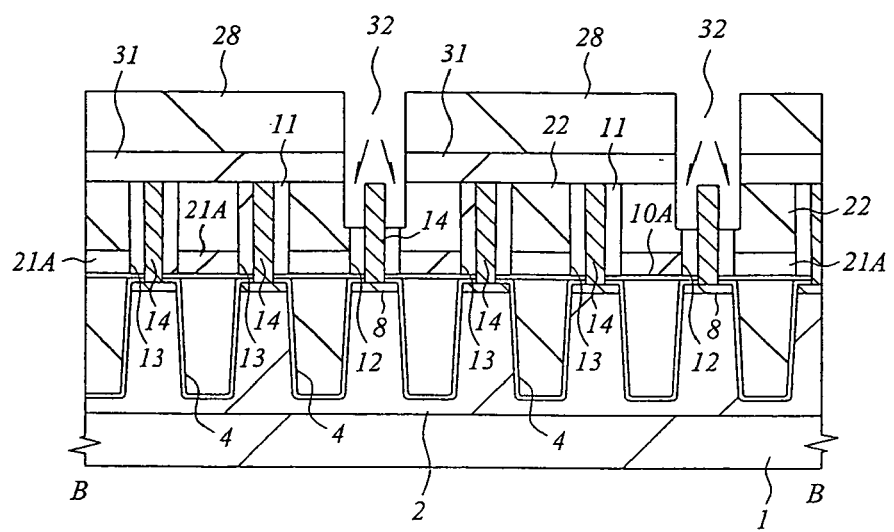
FIG. 46 is a sectional view used to explain the problem examined by the inventor of the present invention.

The reason why the silicon nitride film 19 is provided below the silicon oxide film 31 will be described here with reference to FIG. 45 and 46. FIG. 45 is a sectional view taken along the line A—A (in the longitudinal direction of the active region L) in FIG. 42, and FIG. 46 is a sectional view taken along the line B—B (in the extension direction of the word line WL) in FIG. 42. Both of them show the case where the silicon nitride film 19 is not provided below the silicon oxide film 31.

In the section (FIG. 45) along the longitudinal direction of the active region L, the upper portions of the gate electrodes 7 (word lines WL) are covered with the cap insulating films 9 including the silicon nitride film. Therefore, even in the case where the position of the through hole 32 and that of the underlying contact hole 12 are shifted when performing the dry etching of the silicon oxide film 31 on the contact holes 12 with using the photoresist film 28 as a mask, the cap insulating film 9 serves as the etching stopper, and hence, the bottom surface of the through hole 32 is little receded below the upper surface of the cap insulating film 9.

Meanwhile, in the section (FIG. 46) along the extension direction of the word line WL, the silicon nitride film (19) serving as an etching stopper is not provided below the contact holes 12. Therefore, when the silicon oxide film 31 is etched, the underlying silicon oxide film 22 and the sidewall insulating film 11 made of silicon oxide are also etched, and thus, the bottom surface of the through hole 32 is largely receded below the upper surface of the cap insulating film 9 (positions pointed out by the arrows in FIG. 46). As a result, the distance between the plug 33 and the gate electrode 7 (word line WL) is shortened when filling the plug 33 made of metal into the through hole 32 and forming the bit line BL on the plug in the later-described process.

Consequently, the capacitance formed between the bit line BL and the gate electrode 7 (word line WL) is increased.

Contrary to this, in the case where the silicon nitride film 19 is provided below the silicon oxide film 31 like in this embodiment, the silicon oxide film 22 at the bottom of the through holes 32 and the sidewall insulating films 11 are etched only a little as shown in FIG. 44. Consequently, it is possible to sufficiently ensure the distance between the plug 33 filled into the through hole 32 and the gate electrode 7 (word line WL) and also possible to prevent the increase of the capacitance formed between the bit line BL and the gate electrode 7 (word line WL).

Figure 47:
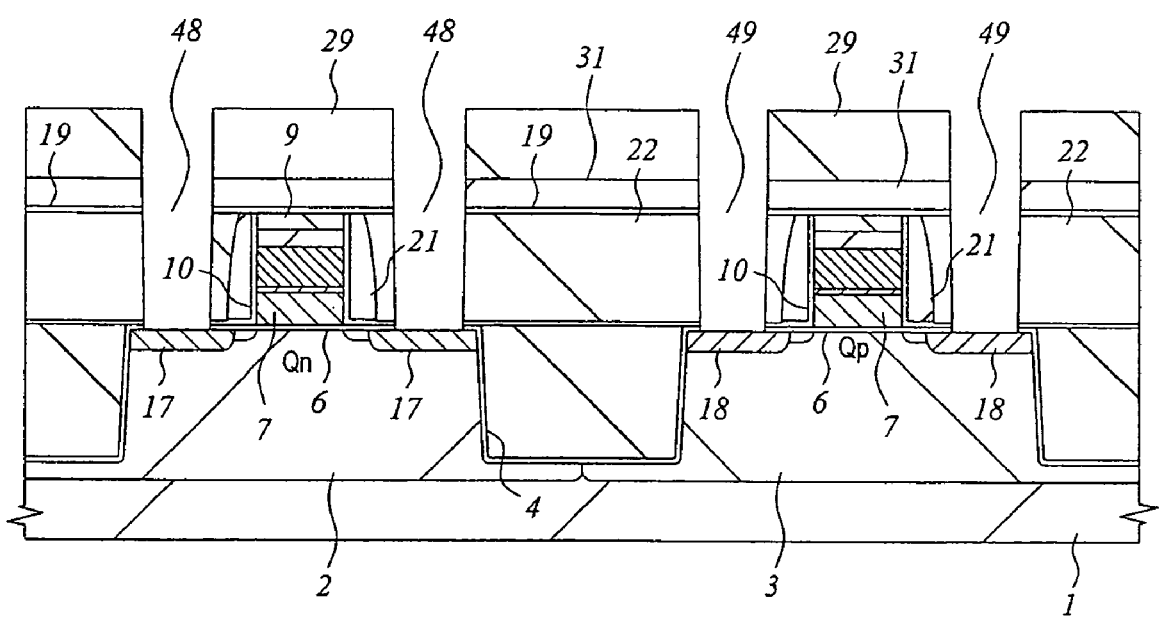
FIG. 47 is a sectional view showing the principal part of a semiconductor substrate, which illustrates the manufacturing method of DRAM according to an embodiment of the present invention.

Next, as shown in FIG. 47, the silicon oxide film 31, the silicon nitride film 19, and the silicon oxide film 22 in the peripheral circuit section are sequentially etched with using the photoresist film 29 formed on the silicon oxide film 31 as a mask, thereby forming contact holes 48 on the $n^+$-type semiconductor regions (source and drain regions) 17 of the n-channel MISFET Qn and forming contact holes 49 on the $p^+$-type semiconductor regions (source and drain regions) 18 of the p-channel MISFET Qp.

Figure 48:
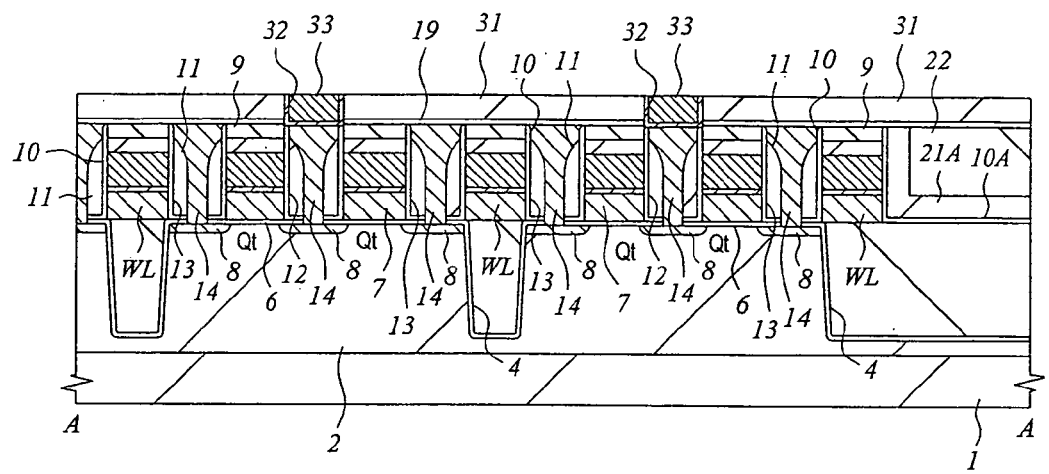
FIG. 48 is a sectional view showing the principal part of a semiconductor substrate, which illustrates the manufacturing method of DRAM according to an embodiment of the present invention.
Figure 49:
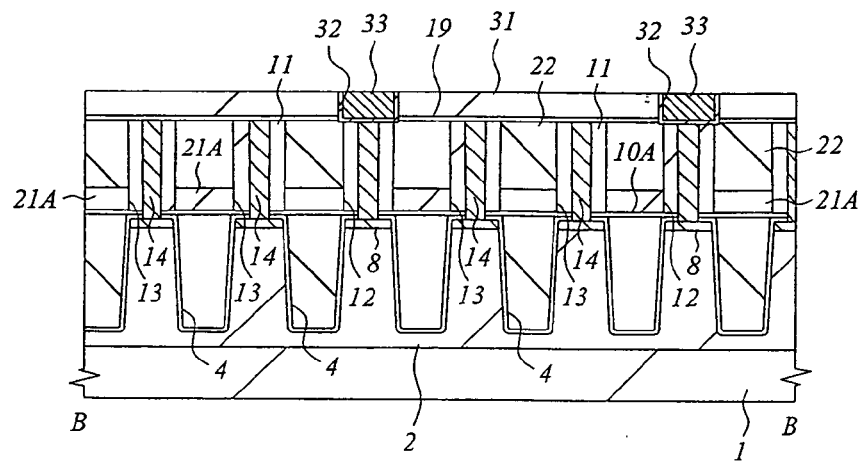
FIG. 49 is a sectional view showing the principal part of a semiconductor substrate, which illustrates the manufacturing method of DRAM according to an embodiment of the present invention.
Figure 50:
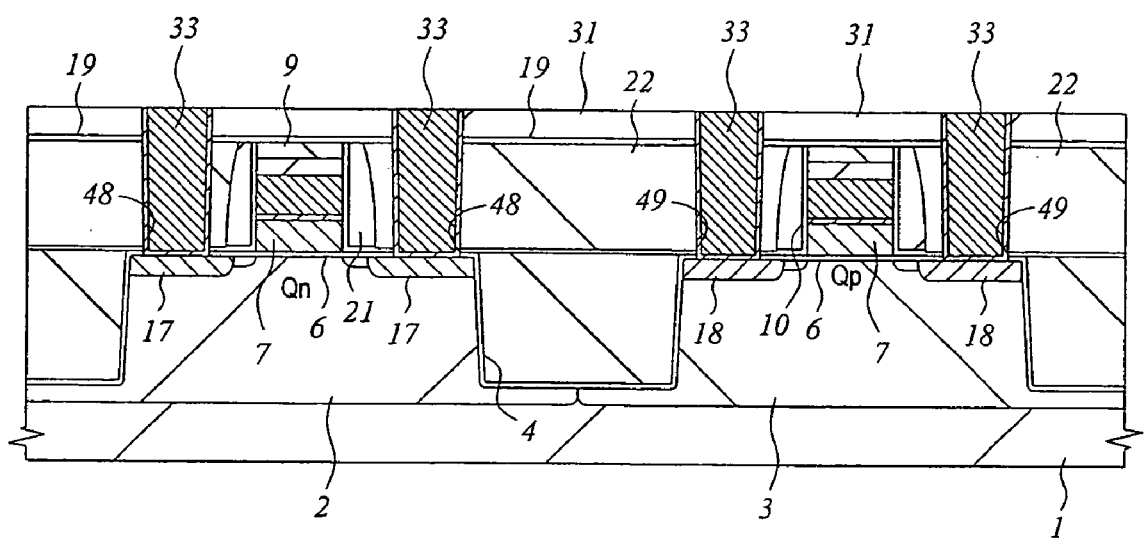
FIG. 50 is a sectional view showing the principal part of a semiconductor substrate, which illustrates the manufacturing method of DRAM according to an embodiment of the present invention.

Next, as shown in FIGS. 48 to 50, the plugs 33 are formed in the through holes 32 and the contact holes 48 and 49. The plug 33 is formed in the following manner. For example, a barrier metal film made of TiN is deposited on the silicon oxide film 31 by the CVD method, and then, a W film is deposited on the barrier metal film by the CVD method to fill these films into the through holes 32 and the contact holes 48 and 49. Thereafter, these films outside the through holes 32 and the contact holes 48 and 49 are removed by the chemical mechanical polishing method.

Figure 51:
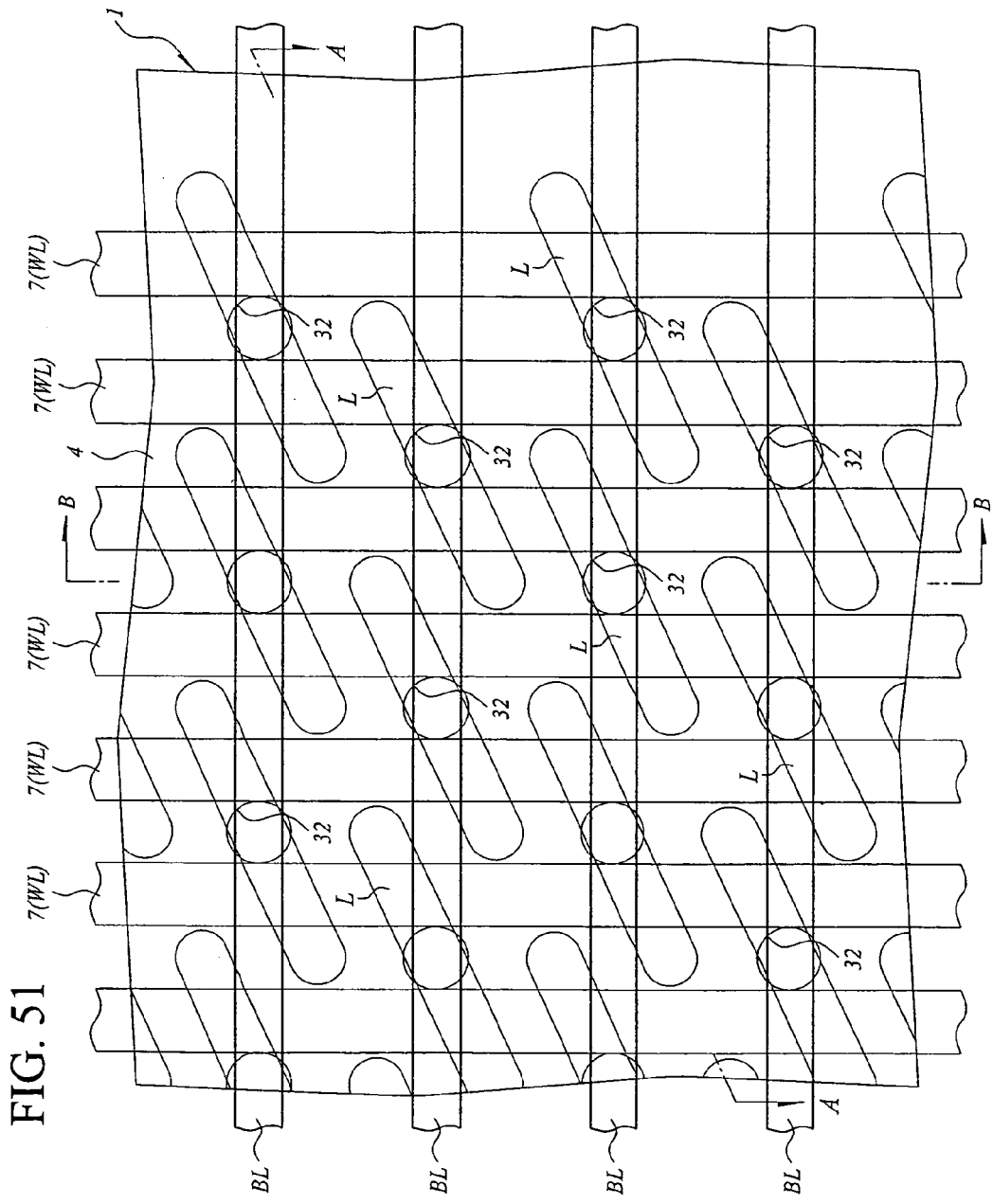
FIG. 51 is a plan view showing the principal part of a semiconductor substrate, which illustrates the manufacturing method of DRAM according to an embodiment of the present invention.
Figure 52:
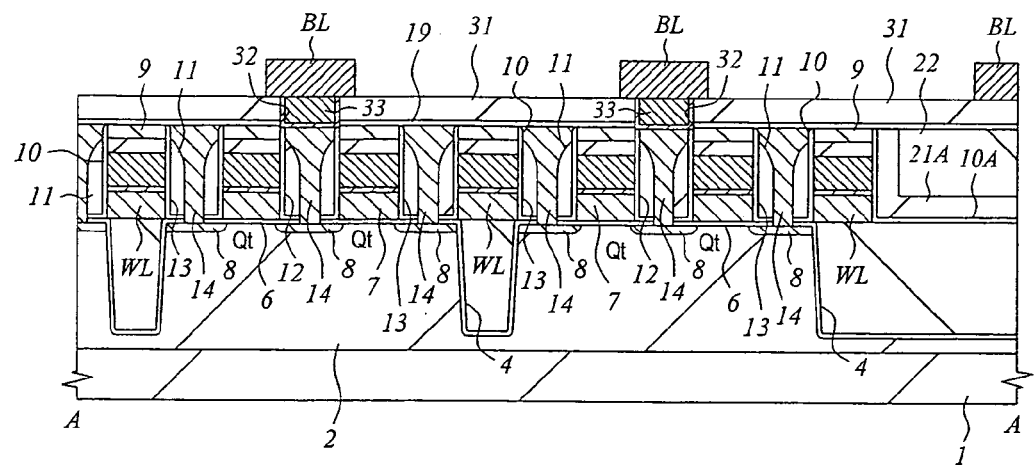
FIG. 52 is a sectional view showing the principal part of a semiconductor substrate, which illustrates the manufacturing method of DRAM according to an embodiment of the present invention.
Figure 53:
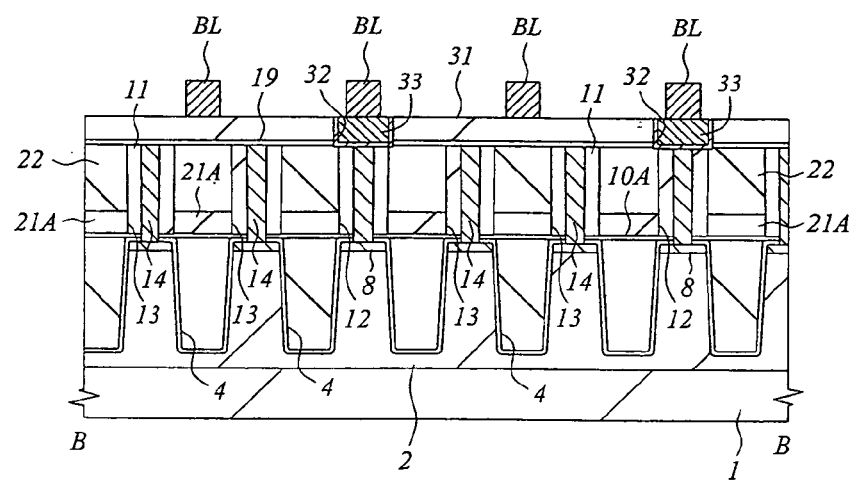
FIG. 53 is a sectional view showing the principal part of a semiconductor substrate, which illustrates the manufacturing method of DRAM according to an embodiment of the present invention.
Figure 54:
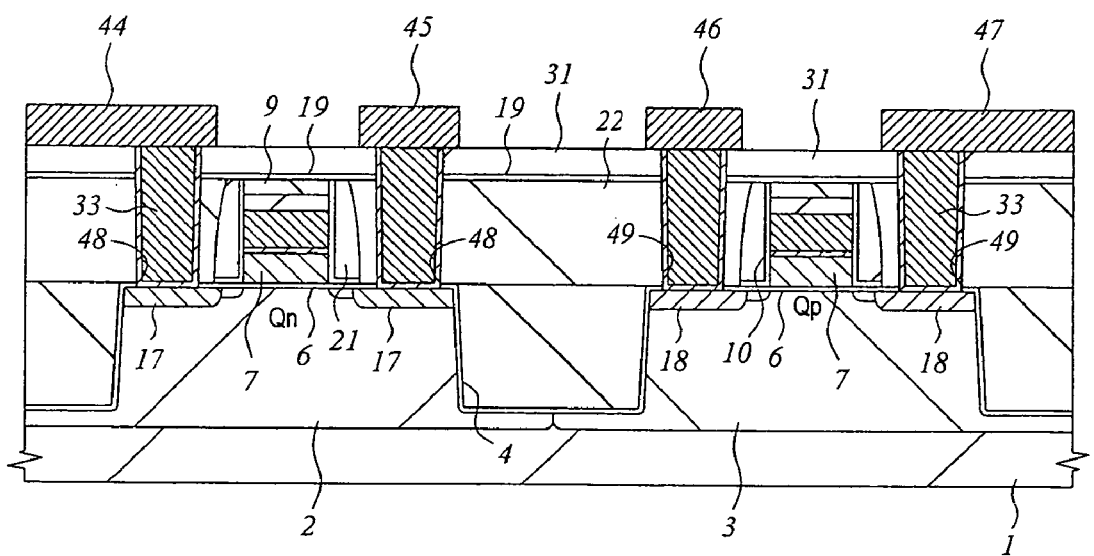
FIG. 54 is a sectional view showing the principal part of a semiconductor substrate, which illustrates the manufacturing method of DRAM according to an embodiment of the present invention.

Next, as shown in FIGS. 51 to 53, bit lines BL are formed on the silicon oxide film 31. Also, as shown in FIG. 54, first layer wirings 44 to 47 are formed on the silicon oxide film 31 in the peripheral circuit section. The bit lines BL and the first layer wirings 44 to 47 are formed in the following manner. That is, a TiN film (or WN film) with a thickness of about 10 nm and a W film with a thickness of about 50 nm are deposited on the silicon oxide film 31 by the sputtering method. Thereafter, these films are dry-etched with using a photoresist film as a mask. The bit line BL is electrically connected to one of the n-type semiconductor regions (source and drain regions) 8 of the memory cell selecting MISFET Qt via the plug 33 filled into the through hole 32 and the plug 14 filled into the contact hole 12.

As described above, in the DRAM according to this embodiment, the sidewall insulating film 10 made of a silicon nitride film and the sidewall insulating film 11 made of a silicon oxide film are formed on the sidewall of the gate electrode 7 of the memory cell selecting MISFET Qt, and the plugs 14 are filled into the spaces (contact holes 12 and 13) of the gate electrodes 7 surrounded by these sidewall insulating films 10 and 11. By doing so, it is possible to reduce the effective relative dielectric constant of the sidewall insulating film in comparison with the conventional self align contact (SAC) technique in which the sidewall insulating film is formed of only the silicon nitride film having the relative dielectric constant higher than that of the silicon oxide film. Therefore, it is possible to reduce the capacitance to the word line serving as the major component of the bit line capacitance.

Also, in the DRAM according to this embodiment, the cap insulating film 9 on the gate electrode 7 is formed of a laminated film of a silicon oxide film and a silicon nitride film. By doing so, it is possible to reduce the effective relative dielectric constant of the cap insulating film in comparison with the conventional self align contact (SAC)

technique in which the cap insulating film is formed of only the silicon nitride film having the relative dielectric constant higher than that of the silicon oxide film. Therefore, it is possible to further reduce the capacitance to the word line in the bit line capacitance.

Also, in the DRAM according to this embodiment, when forming the through holes 32 by the etching of the silicon oxide film 31 below the bit lines BL, the silicon nitride film 19 to be an etching stopper is formed below the silicon oxide film 31 in advance so as to reduce the removal of the silicon oxide film 22 at the bottom of the through holes 32 and the sidewall insulating film 11. In this manner, since it is possible to ensure the distance between the plugs 33 filled into the through holes 32 and the gate electrodes 7 (word lines WL), it is possible to further reduce the capacitance to the word line in the bit line capacitance.

Figure 55:
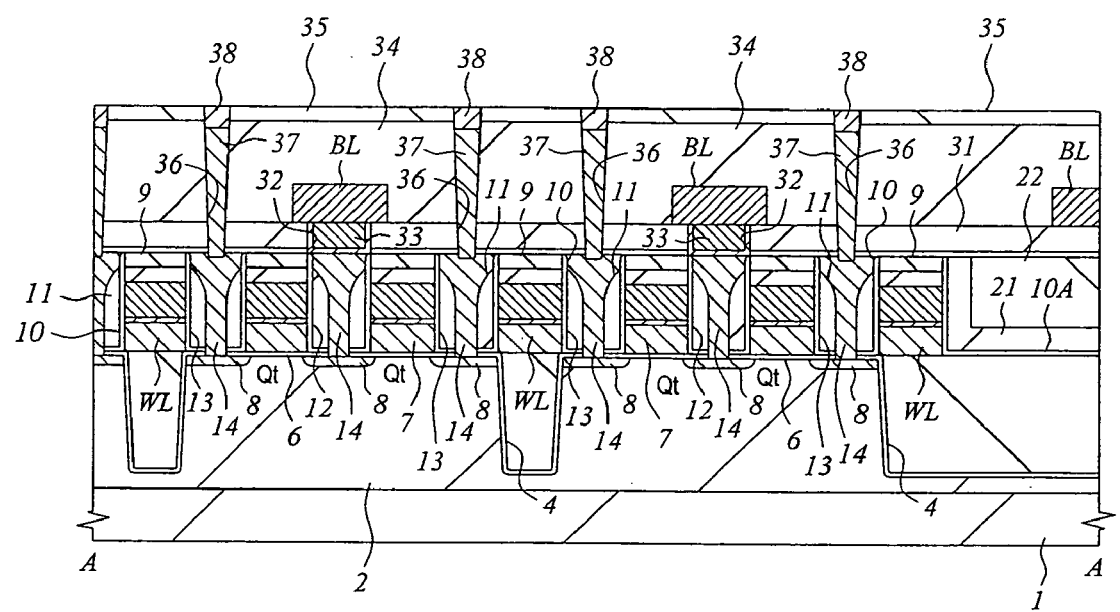
FIG. 55 is a sectional view showing the principal part of a semiconductor substrate, which illustrates the manufacturing method of DRAM according to an embodiment of the present invention.

Next, as shown in FIG. 55, the silicon oxide film 34 with a thickness of about 300 nm is deposited on the bit lines BL by the CVD method, and then, the surface of the silicon oxide film 34 is planarized by the chemical mechanical polishing method. Subsequently, the silicon nitride film 35 with a thickness of about 50 nm is deposited on the silicon oxide film 34 by the CVD method, and then, the silicon nitride film 35, the silicon oxide films 34 and 31, and the silicon nitride film 19 are sequentially dry-etched, thereby forming through holes 36 on the contact holes 13 into which the plugs 14 are filled.

Also in this case, since the silicon nitride film 19 is formed below the silicon oxide film 31 and the silicon nitride film 19 serves as the etching stopper, it is possible to reduce the removal of the silicon oxide film 22 at the bottom of the through holes 36 even in the case where the positions of the through holes 36 and those of the contact holes 13 are shifted due to the misalignment of the photomask. In this manner, it is possible to ensure the distance between the plugs 37 to be filled into the through holes 36 in the following process and the gate electrodes 7 (word lines WL). Therefore, it is possible to prevent the increase of the capacitance formed between the data storage capacitor C formed on the through holes 36 in the latter process and the gate electrodes 7 (word lines WL) and also possible to reduce the delay of the gate electrodes 7 (word lines WL).

Next, the plugs 37 are formed in the through holes 36, and then, the barrier metal films 38 are formed on the surfaces of the plugs 37. The plug 37 and the barrier metal film 38 are formed in the following manner. That is, an n-type polycrystalline silicon film doped with P is deposited on the silicon nitride film 35 by the CVD method to fill the n-type polycrystalline silicon film into the through holes 36. Thereafter, the n-type polycrystalline silicon film outside the through holes 36 is removed by the dry etching. At this time, the n-type polycrystalline silicon film in the through hole 36 is over-etched to recede the surface of the plug 37 below the surface of the silicon nitride film 35, thereby ensuring the spaces on the plugs 37 into which the barrier metal films 38 are filled. Next, a TiN film is deposited on the silicon nitride film 35 by the sputtering method, thereby filling a TaN (tantalum nitride) film on the plugs 37 into the through holes 36. Thereafter, the TaN film outside the through holes 36 is removed by the chemical mechanical polishing method.

The barrier metal film 38 interposed between the lower electrode of the data storage capacitor C formed above the through hole 36 in the latter process and the plug 37 is formed with an aim to reduce the undesired reaction at the interface between the Ru film forming the lower electrode and the polycrystalline silicon film forming the plug 37 at the time of the high-temperature treatment performed in the process of forming the capacitor insulating film of the data storage capacitor C.

As described above, the outer sidewall insulating film 11 of the two-layered sidewall insulating films 10 and 11 formed on the sidewall of the gate electrode 7 has the height lower than that of the upper surface of the cap insulating film 9. Therefore, the diameter of the upper portion of the contact holes 12 and 13 in the section along the direction of the gate length is larger than the diameter of the bottom of the same (see FIG. 29). More specifically, the diameter of the plug 14 filled into the contact holes 12 and 13 is larger in the upper portion in comparison with that in the bottom portion of the contact holes 12 and 13.

In this manner, even in the case where the center of the through hole 36 is shifted from the center of the contact hole 13 due to the misalignment of the photomask when forming the through hole 36 above the contact hole 13, since the surface area of the contact hole 13 is large, it is possible to sufficiently ensure the contact area therebetween.

Figure 56:
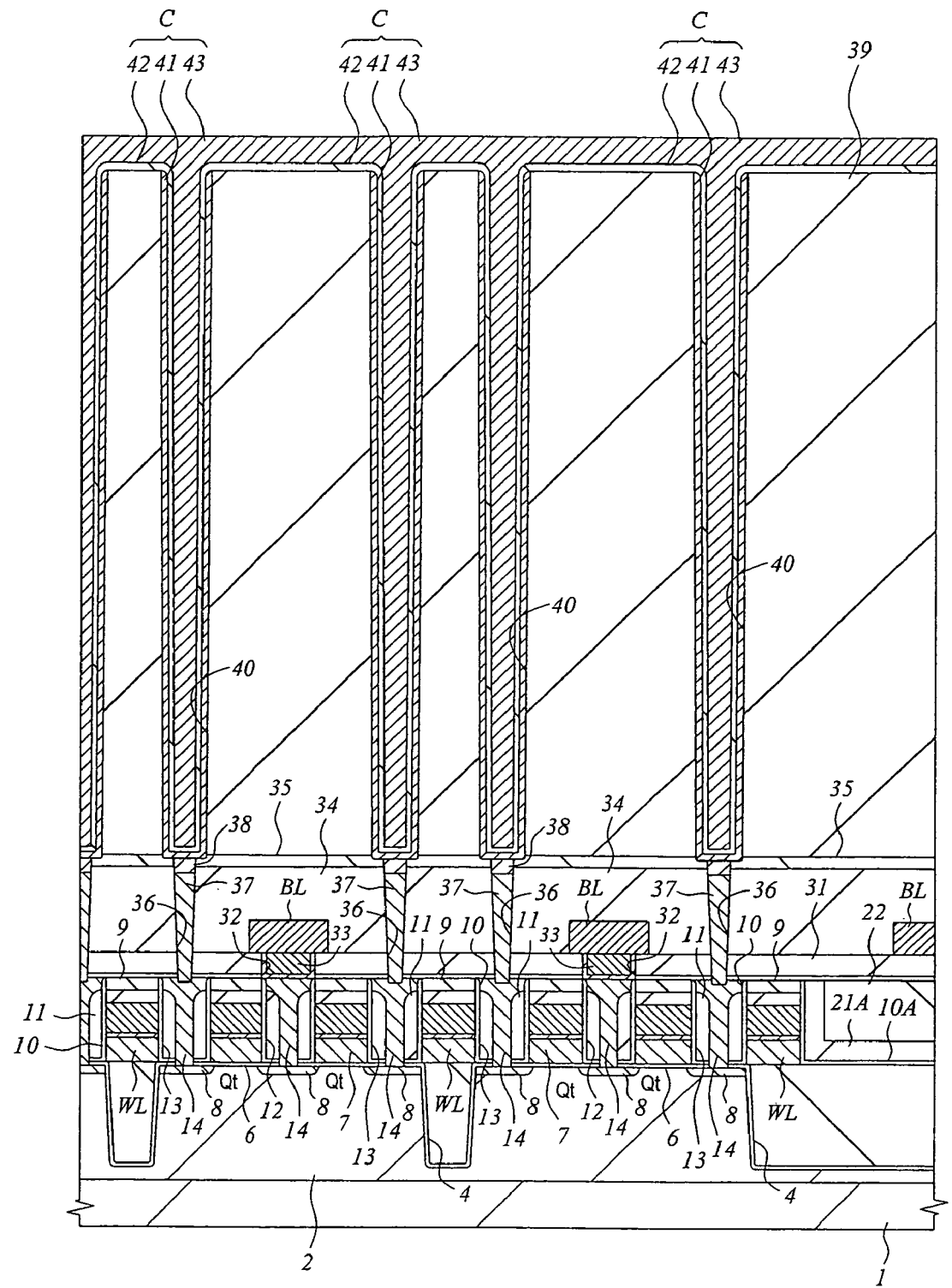
FIG. 56 is a sectional view showing the principal part of a semiconductor substrate, which illustrates the manufacturing method of DRAM according to an embodiment of the present invention.

Next, as shown in FIG. 56, the data storage capacitor C comprised of the lower electrode 41, the capacitor insulating film 42, and the upper electrode 43 is formed above the through hole 36, and the lower electrode 41 of the data storage capacitor C is electrically connected to the other of the n-type semiconductor regions (source and drain regions) 8 of the memory cell selecting MISFET Qt via the plug 37 filled into the through hole 36 and the plug 14 filled into the contact hole 13. Then, the memory cell is approximately completed.

The data storage capacitor C is formed in the following manner. First, a thick silicon oxide film 39 with a thickness of about 1 μm is deposited on the silicon nitride film 35 by the CVD method, and subsequently, the silicon oxide film 39 is dry-etched with using a photoresist film (not shown) as a mask, thereby forming the trench 40 on the through holes 36. The etching of the silicon oxide film 39 is performed with using the silicon nitride film 35 as an etching stopper so as not to etch the underlying silicon oxide film 34.

Next, an Ru film with a thickness about 70 to 80 nm is deposited on the silicon oxide film 39 and in the trench 40 by the CVD method. Then, after filling a photoresist film into the trench 40 with an aim to prevent the removal of the Ru film in the trench 40, the Ru film outside the trench 40 not covered with the photoresist film is removed by the dry etching, and the photoresist film filled into the trench 40 is removed by the ashing. By doing so, the lower electrode 41 made of the Ru film is formed on the sidewall and the bottom surface of the trench 40.

Next, a capacitor insulating film 42 is formed on the silicon oxide film 39 and in the trench 40 in which the lower electrode is formed on the sidewall thereof. The capacitor insulating film 42 is made of, for example, a BST film with a thickness of about 20 nm deposited by the CVD method. In addition to the BST film, the ferroelectric (high dielectric) film made of perovskite metal oxide such as $BaTiO_3$ (barium titanate), $PbTiO_3$ (lead titanate), PZT, PLT, and PLZT is also available to form the capacitor insulating film 42.

Next, the upper electrode 43 is formed over the capacitor insulating film 42. The upper electrode 43 is made of, for example, an Ru film with a thickness of about 200 nm deposited by the CVD method or the sputtering method. In the process so far, the data storage capacitor C comprised of the lower electrode 41 made of an Ru film, the capacitor insulating film 42 made of a BST film, and the upper electrode 43 made of an Ru film is completed.

Figure 57:
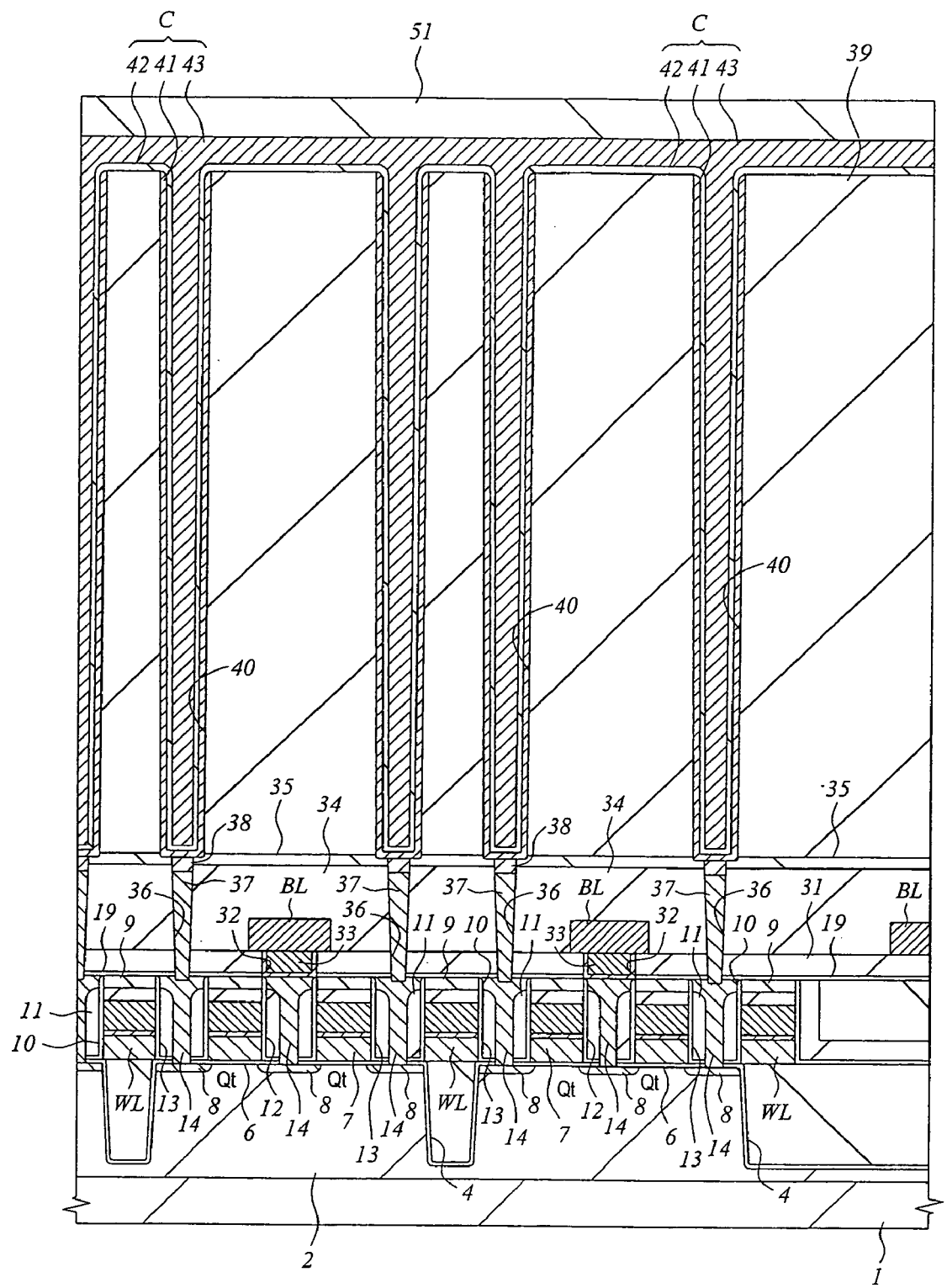
FIG. 57 is a sectional view showing the principal part of a semiconductor substrate, which illustrates the manufacturing method of DRAM according to an embodiment of the present invention.

Next, as shown in FIG. 57, a silicon oxide film 51 is deposited on the data storage capacitor C by the CVD method. Thereafter, as shown in FIG. 58, the silicon oxide films 51 and 39, the silicon nitride film 35, and the silicon oxide film 34 in the peripheral circuit section are sequentially etched to form the through hole 55 on the first layer wiring 44, and then, the plug 56 is formed in the through hole 55. The plug 56 is comprised of the laminated film of, for example, a TiN film and a W film.

Thereafter, an Al alloy film formed on the silicon oxide film 51 by the sputtering method is patterned to form Al alloy wirings 52 to 54, thereby approximately completing the DRAM shown in FIGS. 2 and 3.

(Second Embodiment)

Figure 59:
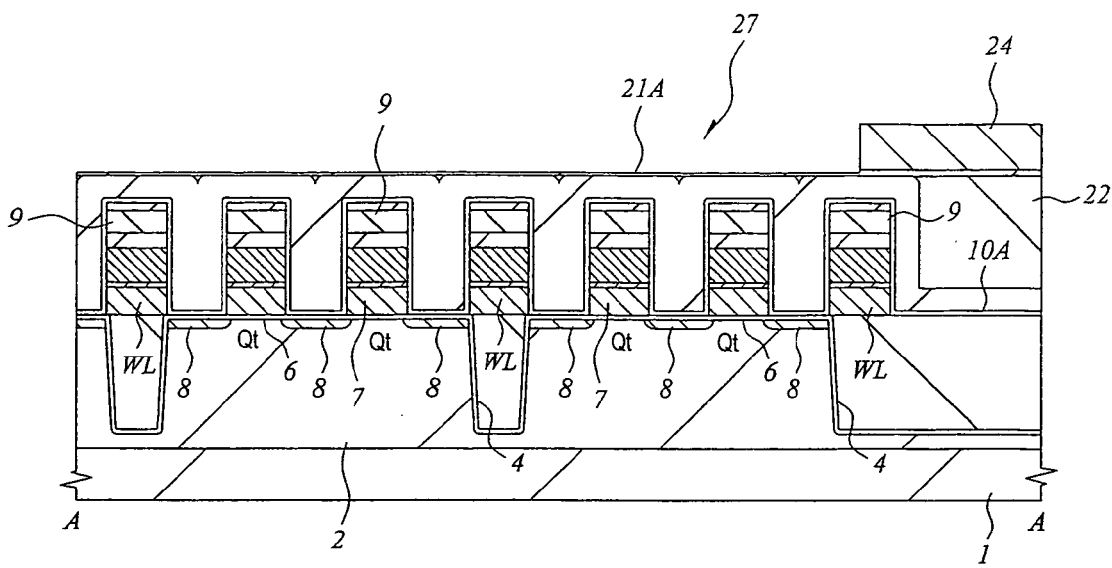
FIG. 59 is a sectional view showing the principal part of a semiconductor substrate, which illustrates the manufacturing method of DRAM according to another embodiment of the present invention.

The manufacturing method of DRAM according to the second embodiment will be described with reference to FIGS. 59 to 62 along the manufacturing process. First, as shown in FIG. 59, the memory cell selecting MISFET Qt is formed in the memory array and the n-channel MISFET Qn and the p-channel MISFET Qp are formed in the peripheral circuit section in the same manner as that of the first embodiment. Thereafter, the silicon oxide films 22 and 23 are formed thereon, and the etching resistant mask 24 made of a polycrystalline silicon film is formed on the silicon oxide film 23. The process so far is the same as that of the first embodiment shown in FIGS. 4 to 24.

Figure 60:
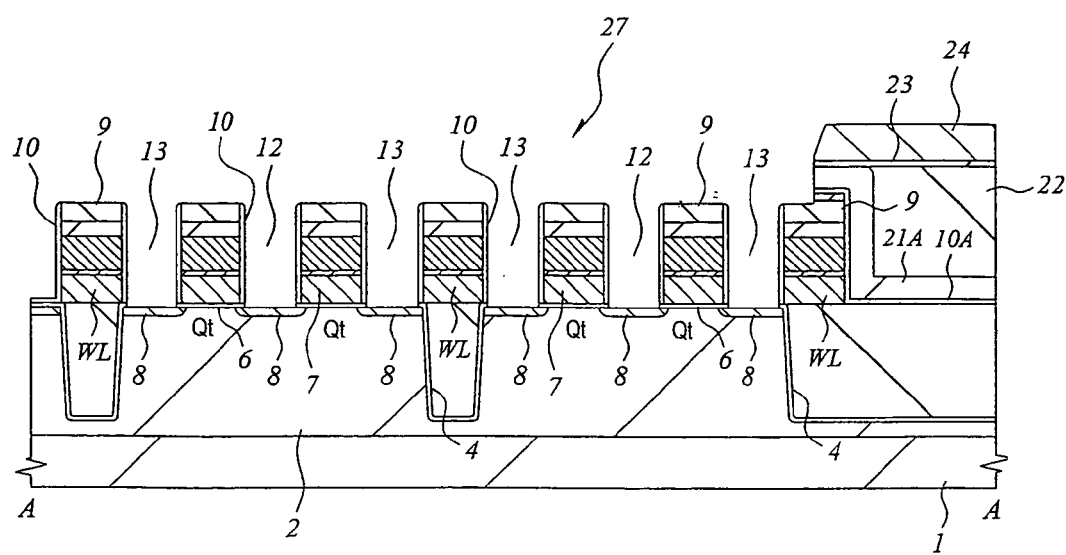
FIG. 60 is a sectional view showing the principal part of a semiconductor substrate, which illustrates the manufacturing method of DRAM according to another embodiment of the present invention.

Next, as shown in FIG. 60, the silicon oxide films 21A, 22, and 23 are dry-etched with using the etching resistant mask 24 as a mask, thereby forming the contact holes (openings) 12 and 13 in the spaces of the gate electrodes 7. At this time, the silicon nitride film 10A covering the n-type semiconductor regions (source and drain regions) 8 is also etched to expose the surfaces of the n-type semiconductor regions (source and drain regions) 8 at the bottom of the contact holes (openings) 12 and 13. Similar to the first embodiment, in the process so far, the sidewall insulating film 10 made of the silicon nitride film 10A is formed on the sidewall of the gate electrode 7 (word line WL).

Figure 61:
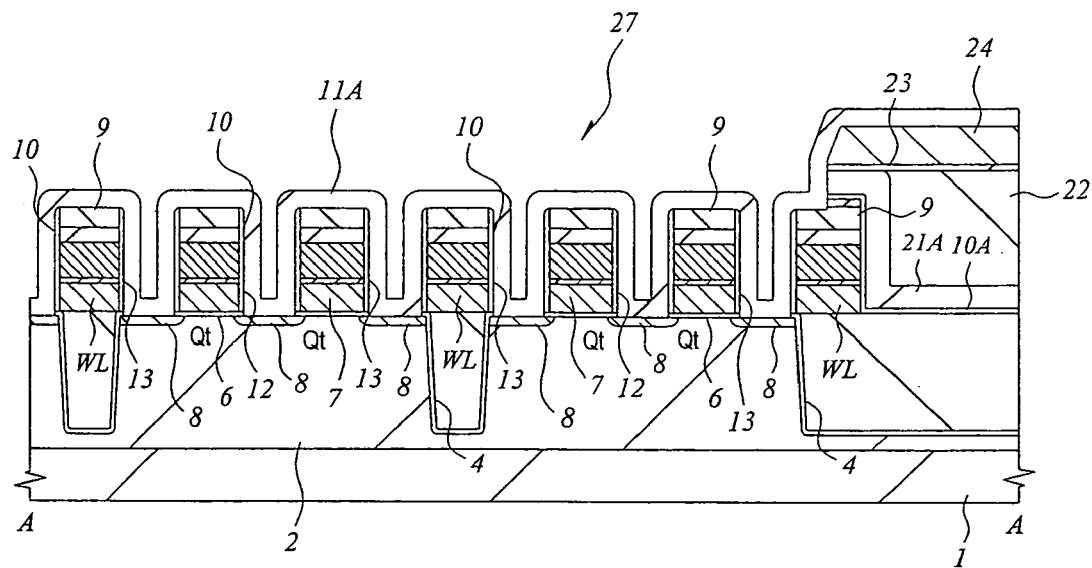
FIG. 61 is a sectional view showing the principal part of a semiconductor substrate, which illustrates the manufacturing method of DRAM according to another embodiment of the present-invention.
Figure 62:
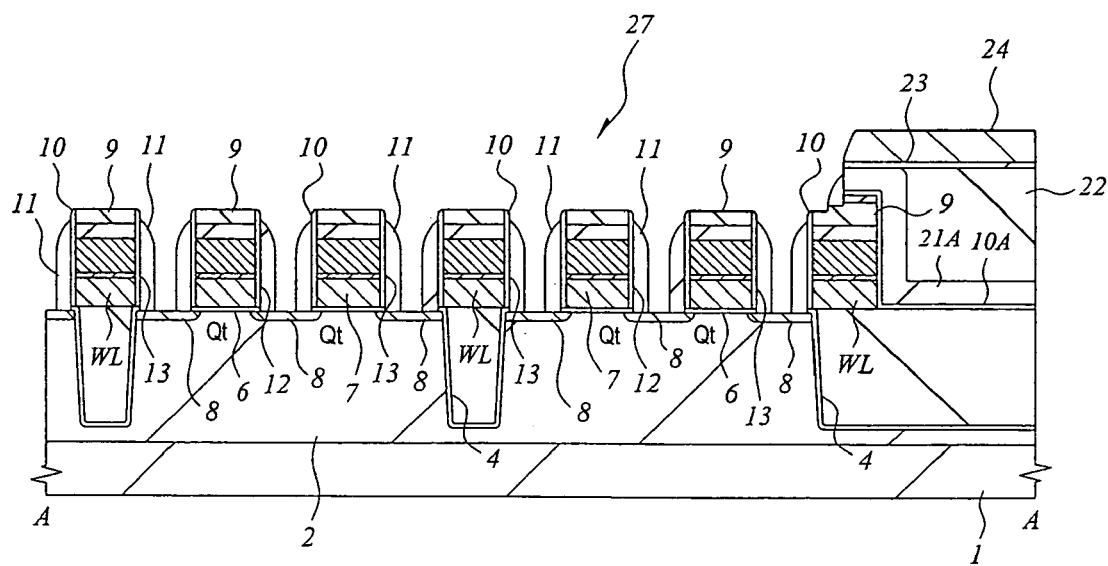
FIG. 62 is a sectional view showing the principal part of a semiconductor substrate, which illustrates the manufacturing method of DRAM according to another embodiment of the present invention.

Next, the surface of the n-type semiconductor regions (source and drain regions) 8 damaged by the dry etching is thinly dry-etched and then cleaned by the hydrofluoric acid. Thereafter, as shown in FIG. 61, the silicon oxide film 11A with a thickness of about 30 nm is deposited on the substrate 1 by the CVD method, and subsequently, as shown in FIG. 62, the sidewall insulating film 11 made of the silicon oxide film 11A with a thickness of about 30 nm is formed on the sidewall of the gate electrode 7 (word line WL) by performing the anisotropic etching of the silicon oxide film 11A. The following process is the same as that of the first embodiment.

As described above, in the manufacturing method according to this embodiment, the sidewall insulating film 11 is formed on the sidewall of the gate electrode 7 (word line WL) after removing the silicon nitride film 10A at the bottom of the contact holes 12 and 13. Therefore, the silicon nitride film 10A is not left at the bottom of the sidewall insulating film 11 (FIG. 62).

Meanwhile, in the manufacturing method according to the first embodiment in which the silicon nitride film 10A at the bottom of the contact holes 12 and 13 is removed after forming the sidewall insulating film 11 on the sidewall of the gate electrode 7 (word line WL), the silicon nitride film 10A is left at the bottom of the sidewall insulating film 11 (FIG. 31). When the silicon nitride film 10A is left on the edge portion of the sidewall of the gate electrode 7 (word line WL) like this, the interface between the silicon nitride film 10A and the underlying gate insulating film 6 becomes charged, which causes the variation of the leakage current of the memory cell.

Therefore, in the manufacturing method according to this embodiment in which the silicon nitride film 10A is not left on the edge portion of the sidewall of the gate electrode 7 (word line WL), it is possible to prevent such a problem and also to reduce the characteristic variation of the memory cell.

(Third Embodiment)

Figure 63:
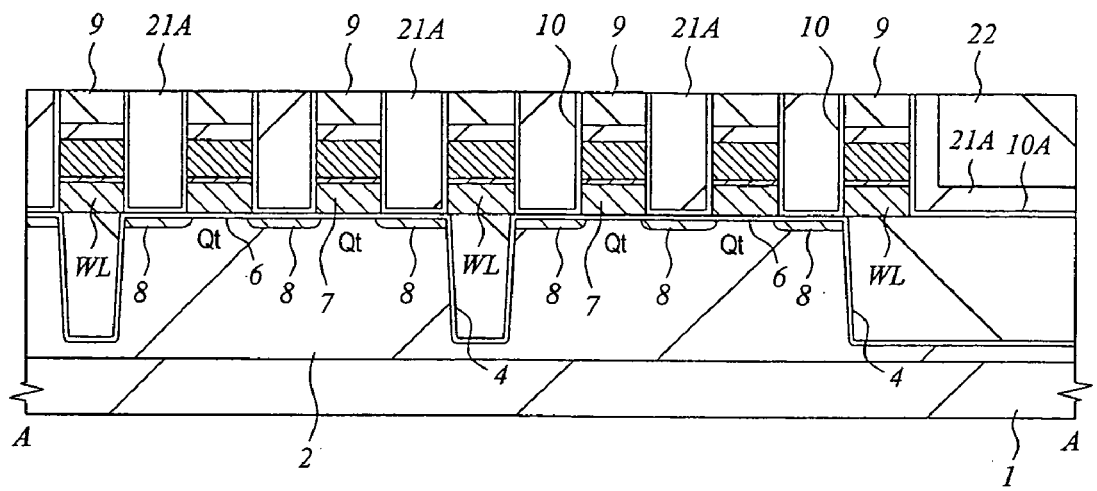
FIG. 63 is a sectional view showing the principal part of a semiconductor substrate, which illustrates the manufacturing method of DRAM according to still another embodiment of the present invention.
Figure 64:
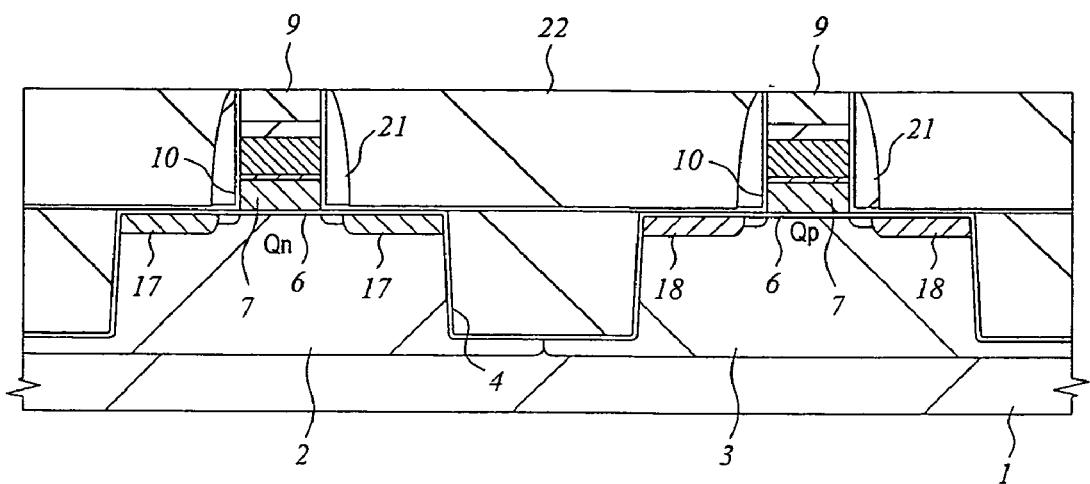
FIG. 64 is a sectional view showing the principal part of a semiconductor substrate, which illustrates the manufacturing method of DRAM according to still another embodiment of the present invention.

The manufacturing method of DRAM according to the third embodiment will be described with reference to FIGS. 63 to 80 along the manufacturing process. First, as shown in FIGS. 63 and 64, the memory cell selecting MISFET Qt is formed in the memory array and the n-channel MISFET Qn and the p-channel MISFET Qp are formed in the peripheral circuit section in the same manner as that in the first embodiment. Thereafter, the silicon oxide film 22 deposited thereon is polished and planarized by the chemical mechanical polishing method. The process so far is identical to that in the first embodiment shown in FIGS. 4 to 19. However, in this embodiment, the silicon nitride film forming a part of the cap insulating film 9 is used as a stopper of the polishing, and the height of the surface of the silicon oxide film 22 is receded to the upper surface of the cap insulating film 9.

Figure 65:
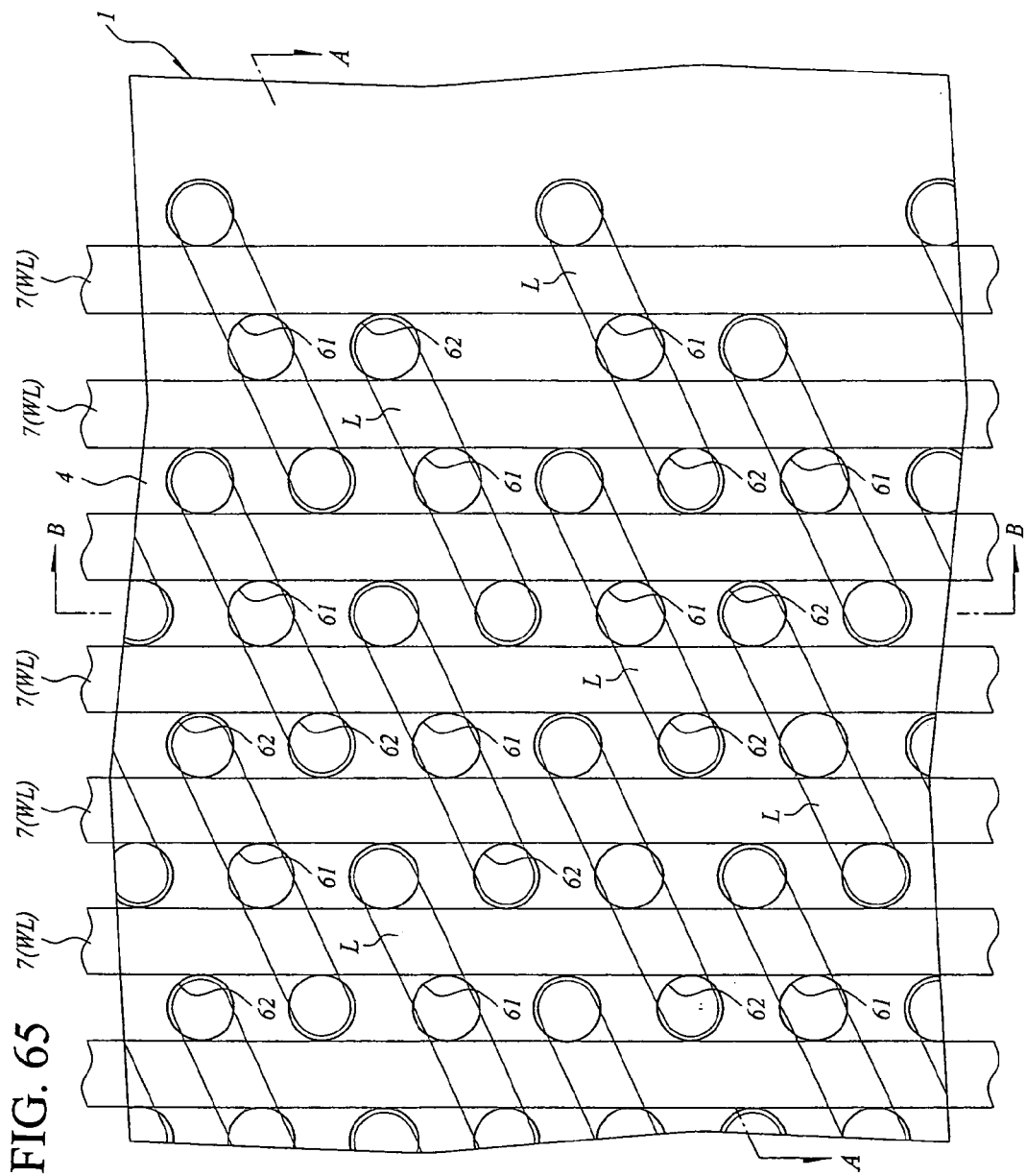
FIG. 65 is a plan view showing the principal part of a semiconductor substrate, which illustrates the manufacturing method of DRAM according to still another embodiment of the present invention.
Figure 66:
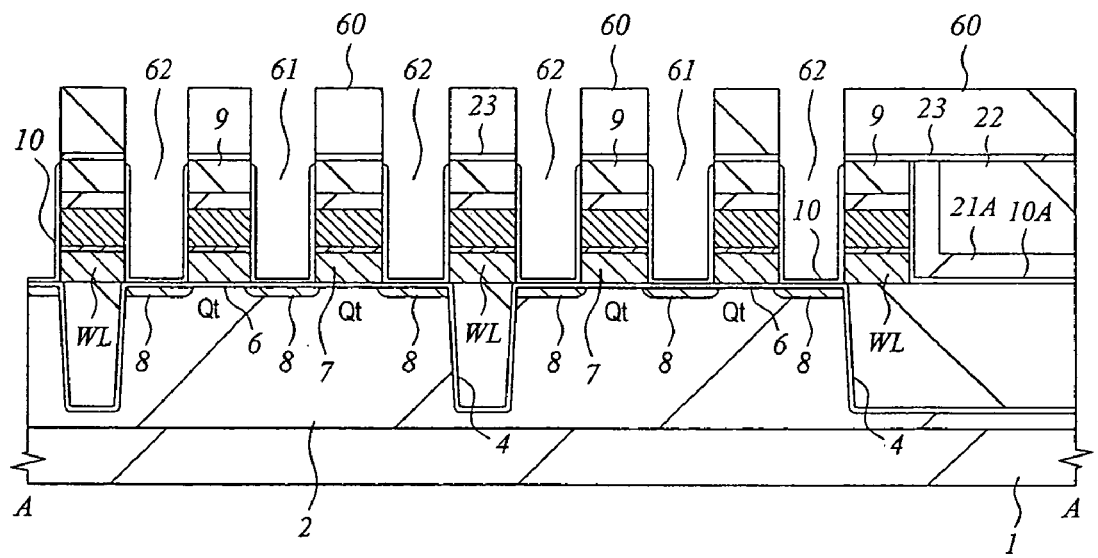
FIG. 66 is a sectional view showing the principal part of a semiconductor substrate, which illustrates the manufacturing method of DRAM according to still another embodiment of the present invention.
Figure 67:
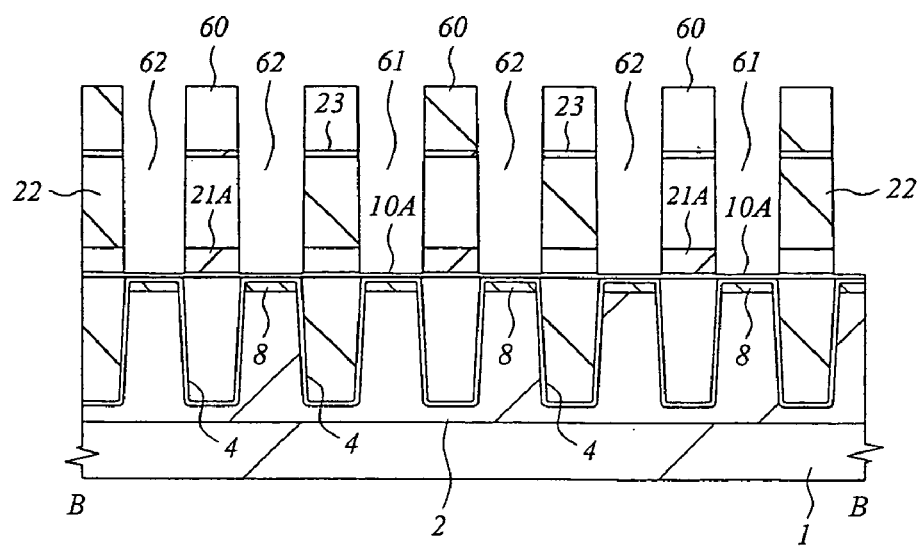
FIG. 67 is a sectional view showing the principal part of a semiconductor substrate, which illustrates the manufacturing method of DRAM according to still another embodiment of the present invention.

Next, as shown in FIGS. 65 to 67, the silicon oxide film 23 is deposited on the silicon oxide film 22 by the CVD method. Thereafter, the silicon oxide films 23, 22, and 21A are dry-etched with using the photoresist film 60 formed on the silicon oxide film 23 as a mask, thereby forming round contact holes (openings) 61 and 62 on the n-type semiconductor regions (source and drain regions) 8, that is, in the spaces of the gate electrodes 7. The dry etching of the silicon oxide films 23, 22, and 21A is performed with using the silicon nitride film forming a part of the cap insulating film 9 and the silicon nitride film 10A as etching stoppers. In this manner, it is possible to prevent the problem that the silicon oxide film 5 in the device isolation trench 4 is removed when performing the dry etching of the silicon oxide films 21A, 22, and 23 and also possible to prevent the problem that the cap insulating film 9 is removed and the upper surface of the gate electrode 7 (word line WL) is exposed. In addition, by the above-described dry etching, the sidewall insulating film 10 made of the silicon nitride film 10A is formed on the sidewall of the gate electrode 7 (word line WL).

As described above, in this embodiment, the round contact holes (openings) 61 and 62 are formed in the spaces of the gate electrodes 7 by the dry etching performed with using the photoresist film 60 formed on the silicon oxide film 23 as a mask. Consequently, it is possible to reduce the number of process in comparison with the first embodiment in which the contact holes (openings) 12 and 13 are formed in the spaces of the gate electrodes 7 by the dry etching performed with using the etching resistant mask 24 made of a polycrystalline silicon film as a mask.

Figure 68:
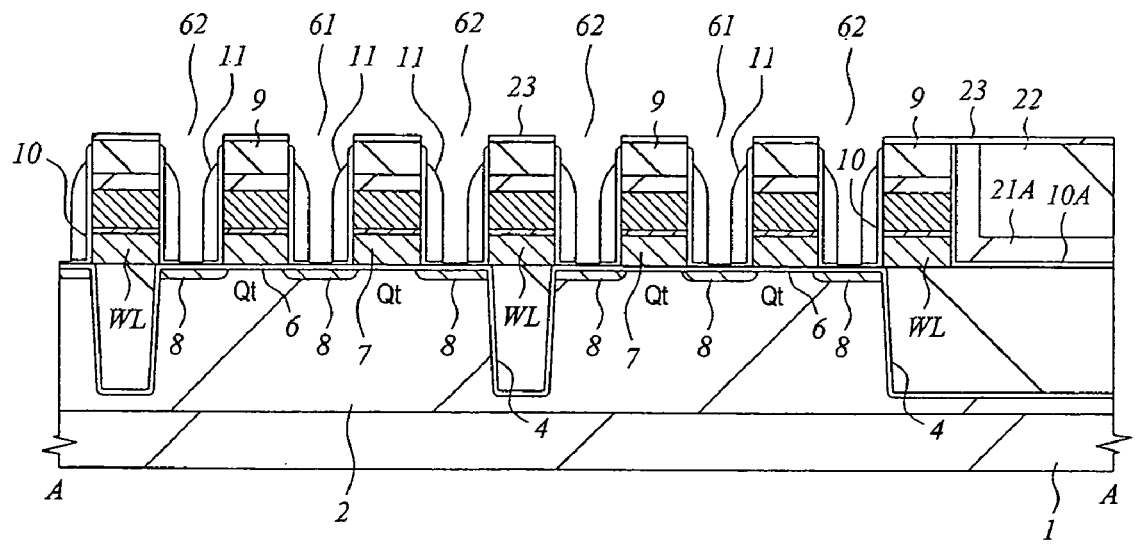
FIG. 68 is a sectional view showing the principal part of a semiconductor substrate, which illustrates the manufacturing method of DRAM according to still another embodiment of the present invention.
Figure 69:
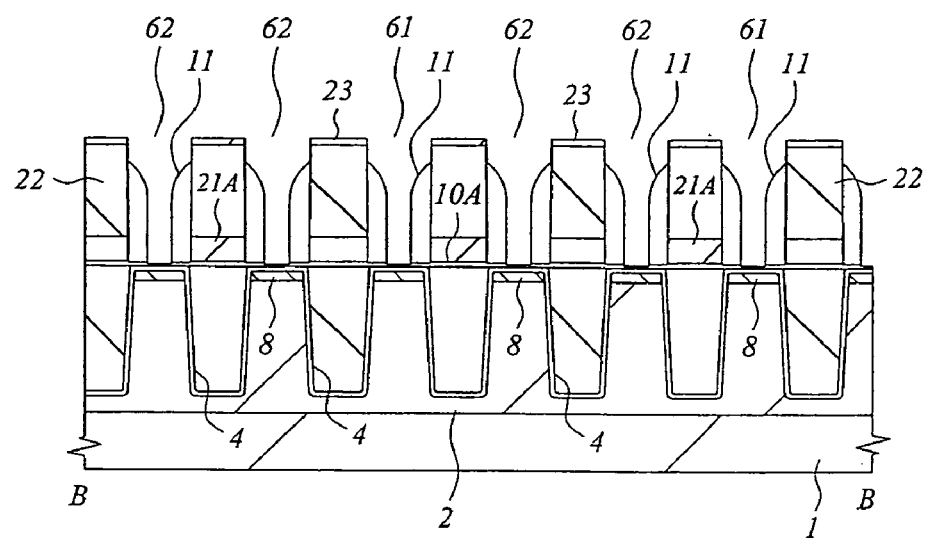
FIG. 69 is a sectional view showing the principal part of a semiconductor substrate, which illustrates the manufacturing method of DRAM according to still another embodiment of the present invention.

Next, as shown in FIGS. 68 and 69, the sidewall insulating film 11 is formed on the sidewall of the gate electrode 7 (word line WL) by the anisotropic etching of the silicon oxide film deposited on the substrate 1. As described above, in this embodiment, the height of the surface of the silicon oxide film 22 is receded to the upper surface of the cap insulating film 9 (see FIG. 63) when polishing and planarizing the silicon oxide film 22. Therefore, the height of the sidewall insulating film 11 becomes uniform in both the longitudinal direction of the active region (A—A direction) and the extension direction of the gate electrode 7 (word line WL) (B—B direction) crossing to each other. Also, the upper end of the sidewall insulating film 11 is set at the position lower than that of the upper surface of the cap insulating film 9.

Figure 70:
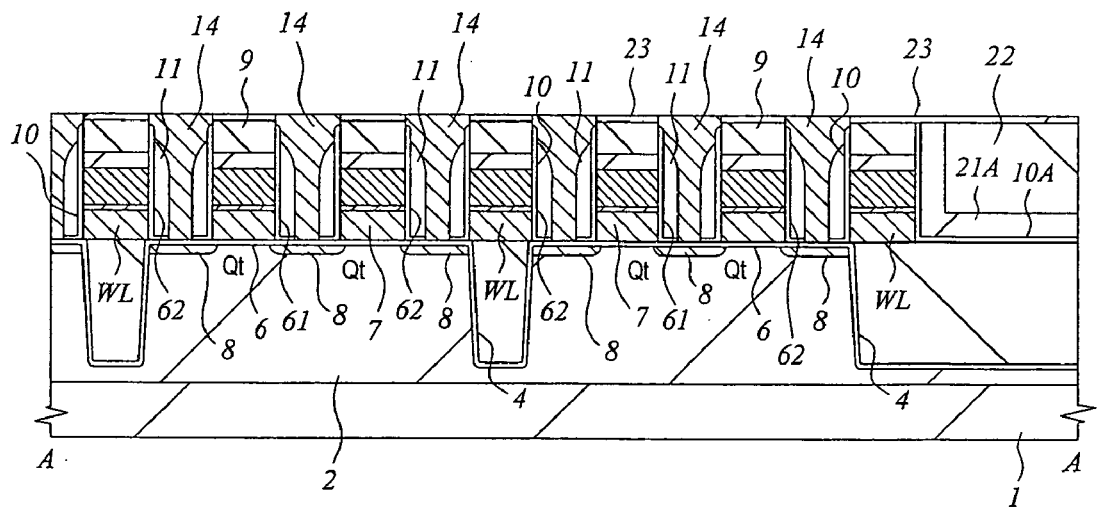
FIG. 70 is a sectional view showing the principal part of a semiconductor substrate, which illustrates the manufacturing method of DRAM according to still another embodiment of the present invention.
Figure 71:
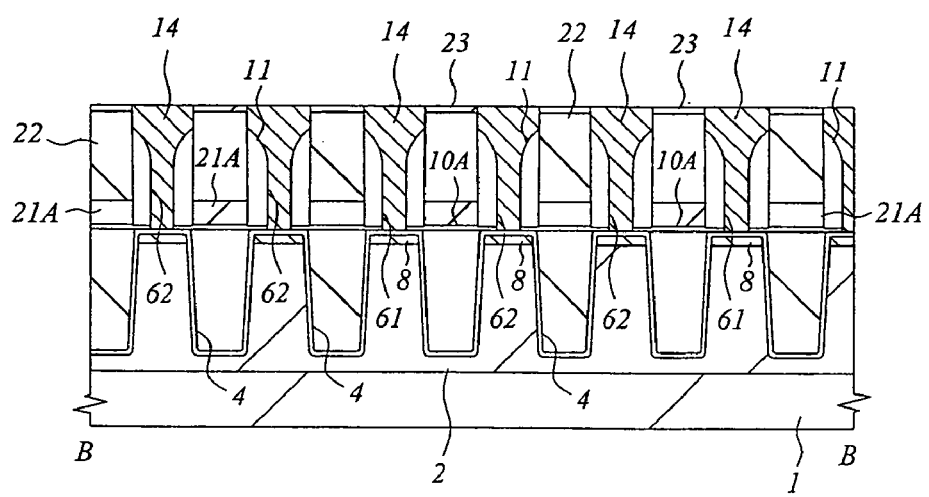
FIG. 71 is a sectional view showing the principal part of a semiconductor substrate, which illustrates the manufacturing method of DRAM according to still another embodiment of the present invention.

Next, as shown in FIGS. 70 and 71, the thin silicon nitride film 10A left at the bottom of the contact holes 61 and 62 is removed by the dry etching to expose the surfaces of the n-type semiconductor regions (source and drain regions) 8. Thereafter, the n-type polycrystalline silicon film doped with, for example, P (phosphorus) is filled into the contact holes 61 and 62, thereby forming the plugs 14.

In the manufacturing method according to this embodiment, the upper end of the sidewall insulating film 11 is lower than the upper surface of the cap insulating film 9 in every direction. Therefore, the surfaces of the plugs 14 filled into the contact holes 61 and 62 have a surface area larger than that of the first embodiment. More specifically, both the contact area between the contact hole 61 and the through hole 32 formed thereon and that between the contact hole 62 and the through hole 36 formed thereon are larger than those in the first embodiment.

Figure 72:
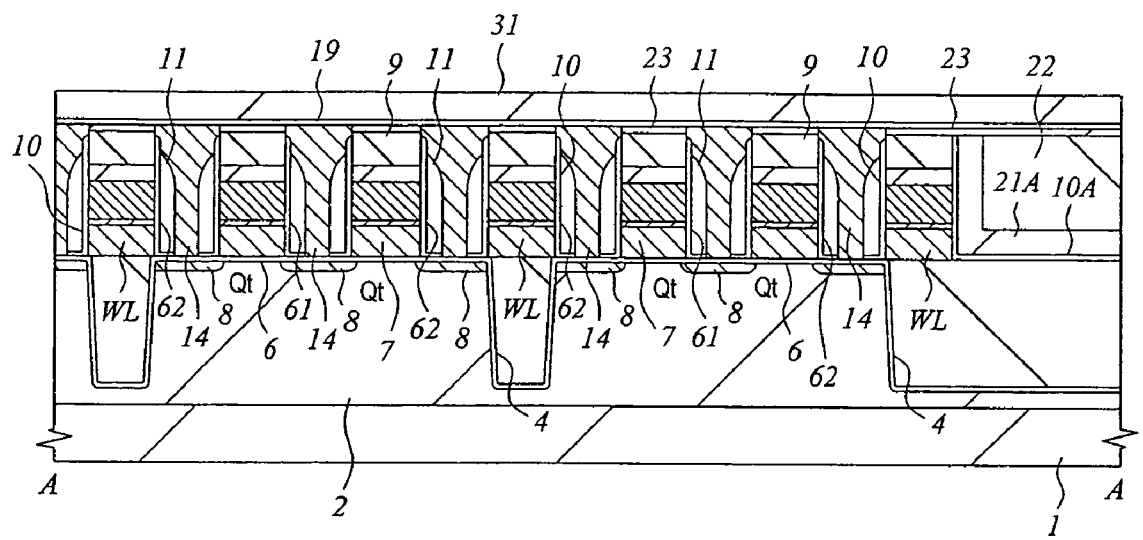
FIG. 72 is a sectional view- showing the principal part of a semiconductor substrate, which illustrates the manufacturing method of DRAM according to still another embodiment of the present invention.
Figure 73:
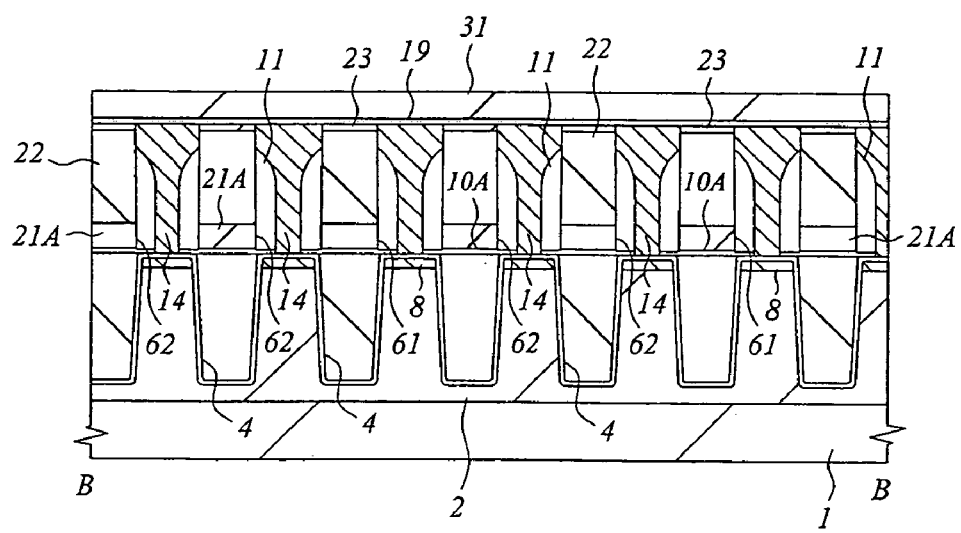
FIG. 73 is a sectional view showing the principal part of a semiconductor substrate, which illustrates the manufacturing method of DRAM according to still another embodiment of the present invention.

Next, as shown in FIGS. 72 and 73, the silicon nitride film 19 with a thickness of about 20 nm is deposited on the substrate 1 by the CVD method, and subsequently, the silicon oxide film 31 with a thickness of about 300 nm is deposited on the silicon nitride film 19 by the CVD method. Thereafter, about 100 nm of the silicon oxide film 31 is polished by the chemical mechanical polishing method to planarize the surface thereof.

Figure 74:
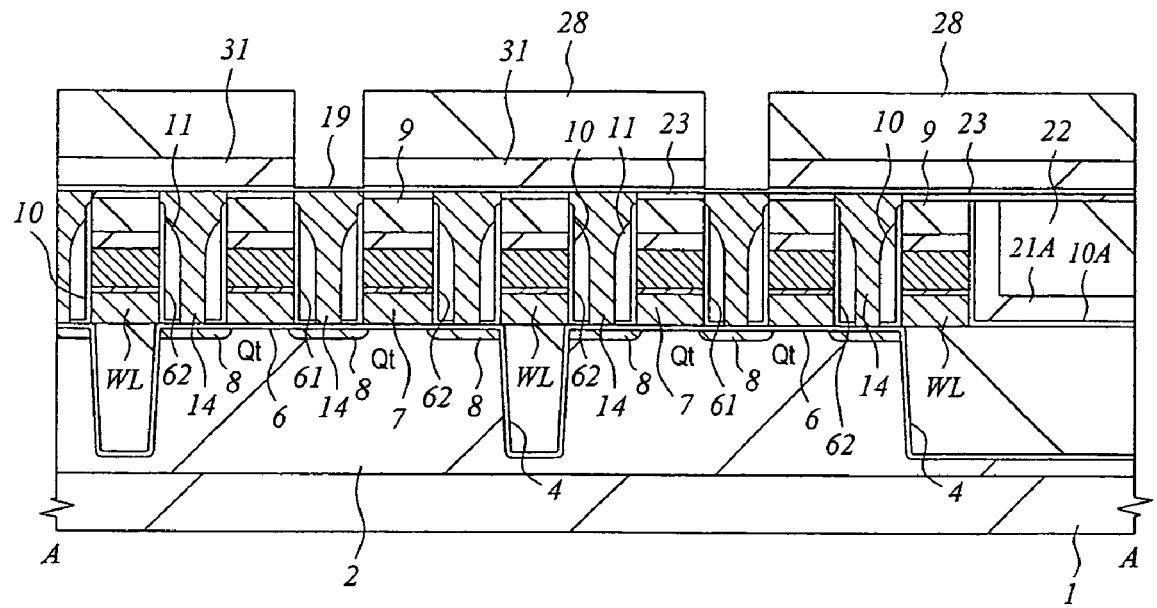
FIG. 74 is a sectional view showing the principal part of a semiconductor substrate, which illustrates the manufacturing method of DRAM according to still another embodiment of the present invention.
Figure 75:
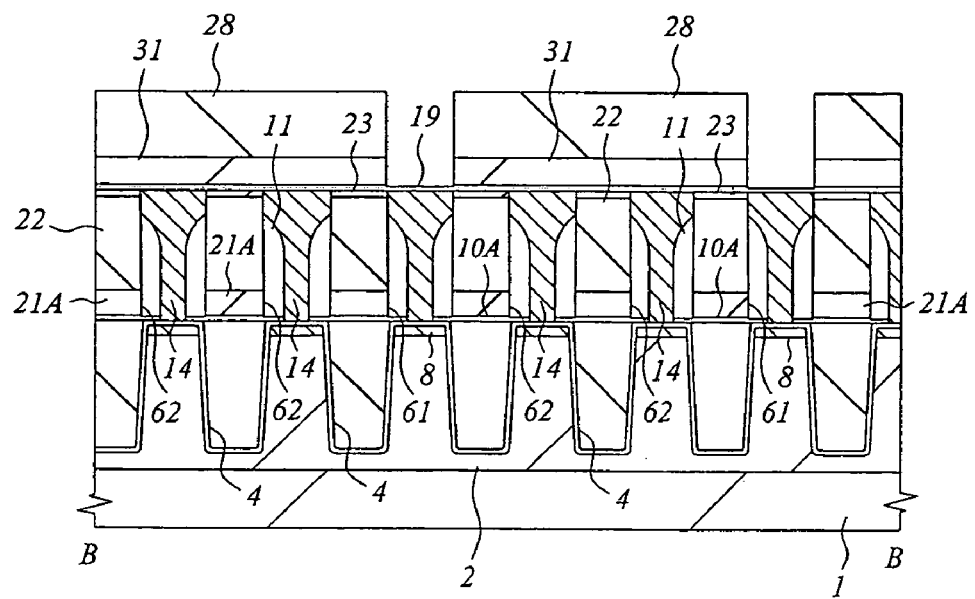
FIG. 75 is a sectional view showing the principal part of a semiconductor substrate, which illustrates the manufacturing method of DRAM according to still another embodiment of the present invention.

Next, as shown in FIGS. 74 and 75, the silicon oxide film 31 on the contact hole 61 is dry-etched with using the photoresist film 28 as a mask. The dry etching of the silicon oxide film 31 is performed with using the underlying silicon nitride film 19 as an etching stopper. More specifically, this dry etching is performed under the condition that the etching selectivity of the silicon oxide film 31 with respect to the silicon nitride film 19 is high, and the silicon nitride film 19 on the contact holes 61 is not completely removed.

Figure 76:
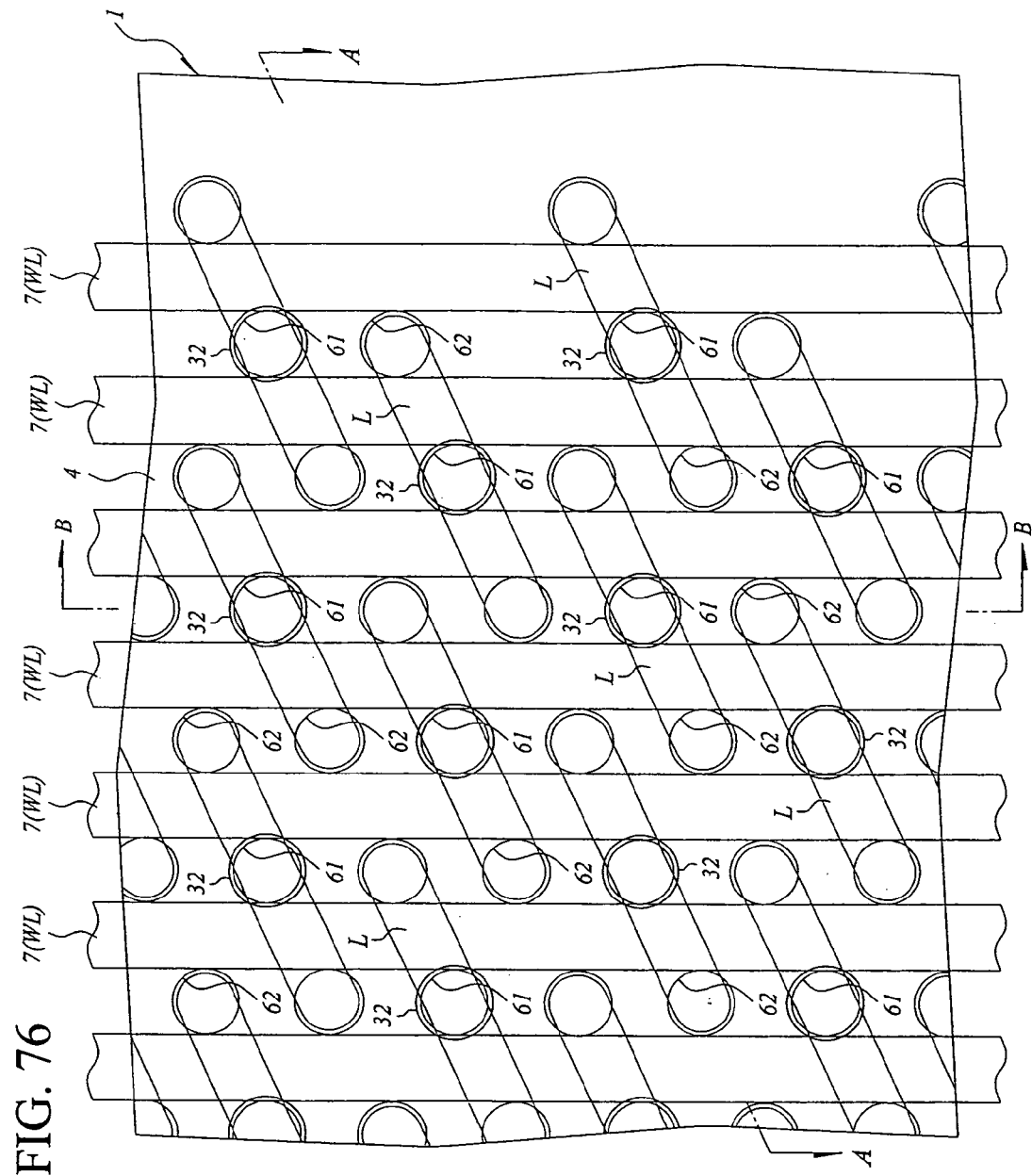
FIG. 76 is a plan view showing the principal part of a semiconductor substrate, which illustrates the manufacturing method of DRAM according to still another embodiment of the present invention.
Figure 77:
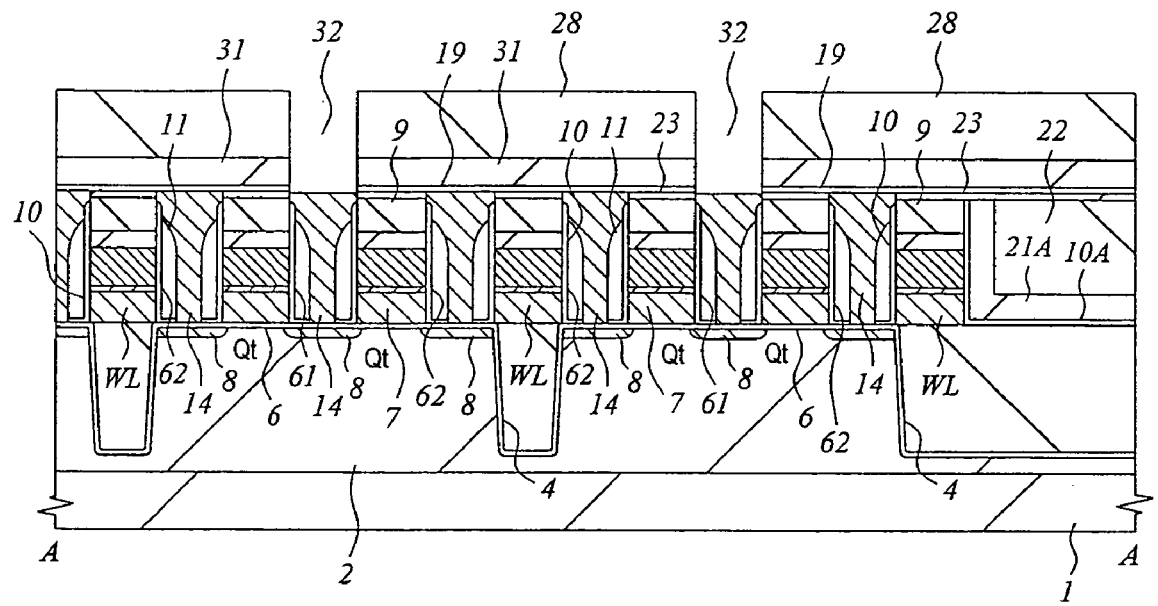
FIG. 77 is a sectional view showing the principal part of a semiconductor substrate, which illustrates the manufacturing method of DRAM according to still another embodiment of the present invention.
Figure 78:
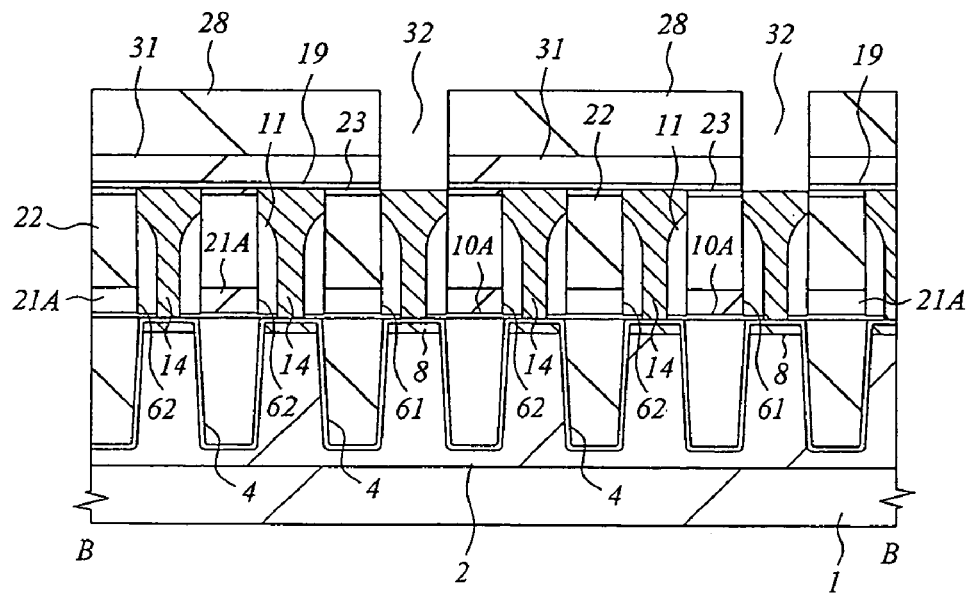
FIG. 78 is a sectional view showing the principal part of a semiconductor substrate, which illustrates the manufacturing method of DRAM according to still another embodiment of the present invention.

Next, as shown in FIGS. 76, 77, and 78, the through holes 32 are formed on the contact holes 61 by the dry etching of the silicon nitride film 19 on the contact holes 61 with using the photoresist film 28 as a mask. The dry etching of the silicon nitride film 19 is performed under the condition that the etching selectivity with respect to the silicon oxide film is high.

As described above, due to the silicon nitride film 19 provided below the silicon oxide film 31, the silicon oxide film 22 at the bottom of the through hole 32 and the sidewall insulating film 11 are removed only slightly. Therefore, similar to the first embodiment, it is possible to ensure the distance between the plug 33 filled into the through hole 32 and the gate electrode 7 (word line WL) and also possible to prevent the increase of the capacitance formed between the bit line BL and the gate electrode 7 (word line WL).

Figure 79:
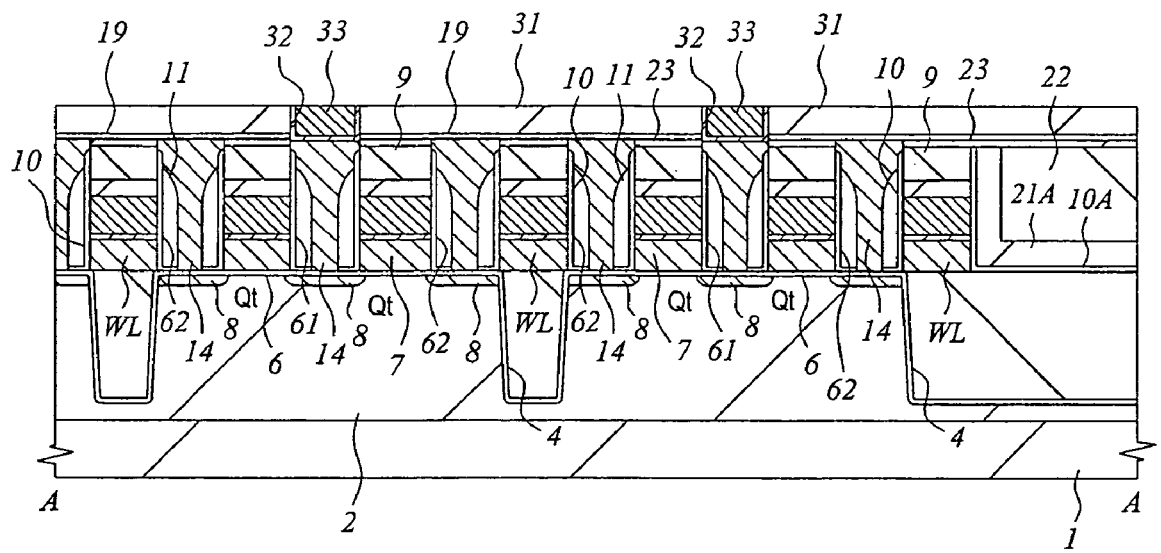
FIG. 79 is a sectional view showing the principal part of a semiconductor substrate, which illustrates the manufacturing method of DRAM according to still another embodiment of the present invention.
Figure 80:
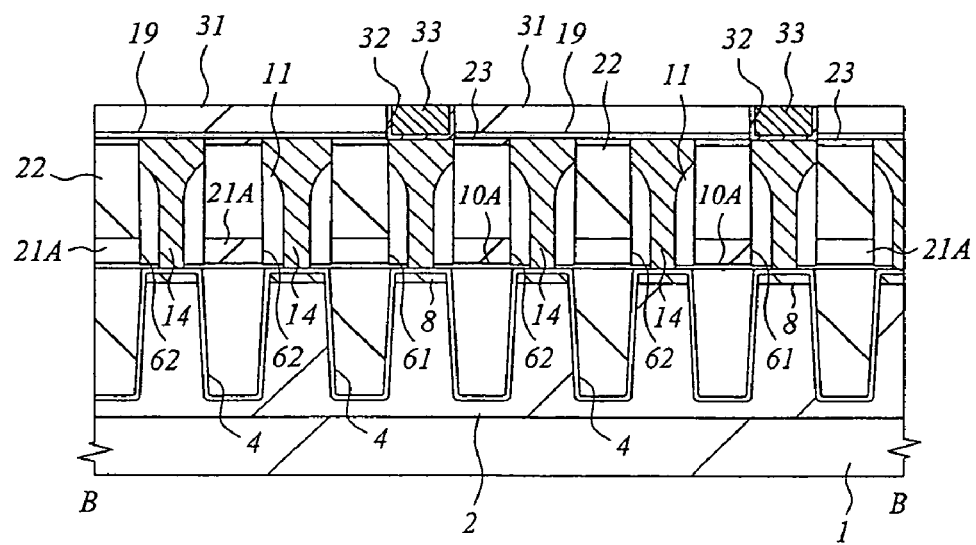
FIG. 80 is a sectional view showing the principal part of a semiconductor substrate, which illustrates the manufacturing method of DRAM according to still another embodiment of the present invention.

Next, as shown in FIGS. 79 and 80, the plugs 33 are formed in the through holes 32 in the manner as described above. Since the following process is the same as that in the first embodiment, the description thereof will be omitted.

In the foregoing, the invention made by the inventor of the present invention has been concretely described based on the embodiments. However, it is needless to say that the present invention is not limited to the foregoing embodiments and various modifications and alterations can be made within the scope of the present invention.

In the foregoing embodiments, the case where the present invention is applied to DRAM has been described. However, the present invention is not limited to this. More specifically, the present invention can be applied to the manufacturing method of a semiconductor integrated circuit device including the process of performing the etching of the silicon oxide film, which covers the gate electrodes, to form the contact holes (openings) in the space of the gate electrodes, in the case where at least a part of the sidewall insulating film of the gate electrode is formed of a silicon oxide film.

INDUSTRIAL APPLICABILITY

According to the present invention, since the bit line capacitance can be reduced, it is possible to increase the signal voltage when reading the charge (data) stored in the data storage capacitor. Therefore, the noise margin of the signal is increased and the refresh cycle is extended. Also, it is possible to reduce the power consumption.

In addition, since the number of memory cells connected to one bit line can be increased, the number of sense amplifiers can be reduced. Therefore, it is possible to reduce the chip area, and thus, it is possible to increase the number of chips obtained per one wafer and also to improve the manufacturing yield.

What is claimed is:

1. A method of manufacturing a semiconductor integrated circuit device, comprising the steps of:
   (a) forming a first conductive film over a semiconductor substrate and then forming a first insulating film made of a silicon nitride film or a laminated film of a silicon oxide film and a silicon nitride film over said first conductive film;
   (b) performing etching of said first conductive film and said first insulating film, thereby forming a first gate electrodes in a first region of said semiconductor substrate and forming a second gate electrode in a second region of said semiconductor substrate;
   (c) forming a first MISFET having said first gate electrode in the first region of said semiconductor substrate;
   (d) forming a second insulating film made of a silicon nitride film over said first and second gate electrodes and said semiconductor substrate, and forming a third insulating film made of a silicon oxide film over said second insulating film;
   (e) forming a first sidewall insulating film comprised of said second and third insulating films on a sidewall of said second gate electrode, and then, forming a second MISFET having said second gate electrode in the second region of said semiconductor substrate;
   (f) forming a fourth insulating film made of a silicon oxide film over said third insulating film, and then, planarizing the upper surface of said fourth insulating film;
   (g) performing etching of said fourth, third, and second insulating films in the first region of said semiconductor substrate, thereby forming first openings above a source and drain of said first MISFET;
   (h) forming second sidewall insulating films made of a silicon oxide film on sidewalls of said first openings;
   (i) filling a second conductor layer into said first openings;
   (j) forming a fifth insulating film made of a silicon nitride film over said first and second MISFETs, and forming a sixth insulating film made of a silicon oxide film over said fifth insulating film;
   (k) forming second openings in said sixth and fifth insulating films so as to be located at positions above one of the source and drain of said first MISFET, thereby exposing said second conductor layer at the bottom of said second openings; and (l) filling a third conductor layer into said second openings so as to be electrically connected to said second conductor layers in said second openings, wherein said step (h) includes the steps of:

(h-1) forming said silicon oxide film over said fourth insulating film and in said first openings; and (h-2) performing anisotropic etching of said silicon oxide film, thereby forming said second sidewall insulating films made of said silicon oxide film on the respective sidewalls of said first openings, wherein third openings are formed above the source and drain of said second MISFET when forming said second openings in said step (k), and a fourth conductor layer is filled into said third openings when filling the third conductor layer into said second openings in said step (l), and wherein, after said step (l), the method further comprises the step of:

(m) over said sixth insulating film, forming a first wiring electrically connected to said third conductor layer in said second opening and forming a second wiring electrically connected to said fourth conductor layer in said third openings.

2. The method of manufacturing a semiconductor integrated circuit device according to claim 1, wherein, after said step (m), the method further comprises the steps of:

(n) forming a seventh insulating film over said sixth insulating film and then forming fourth openings in said seventh, sixth, and fifth insulating films so as to be located at positions above the other of the source and drain of said first MISFET, thereby exposing said second conductor layer at the bottom of said fourth openings;

(o) filling a fifth conductor layer into said fourth openings;

(p) forming an eighth insulating film over said seventh insulating film and then forming fifth openings in said eighth insulating film above said fourth openings, thereby exposing said fourth conductor layer at the bottom of said fifth openings; and (q) forming first electrodes electrically connected to said fourth conductor layer in said fifth openings and sequentially forming a dielectric film and second electrodes on said first electrodes, thereby forming a capacitor structure comprised of said first electrode, said dielectric film, and said second electrode.

3. The method of manufacturing a semiconductor integrated circuit device according to claim 1, wherein said first openings are formed so as to extend above said first MISFET.

4. The method of manufacturing a semiconductor integrated circuit device according to claim 1, wherein said second insulating film made of said silicon nitride film is of smaller thickness than said second sidewall insulating films made of said silicon oxide film.

* * * * *